(12) United States Patent
Kono et al.

(10) Patent No.: US 9,735,538 B2
(45) Date of Patent: Aug. 15, 2017

(54) SEMICONDUCTOR LASER DEVICE ASSEMBLY

(71) Applicant: Sony Corporation, Tokyo (JP)

(72) Inventors: Shunsuke Kono, Kanagawa (JP); Masaru Kuramoto, Kanagawa (JP); Takao Miyajima, Kanagawa (JP); Rintaro Koda, Tokyo (JP); Hideki Watanabe, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 14/623,223

(22) Filed: Feb. 16, 2015

(65) Prior Publication Data

US 2015/0236474 A1 Aug. 20, 2015

(30) Foreign Application Priority Data

Feb. 18, 2014 (JP) .................. 2014-028276

(51) Int. Cl.
| | |
|---|---|
| *H01S 5/068* | (2006.01) |
| *H01S 5/00* | (2006.01) |
| *H01S 5/22* | (2006.01) |
| *H01S 5/343* | (2006.01) |
| *H01S 5/14* | (2006.01) |
| *H01S 3/08* | (2006.01) |
| *H01S 5/10* | (2006.01) |

(52) U.S. Cl.
CPC ........ *H01S 5/0085* (2013.01); *H01S 3/08009* (2013.01); *H01S 5/0078* (2013.01); *H01S 5/14* (2013.01); *H01S 5/22* (2013.01); *H01S 5/34333* (2013.01); *H01S 5/0057* (2013.01); *H01S 5/1025* (2013.01)

(58) Field of Classification Search
CPC ......... H01S 5/1025; H01S 5/14; H01S 5/0057
See application file for complete search history.

(56) References Cited

U.S. PATENT DOCUMENTS

| | | | | |
|---|---|---|---|---|
| 6,055,261 A | * | 4/2000 | Reed ................... | G02B 5/0825 372/93 |
| 9,184,560 B2 | * | 11/2015 | Kono ................... | H01S 3/2308 |
| 2006/0092995 A1 | | 5/2006 | Frankel et al. | |
| 2006/0186327 A1 | | 8/2006 | Wolleschensky et al. | |
| 2009/0028205 A1 | * | 1/2009 | Kasamatsu ......... | H01S 3/08036 372/99 |

(Continued)

FOREIGN PATENT DOCUMENTS

| | | |
|---|---|---|
| JP | H10-39154 A | 2/1998 |
| JP | 2001-066253 A | 3/2001 |

(Continued)

OTHER PUBLICATIONS

Office Action received in EP Application 15154702.3 mailed Sep. 14, 2015 (8 pages).

(Continued)

*Primary Examiner* — Tod T Van Roy
(74) *Attorney, Agent, or Firm* — K&L Gates LLP

(57) ABSTRACT

Disclosed is a semiconductor laser device assembly including a semiconductor laser device; and a dispersion compensation optical system, where a laser light exited from the semiconductor laser device is incident and exits to control a group velocity dispersion value of the laser light exited from the semiconductor laser device per wavelength.

6 Claims, 36 Drawing Sheets

(56) References Cited

U.S. PATENT DOCUMENTS

| | | | | |
|---|---|---|---|---|
| 2012/0099185 | A1* | 4/2012 | Yokoyama | B82Y 20/00 359/340 |
| 2016/0111857 | A1* | 4/2016 | Kono | H01S 3/2308 372/18 |

FOREIGN PATENT DOCUMENTS

| | | |
|---|---|---|
| JP | 2004-253800 A | 9/2004 |
| JP | 2008-103604 | 5/2008 |
| JP | 2009-032916 A | 2/2009 |
| JP | 2010-118564 | 5/2010 |
| JP | 2011-501211 A | 1/2011 |
| JP | 2013-105813 | 5/2013 |
| WO | 2013/069301 | 5/2013 |

OTHER PUBLICATIONS

Azouz, A. et al. "Passive modelocking of semiconductor lasers with tunable group velocity dispersion cavity". Electronics Letters. Aug. 5, 1993. vol. 29 No. 16. pp. 1437-1438.

Kono, S. et al. "200-fs pulse generation from a GaInN semiconductor laser dispersion-compensated external cavity". Applied Physics Letters 101, 081121-1-4 (2012).

Delfyett, P. et al. "Generation of high-power fentosecond optical pulses from a semiconductor Diode Laser System". OSA Proceedings on Picosecond Electronics and Optoelectronics. Mar. 1991. vol. 9 pp. 185-187.

Japanese Office Action issued Oct. 25, 2016 in corresponding Japanese application No. 2014-028276 (5 pages).

Japanese Office Action issued Feb. 14, 2017 in corresponding Japanese Application No. 2014-028276.

* cited by examiner

Dispersion compensation optical system

FIG.26A [Process-A]
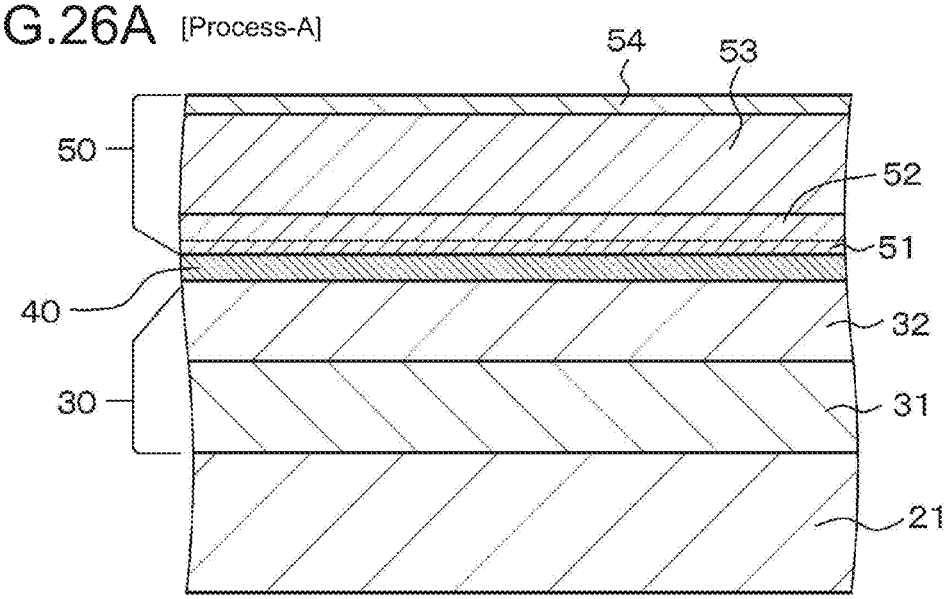
FIG.26B [Process-B]
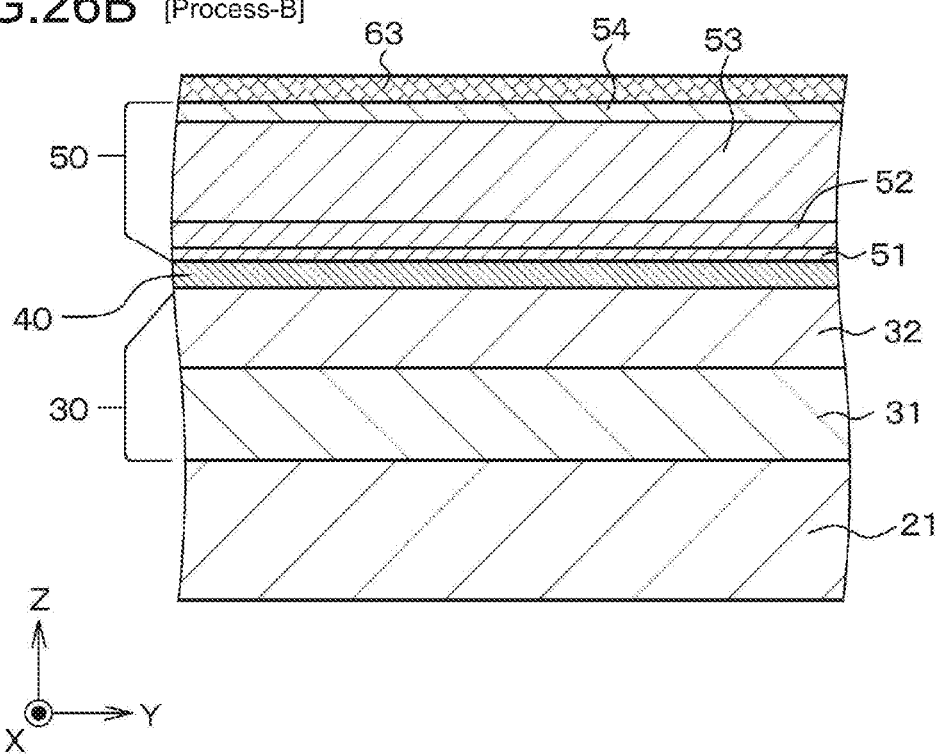

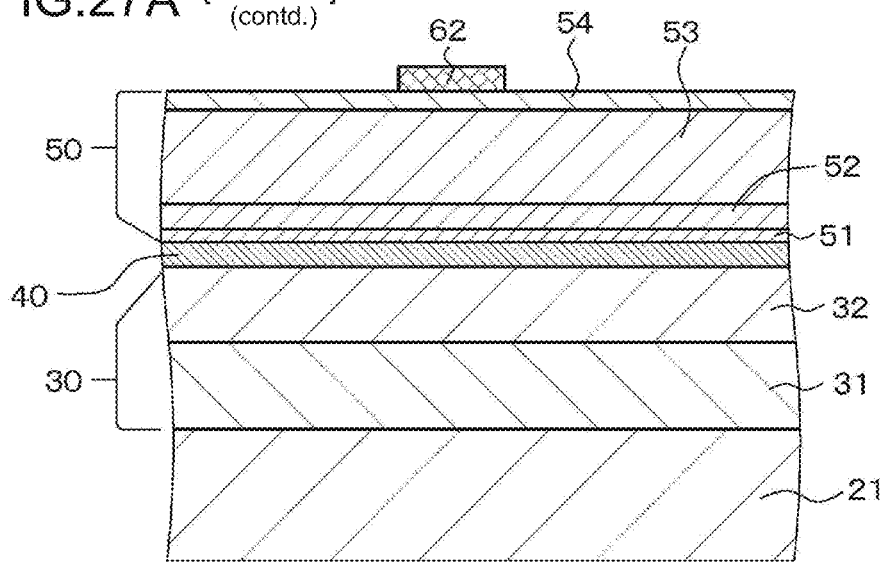
FIG.27A [Process-B] (contd.)
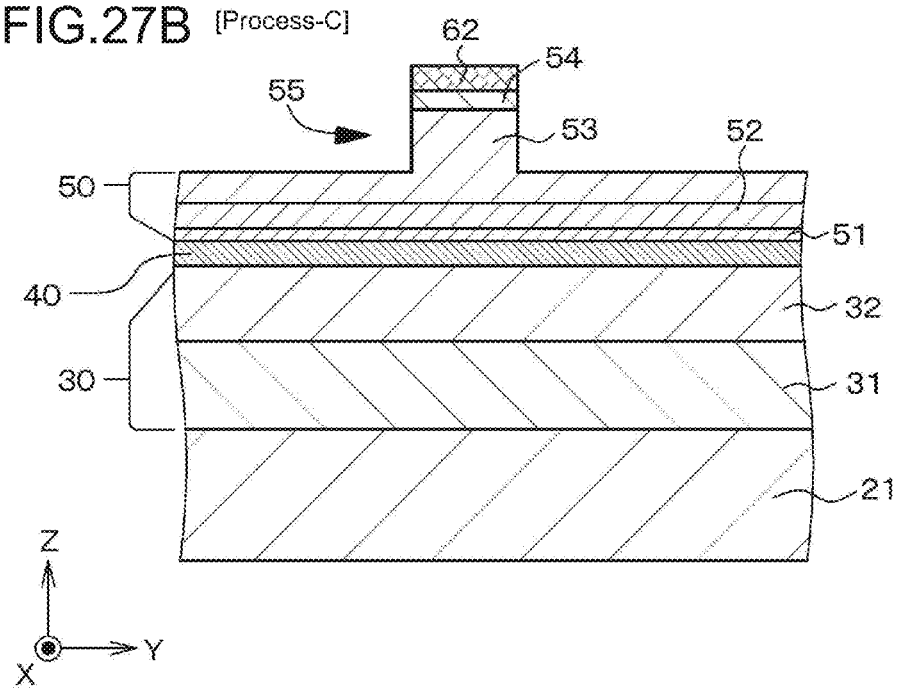
FIG.27B [Process-C]

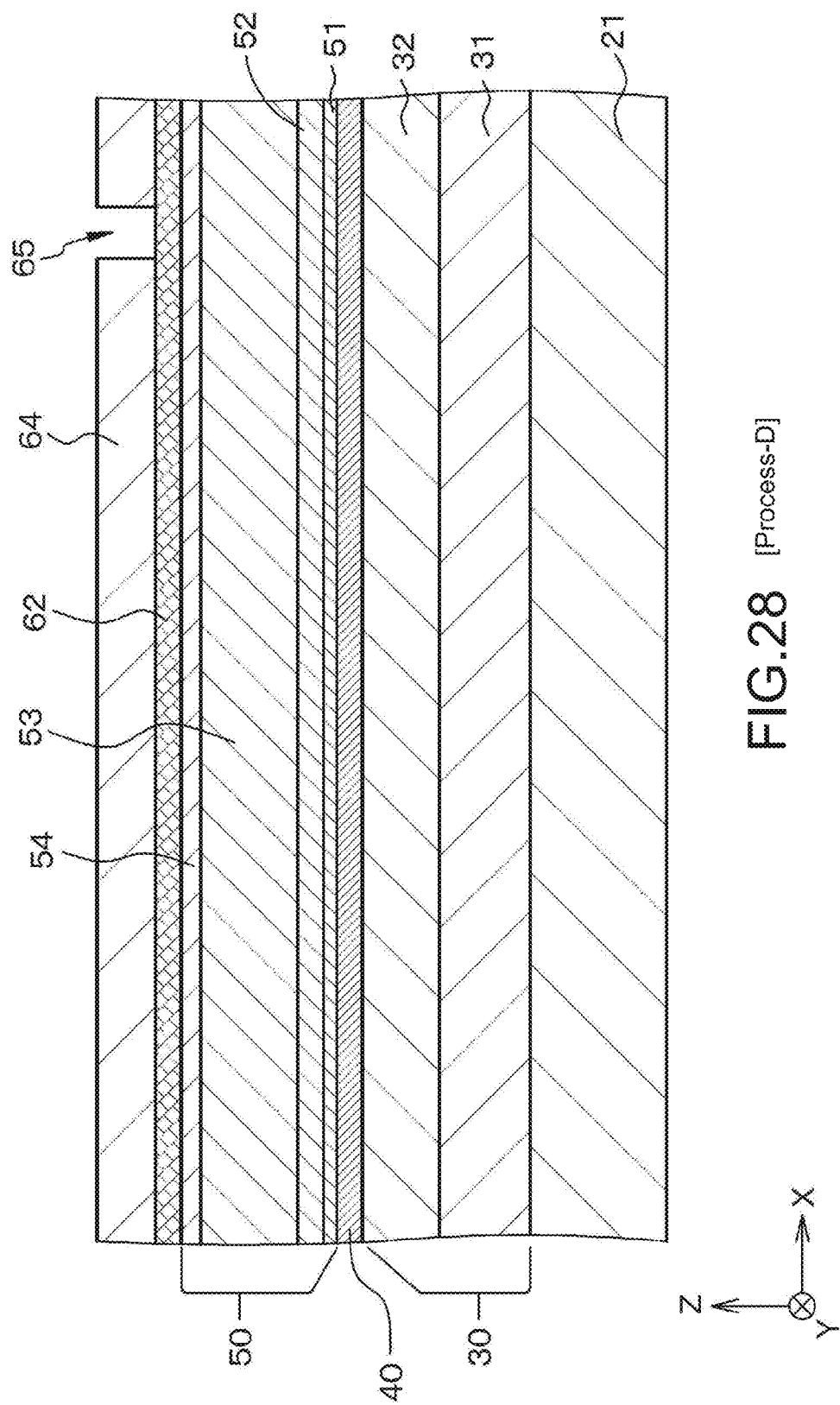
FIG.28 [Process-D]

SEMICONDUCTOR LASER DEVICE ASSEMBLY

CROSS REFERENCES TO RELATED APPLICATIONS

The present application claims priority to Japanese Priority Patent Application JP 2014-028276 filed in the Japan Patent Office on Feb. 18, 2014, the entire content of which is hereby incorporated by reference.

BACKGROUND

The present disclosure relates to a semiconductor laser device assembly, more particularly to a semiconductor laser device assembly including semiconductor laser device and a dispersion compensation optical system.

A laser apparatus generating a pulsed laser light having a duration of picosecond or femtosecond order is called as an ultrashort light pulse laser apparatus. Hereinbelow, a "laser light" refers to the pulsed laser light, unless otherwise noted. In the laser light generated from the laser apparatus, light energy is concentrated in an extremely short time. Therefore, the laser light shows high sharpened power (peak power) not provided by a continuous laser light. The high peak power laser light shows a non-linear interaction with a substance, and can be used for applications that are not achieved by the general continuous laser light. One of them is a non-linear optical effect. Specific examples include a three-dimensional microscopic measurement by a multiphoton absorption effect and microfabrication.

Heretofore, as the ultrashort light pulse laser apparatus, a solid state laser apparatus as represented by a titanium/sapphire laser apparatus has been mainly used. The solid state laser apparatus in the related art often uses a resonator having a size of about 1 m, which may result in a large sized apparatus. Also, another solid state laser apparatus for oscillating the continuous laser light for excitation is necessary. Thus, energy efficiency is not necessarily high. In addition, a large sized resonator is hard to provide a mechanical stability, and an expert knowledge is necessary for the maintenance.

In order to compensate such disadvantages of the solid state laser apparatus, a semiconductor laser device using a semiconductor as a gain medium has been developed as the ultrashort light pulse laser apparatus. Using the semiconductor, the resonator can be easily downsized. Downsizing may easily provide the mechanical stability, and high skill maintenance may be reduced. In addition, the semiconductor can be directly excited by current injection, which has excellent energy efficiency.

When energy is the same per pulse, the narrower the pulse time width is, the higher the peak power of the laser light is. In this manner, a non-linear phenomenon to be intended is more significantly developed. Accordingly, one of performance indices of an ultrashort light pulse light source can include a narrow pulse time width. A commercially available passive mode synchronous titanium/sapphire laser apparatus generates a laser light having the pulse time width of about 10 femtoseconds. In contrast, in a passive mode synchronous semiconductor laser device, a current injection type quantum well laser generally has the pulse time width of about 1 picosecond to 2 picoseconds. However, the semiconductor laser device has a sufficiently wide gain bandwidth and has a potential to generate a subpico second laser light.

Japanese Patent Application Laid-open No. 2013-105813 discloses a semiconductor laser device assembly including a mode synchronous semiconductor laser device composed of two electrodes type GaInN semiconductor laser device and a dispersion compensation optical system. The dispersion compensation optical system can provide adequate group velocity dispersion, thereby providing an adequate light spectrum width and generating a subpico second laser light. Such a property is similar to a property of a soliton mode synchronous when a self phase modulation and the adequate group velocity dispersion are interacted in the resonator. It is extremely effective to narrow the pulse time width of the laser light generated to about subpico seconds (for example, 200 femtoseconds).

In the meantime, in order to provide a femtosecond light pulse, an adequate spectrum filtering is necessary for the laser light outputted from the mode synchronous semiconductor laser device. As a result, among all energy outputted from the mode synchronous semiconductor laser device, a pulse component having the pulse time width of 200 femtoseconds stays about 10%. A laser light spectrum broadening of the laser light directly outputted from the mode synchronous semiconductor laser device reaches about 4 nm at an initial rise. Because a full width at half maximum of the light spectrum is about 1.1 nm, the pulse time width is about 200 femtoseconds. However, the light spectrum is appropriately controlled to widen the full width at half maximum of the light spectrum, it is possible to generate the laser light having the pulse time width of 200 femtoseconds or less.

SUMMARY

In view of the circumstances as described above, it is desirable to provide a semiconductor laser device assembly having a configuration and a structure being capable of outputting a more ultrashort pulse laser light.

According to an embodiment of the present disclosure a semiconductor laser device assembly is provided, including a semiconductor laser device; and
  a dispersion compensation optical system, where a laser light exited from the semiconductor laser device is incident and exits to control a group velocity dispersion value of the laser light exited from the semiconductor laser device per wavelength.

According to an embodiment of the present disclosure, a semiconductor laser device assembly is provided, including a semiconductor laser device; and
  a dispersion compensation optical system, where a laser light exited from the semiconductor laser device is incident and exits to control a group velocity dispersion value of the laser light exited from the semiconductor laser device per wavelength, wherein
  the dispersion compensation optical system includes a diffraction grating, a light collector, and a spatial phase modulator,
  the laser light emitted from the semiconductor laser device and then to the diffraction grating,
  a $0^{th}$ order light from the diffraction grating being outputted to outside of the system, and
  a diffraction light from the diffraction grating being incident on the spatial phase modulator via the light collector, then emitted from the spatial phase modulator and returned to the semiconductor laser device via the light collector and the diffraction grating.

According to an embodiment of the present disclosure, there is provided a semiconductor laser device assembly including a semiconductor laser device, and a dispersion compensation optical system where a laser light exited from the semiconductor laser device is incident and exits that controls a group velocity dispersion value of the laser light exited from the semiconductor laser device per wavelength.

In the semiconductor laser device assembly according to an embodiment of the present disclosure, as the dispersion compensation optical system controls the group velocity dispersion value of the laser light exited from the semiconductor laser device per wavelength, a light spectrum of the laser light finally exited from the semiconductor laser device assembly is shaped. As a result, a pulse laser light having the pulse time width of 200 femtoseconds or less, for example, the pulse laser light having the pulse time width of 100 femtoseconds or less can be generated. The advantages described in the specification are only illustrative and not limited, and there may be additional advantages.

These and other objects, features and advantages of the present disclosure will become more apparent in light of the following detailed description of best mode embodiments thereof, as illustrated in the accompanying drawings.

Additional features and advantages are described herein, and will be apparent from the following Detailed Description and the figures.

BRIEF DESCRIPTION OF THE FIGURES

FIG. 26A and FIG. 26B each is a schematic partial cross-sectional diagram of a substrate etc. for illustrating a method of producing the mode synchronous semiconductor laser device in Embodiment;

FIG. 27A and FIG. 27B each is a schematic partial cross-sectional diagram of a substrate etc. for illustrating a method of producing the mode synchronous semiconductor laser device in Embodiment subsequent to FIG. 26B;

FIG. 28 is a schematic partial cross-sectional diagram of a substrate etc. for illustrating a method of producing the mode synchronous semiconductor laser device in Embodiment subsequent to FIG. 27B;

DETAILED DESCRIPTION

Figure 1:
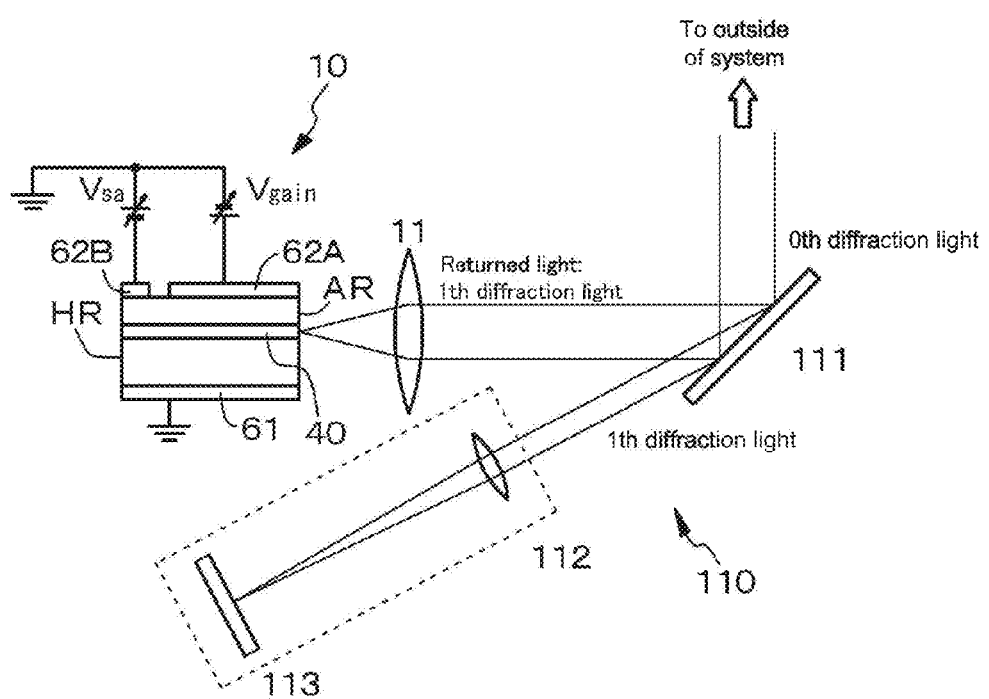
FIG. 1 is a conceptual diagram of a semiconductor laser device assembly in Embodiment 1.

Hereinafter, embodiments of the present disclosure will be described with reference to the drawings. The present disclosure is not limited to the embodiments, and a variety of numerical values and material in the embodiments are only illustrative. The embodiments of the present application will be described in the following order.

1. General Description about Semiconductor laser device assembly according to Embodiment of Present Disclosure
2. Embodiment 1 (Semiconductor laser device assembly according to Embodiment of Present Disclosure)
3. Embodiment 2 (Alternative of Embodiment 1)
4. Embodiment 3 (Alternatives of Embodiments 1 and 2)
5. Embodiment 4 (Another Alternatives of Embodiments 1 and 2)
6. Embodiment 5 (Alternatives of Embodiments 1 to 4)
7. Embodiment 6 (Alternatives of Embodiment 4)
8. Embodiment 7 (Another Alternative of Embodiment 4)
9. Embodiment 8 (Description about Mode Synchronous Semiconductor Laser Element—Part 1)
10. Embodiment 9 (Description about Mode Synchronous Semiconductor Laser Element—Part 2)
11. Embodiment 10 (Alternative of Embodiment 7)
12. Embodiment 11 (Alternative of Embodiment 10)
13. Embodiment 12 (Alternatives of Embodiments 7, 10 and 11)
14. Embodiment 13 (Alternatives of Embodiments 7, 10 to 12)
15. Embodiment 14 (Alternatives of Embodiments 7, 10 to 13)

[General Description about Semiconductor Laser Device Assembly According to Embodiment of Present Disclosure]

In the semiconductor laser device assembly according to embodiment of present disclosure, a laser light exited from the semiconductor laser device provides a laser light having a shortest wavelength with a negative group velocity dispersion value (GVDmin<0 [picosecond, ps]$^2$), and provides a laser light having a wavelength longer than the shortest wavelength with a group velocity dispersion value greater than the group velocity dispersion value (GVDmin). Here, in such a configuration, not depending on the wavelength, the dispersion compensation optical system can provide the laser light having a longer wavelength with a constant group velocity dispersion value (GVDconst) greater than the group velocity dispersion value (GVDmin) for the laser light having the shortest wavelength. In this case, the constant group velocity dispersion value (GVDconst) can be 0 [picosecond]$^2$) or can be positive. Alternatively, in such a configuration, depending on the wavelength, the dispersion compensation optical system can provide the laser light having a longer wavelength with the group velocity dispersion value greater than the group velocity dispersion value (GVDmin) for the laser light having the shortest wavelength. In this case, the longer the wavelength is, the greater the group velocity dispersion value for the laser light having a longer wavelength.

Alternatively, in the semiconductor laser device assembly according to embodiment of present disclosure, a laser light exited from the semiconductor laser device provides a laser light having a shortest wavelength with a negative group velocity dispersion value. The greater an absolute value of the negative group velocity dispersion value provided is, the shorter the laser light having a wavelength shorter than the predetermined wavelength is. Here, in such a configuration, the dispersion compensation optical system can provide the laser light having a wavelength longer than the predetermined wavelength with a group velocity dispersion value greater than the group velocity dispersion value for the laser light having the predetermined wavelength. Here, in such a configuration, not depending on the wavelength, the dispersion compensation optical system can provide the laser light having a wavelength longer than the predetermined wavelength with a constant group velocity dispersion value (GVDconst) greater than the group velocity dispersion value for the laser light having the predetermined wavelength. In this case, the constant group velocity dispersion value (GVDconst) can be 0 [(picosecond)$^2$] or can be positive. Alternatively, in such a configuration, depending on the wavelength, the dispersion compensation optical system can provide the laser light having a wavelength longer than the predetermined wavelength with the group velocity dispersion value greater than the group velocity dispersion value for the laser light having the predetermined wavelength. In this case, the longer the wavelength is, the greater the group velocity dispersion value for the laser light having a longer wavelength.

In the semiconductor laser device assembly according to the embodiment of the present disclosure including the above-described desirable embodiments and configurations, the laser light emitted from the semiconductor laser device is incident on the dispersion compensation optical system, a part of the laser light incident on the dispersion compensation optical system is emitted from the dispersion compensation optical system and returns to the semiconductor laser device, and the rest of the laser light incident on the dispersion compensation optical system is outputted to outside of the system. In this configuration, an external resonator is composed of the dispersion compensation optical system. In this case, it also includes a pulse compressor that provides a laser light outputted to outside of the system with the positive group velocity dispersion value. Furthermore, the dispersion compensation optical system includes a diffraction grating, a light collector (specifically, a lens) and a spatial phase modulator. The laser light emitted from the semiconductor laser device collides with the diffraction grating, a 0$^{th}$ order light (0$^{th}$ diffraction light) from the diffraction grating is outputted to outside of the system, and a diffraction light (1$^{th}$ or more diffraction light) from the diffraction grating is incident on the spatial phase modulator via the light collector, is then emitted from the spatial phase modulator and is returned to the semiconductor laser device via the light collector and the diffraction grating. In this case, the spatial phase modulator (a phase compensation optical apparatus) can be composed of a reflective liquid crystal display apparatus, a deformable mirror or a plurality of reflecting mirrors. The dispersion compensation optical system may further include a semiconductor optical amplifier in addition to the pulse compressor, or may include the semiconductor optical amplifier instead of the pulse compressor and functions as the pulse compressor. Alternatively, the dispersion compensation optical system may be composed of a volume hologram diffraction grating.

As described above, by the diffraction grating, the 1$^{th}$ or more diffraction light among the laser light emitted from the semiconductor laser device is incident on the dispersion compensation optical system, and the 0$^{th}$ diffraction light is outputted to outside of the system. Between the semiconductor laser device and the diffraction grating, a collimator (specifically, a lens) may be disposed to change the laser light from the semiconductor laser device to a parallel light flux. A grating pattern number in the diffraction grating included in the laser light incident (collided) on the diffraction grating can be 1200 lines/mm to 3600 lines/mm, desirably 2400 lines/mm to 3600 lines/mm.

When the spatial phase modulator (a phase compensation optical apparatus) is composed of a reflective liquid crystal display apparatus (specifically, for example, LCOS, Liquid Crystal On Silicon) that is a Spatial Light Modulator, SLM), an orientation state of liquid crystal molecules is changed by applying a voltage to a nematic liquid crystal layer oriented in parallel. A refractive index of the liquid crystal layer is thus changed. As a result, a laser light can be modulated in the liquid crystal layer. Without changing a light intensity or a polarity state of the laser light, only a phase can be modulated. In the meantime, a diffraction light from the diffraction grating is incident on the spatial phase modulator via the light collector. The spatial phase modulator is positioned at a focal point of the light collector, i.e., at a Fourier face. As an exit angle of the diffraction light from the diffraction grating is dependent on the wavelength of the laser light, a position incident on the spatial phase modulator depends on the wavelength of the laser light. Accordingly, by applying an adequate voltage to each area (pixel) of the spatial phase modulator, the phase in each area (pixel) can be modulated, be incident on the spatial phase modulator, and the phase of the laser light exited can be modulated, thereby controlling the group velocity dispersion value of the laser light.

When the spatial phase modulator is composed of a wavefront compensation device such as a deformable mirror, a shape of a light reflection surface of the deformable mirror is controlled by actuating an actuator produced based on an MEMS technology. Alternatively, when the spatial phase modulator is composed of a plurality of reflecting mirrors, a spatial distance from the diffraction grating to each reflecting mirror is controlled such that a spatial distance where the laser light is passed can be changed depending on the wavelength of the laser light. The laser light is exited from the diffraction grating, incident on the spatial phase modulator and then exited from the spatial phase modulator. As a result, the group velocity dispersion of the laser light can be controlled.

Furthermore, in the semiconductor laser device assembly according to the embodiment of the present disclosure including the above-described desirable embodiments and configurations, the semiconductor laser device may include a mode synchronous semiconductor laser device having a saturable absorption area. Note that in a photoexcitation mode synchronous semiconductor laser device in the related art, a temperature property of a semiconductor saturable absorber (SESAME) is used to control an oscillation property. In the mode synchronous semiconductor laser device having the saturable absorption area, the oscillation property can be controlled based on a reverse bias voltage Vsa to the saturable absorption area, thereby controlling the oscillation property easily. In this case, the mode synchronous semiconductor laser device can composed of a laminated structure where a first compound semiconductor layer having a first conductive type including a GaN based compound semiconductor, a third compound semiconductor layer (an active layer) including a GaN based compound semiconductor, and a second compound semiconductor layer having a second conductive type being different from the first conductive type including a GaN based compound semiconductor are laminated in this order.

In the semiconductor laser device assembly according to the embodiment of the present disclosure including the above-described desirable embodiments and configurations (hereinafter simply referred to as "the semiconductor laser device assembly to the embodiment of the present disclosure"), the mode synchronous semiconductor laser device includes a bi section type mode synchronous semiconductor laser device where a light emitting area and the saturable absorption area are juxtaposed in a resonator direction.

The bi section type mode synchronous semiconductor laser device includes (a) a laminated structure where a first compound semiconductor layer having a first conductive type including a GaN based compound semiconductor, a third compound semiconductor layer (an active layer) including a GaN based compound semiconductor configuring the light emitting area and the saturable absorption areas, and a second compound semiconductor layer having a second conductive type being different from the first conductive type including a GaN based compound semiconductor are laminated in this order, (b) a belt like second electrode formed on the second compound semiconductor layer, and (c) a first electrode electrically connected to the first compound semiconductor layer.

The second electrode has a first part and a second part separated by a separation groove, the first part for providing a forward bias state by directly flowing a current to the first electrode via the light emitting area, and the second part for applying a voltage to the saturable absorption area. The first compound semiconductor layer is formed on a substrate or a base.

It is desirable that electrical resistivity between the first part and the second part of the second electrode be $1\times10$ times or more, more desirably $1\times10^2$ or more, still more desirably $1\times10^3$ or more of the electrical resistivity between the second electrode and the first electrode. The mode synchronous semiconductor laser device is called as "the mode synchronous semiconductor laser device having a first configuration" as a matter of convenience. It is also desirable that the electrical resistivity between the first part and the second part of the second electrode be $1\times10^2$ times or more, more desirably $1\times10^3$ or more, still more desirably $1\times10^4$ or more. The mode synchronous semiconductor laser device is called as "the mode synchronous semiconductor laser device having a second configuration" as a matter of convenience.

In the mode synchronous semiconductor laser device having the first configuration or the second configuration, a direct current is flowed from the first part of the second electrode via the light emitting area to provide a forward bias voltage, and a voltage (a reverse bias pressure Vsa) is applied between the first electrode and the second part of the second electrode to apply the voltage to the saturable absorption area, thereby providing a mode synchronous operation.

In the mode synchronous semiconductor laser device having the first configuration or the second configuration, the electrical resistivity between the first part and the second part of the second electrode is set to 10 times or more of the electrical resistivity between the second electrode and the first electrode, or $1\times10^2 \Omega$ or more, thereby inhibiting a leak current flow from the first part to the second part of the second electrode with certainty. In other words, the reverse bias voltage Vsa applied to the saturable absorption area (a carrier non-injection area) can be increased. Therefore, the mode synchronous operation having a laser light having a short pulse time width can be provided. In addition, such a high electrical resistivity between the first part and the second part of the second electrode can be provided by the separation groove for separating the first part and the second part of the second electrode.

In the mode synchronous semiconductor laser devices having the first and second configurations, the third compound semiconductor layer has, but not limited to, a quantum well structure including a well layer and a barrier layer.

The well layer has a thickness of 1 nm or more to 10 nm or less, desirably 1 nm or more to 8 nm or less.

The barrier layer has an impurity doping concentration of $2\times10^{18}$ cm$^{-3}$ or more to $1\times10^{20}$ cm$^{-3}$ or less, desirably $1\times10^{19}$ cm$^{-3}$ or more to $1\times10^{20}$ cm$^{-3}$ or less. The mode synchronous semiconductor laser device may be called as "the mode synchronous semiconductor laser device having a third configuration" as a matter of convenience. As the quantum well structure is used for the active layer, an injection current can be higher than the case that uses a quantum dot structure, thereby providing a high output easily.

In this manner, when the well layer of the third compound semiconductor layer is set to have a thickness of 1 nm or more to 10 nm and the impurity doping concentration of the barrier layer of the third compound semiconductor layer is set to $2\times10^{18}$ cm$^{-3}$ or more to $1\times10^{20}$ cm$^{-3}$ or less, in other words, the well layer is thin and the carriers in the third compound semiconductor layer are increase, an effect of piezo polarization can be decreased and a laser light source that can generate a single peaked laser light having a short pulse time width and less subpulse components can be provided. Also, a mode synchronous driving is available with a low reverse bias voltage Vsa. A pulse train of the laser light synchronized with an external signal (an electrical signal and a light signal) can be generated. The doped impurity in the barrier layer may be silicon (Si), but is not limited thereto, and may be oxygen (O).

In the semiconductor laser device assembly according to the embodiment of the present disclosure including the above-described desirable embodiments and configurations, the semiconductor laser device can be a current injection type mode synchronous semiconductor laser device having a peak power optical density of $1\times10^{10}$ watt/cm$^2$ or more, desirably $1.4\times10^{10}$ watt/cm$^2$ or more, and a carrier density of $1\times10^{19}$/cm$^3$ or more. In this manner, by defining the peak power light density of the laser light emitted from the mode synchronous semiconductor laser device and by defining a carrier density value in the mode synchronous semiconductor laser device, the self phase modulation is generated at a high light power density and a high carrier density. By providing the adequate group velocity dispersion value, the laser light in the subpico seconds can be generated with certainty. In addition, in addition to narrowing of the pulse time width by the laser light in the subpico seconds, the current injection type mode synchronous semiconductor laser device has energy efficiency greater than the light excited type mode synchronous semiconductor laser device.

The semiconductor laser device can have a ridge stripe type Separate Confinement Hetrostructure (SCH structure). Alternatively, the semiconductor laser device can have a slant ridge stripe type Separate Confinement Heterostructure. In other words, an axis line of the semiconductor laser device and an axis line of the ridge stripe type structure can be crossed at the predetermined angle. Examples of the predetermined angle include 0.1 degrees≤θ≤10 degrees. The axis line of the ridge stripe structure is a straight line connecting a midpoint at both ends of the ridge stripe structure on a light exit end face (may be called as "a second end face" as a matter of convenience) and a midpoint at both ends of the ridge stripe structure on an end face (may be called as "a first end face" as a matter of convenience) of the laminated structure opposite to the light exit end face ("the second end face"). The axis line of the semiconductor laser device refers to an axis line orthogonal to the first end face and the second end face. The ridge stripe structure has a planar shape of straight or curved.

In the semiconductor laser device, when a width of the ridge stripe structure on the second end face is defined as $W_2$ and a width of the ridge stripe structure on the first end face is defined as $W_1$, $W_1 = W_2$ or $W_2 > W_1$. $W_2$ may be 5 μm or more. An upper limit $W_2$ of may not be limited but, for example, is $4 \times 10^2$ μm. $W_1$ may be 1.4 μm to 2.0 μm. Each end of the ridge stripe may be composed of one line segment or two or more line segments. In the former case, the width of the ridge stripe structure can be gently tapered from the first end face to the second end face. On the other hand, in the latter case, the width of the ridge stripe structure has the same from the first end face to the second end face and then gently tapered; or is widen from the first end face to the second end face and is narrowed once the maximum width is exceeded.

In the semiconductor laser device, the second end face of the laminated structure from which a laser light beam (a pulsed laser light) is emitted has desirably an optical reflectance of 0.5% or less. Specifically, a low reflectivity coat layer can be formed on the second end face. Here, the low reflectivity coat layer is composed of a laminated structure including at least two layers selected from the group consisting of a titanium oxide layer, a tantalum oxide layer, a zirconia oxide layer, a silicon oxide layer and an aluminum oxide layer. Note that a value of the optical reflectance is significantly lower than an optical reflectance (generally, 5% to 10%) at one end face of the laminated structure from which the laser light beam (a pulsed laser light) is emitted in the semiconductor laser device in the related art. Desirably, the first end face has a high optical reflectance, for example, the optical reflectance of 85% or more, more desirably 95% or more.

A length of the external resonator (X', unit: mm) is $0 < X' < 1500$, desirably $30 \leq X' \leq 500$. The external resonator is composed of the first end face of the semiconductor laser device and the spatial phase modulator configuring an external resonator structure. The length of the external resonator is a distance between the first face end of the semiconductor laser device and the spatial phase modulator.

In the semiconductor laser device, the laminated structure has the ridge stripe structure composed of a part of at least the second compound semiconductor layer in a thickness direction. The ridge stripe structure may be composed of only the second compound semiconductor layer; the second compound semiconductor layer and the third compound semiconductor layer (the active layer); or the second compound semiconductor layer, the third compound semiconductor layer (the active layer) and a part of the first compound semiconductor layer in a thickness direction.

In the semiconductor device, although not limited thereto, a width of the second electrode is 0.5 μm or more and 50 μm or less, desirably 1 μm or more and 5 μm or less, a height of the ridge stripe is 0.1 μm or more and 10 μm or less, desirably 0.2 μm or more and 1 μm or less, a width of the separation groove for separating the first part and the second part of the second electrode is 1 μm or more and 50% or less of a resonator length in the semiconductor device (hereinafter simply referred to as "the resonator length"), desirably 10 μm or more and 10% or less of the resonator length. For example, the resonator length is 0.6 mm, but is not limited thereto. A distance (D) from a top face of a part of the second compound semiconductor layer positioned outside of both ends of the ridge stripe structure to the third compound semiconductor layer (the active layer) is desirably $1.0 \times 10^{-7}$ m (0.1 μm) or more. By defining the distance (D) in this way, saturable absorption areas can be formed with certainty on both ends of the third compound semiconductor layer (in an Y direction). An upper limit of the distance (D) may be determined by an increase in a threshold current, a temperature property, a degradation of a current rise percentage upon long term driving, etc. In the following description, a resonator length direction is defined as an X direction, and a thickness direction of the laminated structure is defined as a Z direction.

Furthermore, in the semiconductor laser device, the second electrode is composed of a palladium (Pd) monolayer, nickel (Ni) monolayer, platinum (Pt) monolayer, a palladium layer/a platinum layer laminated structure where the palladium layer is in contact with the second compound semiconductor layer, or a palladium layer/nickel layer laminated structure where the palladium layer is in contact with the second compound semiconductor. When a lower metal layer is made of the palladium and an upper meta layer is made of nickel, the upper metal layer has a thickness of 0.1 μm or more, desirably 0.2 μm or more. Alternatively, the second electrode is desirably made of the palladium (Pd) monolayer. In this case, the thickness is 20 nm or more, desirably 50 nm or more. Alternatively, the second electrode may be made of the palladium (Pd) monolayer, the nickel (Ni) monolayer and the platinum (Pt) monolayer, or the lower metal layer is made of a laminated structure of the lower metal layer being contact with the second compound semiconductor layer and the upper metal layer (the lower metal layer is made of at least one metal selected from the group consisting of palladium, nickel and platinum, and the upper metal layer is made of the metal having an etching rate for forming the separation groove in the second electrode being the same, similar or higher than the etching rate of the lower metal layer in the step (D) as described layer. In the step (D) described later, an etching liquid used for forming the separation groove in the second electrode is desirably aqua regia, nitric acid, sulfuric acid, hydrochloric acid or a mixed liquid containing at least two of the acids (specifically, a mixed liquid of nitric acid and sulfuric acid and a mixed liquid of sulfuric acid and hydrochloric acid).

In the semiconductor laser device according to the embodiment of the present disclosure including the above-described desirable embodiments and configurations, the saturable absorption area may have a length shorter than that of the light emitting area. Alternatively, the second electrode may have a length (a total length of the first part and the second part) shorter than that of the third compound semiconductor layer (the active layer). Specifically, the first part and the second part of the second electrode have the following configurations:

(1) One first part of the second electrode and one second part of the second electrode are formed, and the first part of the second electrode and the second part of the second electrode are positioned via the separation groove.

(2) One first part of the second electrode and two second parts of the second electrode are formed, and one end of the first part faces to one of the second part via one separation groove, and the other end of the first part faces to the other of the second part via the other separation groove.

(3) Two first parts of the second electrode and one second part of the second electrode are formed, and an end of the second part faces to one of the first part via one separation groove, and the other end of the second part faces to the other of the first part via the other separation groove (in other words, in the second electrode, the first parts are disposed via the second part).

Generally, (4) N number of the first part of the second electrode and (N−1) number of the second part of the second electrode are formed, and the first parts of the second electrode are disposed via the second part(s) of the second electrode.

(5) N number of the second part of the second electrode and (N−1) number of the first part of the second electrode are formed, and the second parts of the second electrode are disposed via the first part(s) of the second electrode. The configurations (4) and (5) are rephrased as follows:

(4') N number of the light emitting areas [carrier injection areas, gain areas] and (N−1) number of the saturable absorption areas [carrier non-injection areas] are formed, and the light emitting areas are disposed via the saturable absorption area(s).

(5') N number of the saturable absorption areas [carrier non-injection areas] and (N−1) number of the light emitting area(s) [carrier injection areas, gain area(s)] are formed, and the saturable absorption areas are disposed via the light emitting area(s).

By using the configurations (3), (5), (5'), the light exit end face of the mode synchronous semiconductor laser device is less damaged.

The mode synchronous semiconductor laser device can be produced, for example, by the following method. In other words, (A) On a base, a first compound semiconductor layer having a first conductivity type and including a GaN based compound semiconductor, a third compound semiconductor layer having a light emitting area and a saturable absorption area including a GaN based compound semiconductor, and a second compound semiconductor layer having a second conductivity type being different from the first conductivity type and including a GaN based compound semiconductor are laminated sequentially to form a laminated structure, (B) on the second compound semiconductor layer, a belt like second electrode is formed, (C) at least a part of the second compound semiconductor layer is etched to form a ridge stripe structure as an etching mask of the second electrode, (D) a resist layer is formed for forming a separation groove on the second electrode, and the separation groove is formed on the second electrode by a wet etching method using the resist layer as a wet etching mask, thereby separating the second electrode into a first part and a second part by the separating groove.

By the production method, the ridge stripe structure is formed by etching at least a part of the second compound semiconductor layer is etched as the etching mask of the belt like second electrode. In other words, the ridge stripe structure is formed by a self align method using the second electrode patterned as the etching mask. There is no chance to generate misalignment between the second electrode and the ridge stripe structure. The separation groove is formed on the second electrode by the wet etching method. Unlike a dry etching method, the wet etching method allows the second compound semiconductor layer to be inhibited from degrading of optical and electrical properties. In this way, the light emitting properties can be prevented from degrading with certainty.

In the step (C), the second compound semiconductor layer may be partly etched in a thickness direction, the second compound semiconductor layer may be wholly etched in the thickness direction, the second compound semiconductor layer and the third compound semiconductor layer may be etched in thickness directions, the second compound semiconductor layer, the third compound semiconductor layer and the first compound semiconductor layer may be partly etched in the thickness directions.

In the step (D), when the separation groove is formed on the second electrode, it is desirable that $ER_0/ER_1 \geq 1 \times 10$ and more desirably $ER_0/ER_1 \geq 1 \times 10^2$ are satisfied where $ER_0$ represents the etching rage of the second electrode and $ER_1$ represents the etching rate of the laminated structure. When $ER_0/ER_1$ satisfies the inequation, the second electrode can be etched with certainty without etching the laminated structure (or with a little etching the laminated structure).

In the semiconductor laser device, the laminated structure is specifically composed of an AlGaInN based compound semiconductor. Examples of the AlGaInN based compound semiconductor include GaN, AlGaN, GaInN and AlGaInN. In addition, the compound semiconductor may contain a boron (B) element, a thallium (Tl) element, an arsenic (As) atom, a phosphorus (P) element and an antimony (Sb) element, as appropriate. Desirably, the third compound semiconductor layer (the active layer) configuring the light emitting area (the gain area) and the saturable absorption area has the quantum well structure. Specifically, the third compound semiconductor layer may have a single quantum well structure [a QW structure] or a multiple quantum well structure [a MQW structure]. The third compound semiconductor layer (the active layer) having the quantum well structure has a laminated structure where at least one of a well layer and a barrier layer is formed. A combination of the compound semiconductor including the well layer and the compound semiconductor including the barrier layer include $(In_yGa_{(1-y)}N, GaN)$, $(In_yGa_{(1-y)}N, In_zGa_{(1-z)}N)$ [where $y>z$], $(In_yGa_{(1-y)}N, AlGaN)$.

Furthermore, in the semiconductor laser device, the second compound semiconductor layer has a superlattice structure having a thickness of 0.7 μm or less where p-type GaN layers and p-type AlGaN layers are laminated alternately. By the superlattice structure, series resistance components of the semiconductor laser devices can be decreased while a necessary refractive index of a clad layer is maintained. Thus, an operating voltage of the semiconductor laser device can be decreased. A lower limit of the thickness of the superlattice structure is not especially limited, but may be 0.3 μm. The p-type GaN layer having the superlattice structure has a thickness of 1 nm to 5 nm, for example. The p-type AlGaN layer having the superlattice structure has a thickness of 1 nm to 5 nm, for example. A total layer number of the p-type GaN layers and the p-type AlGaN layers is 60 to 300, for example. A distance from the third compound semiconductor layer to the second electrode is 1 μm or less, desirably 0.6 μm or less. By defining the distance from the third compound semiconductor layer to the second electrode, the p-type second compound semiconductor layer having high resistivity can be thin, and the operating voltage of the semiconductor laser device can be decreased. A lower limit of the distance from the third compound semiconductor layer to the second electrode is not especially limited, but may be 0.3 μm. Into the second compound semiconductor layer, $1 \times 10^{19}$ cm$^{-3}$ or more of Mg is doped. The second compound semiconductor layer has an absorption coefficient of at least 50 cm$^{-1}$ to the light having a wavelength of 405 nm from the third compound semiconductor layer. An atom concentration of Mg is derived from a material property that a maximum hole concentration is provided at a value of $2 \times 10^{19}$ cm$^{-3}$. Mg doping is designed to have the maximum hole concentration, i.e., such that the second compound semiconductor layer has a minimum specific resistance. The absorption coefficient of the second compound semiconductor layer is defined in terms of decreasing the resistance of the semiconductor laser device as low as possible. As a result, the third compound semiconductor layer has generally a light absorption coefficient of 50 cm$^{-1}$. However, in order to increase the absorption coefficient, it is possible that a Mg doped amount be purposely set to $2 \times 10^{19}$ cm$^{-3}$ or more. In this case, in order to provide a practical hole concentration, an upper limit of the Mg doped amount is $8 \times 10^{19}$ cm$^{-3}$, for example. The second compound semiconductor layer has a non-doped compound semiconductor layer and the p-type compound semiconductor layer from a third compound semiconductor layer side. A distance between the third compound semiconductor layer and the p-type compound semiconductor layer can be $1.2 \times 10^{-7}$ m or less. By defining the distance between the third compound semiconductor layer and the p-type compound semiconductor layer, an internal loss can be inhibited without decreasing an internal quantum efficiency. This allows a threshold current density where a laser is started to be oscillated to be decreased. A lower limit of the distance between the third compound semiconductor layer and the p-type compound semiconductor layer is not especially limited, but may be $5 \times 10^{-8}$ m. At both sides of the ridge stripe structure, a laminated insulation film composed of an SiO$_2$/Si laminated structure is formed. A difference between an effective refractive index of the ridge stripe structure and an effective refractive index of the laminated insulation film can be $5 \times 10^{-3}$ to $1 \times 10^{-2}$. By using the laminated insulation film, a single basic lateral mode can be maintained even if a high output operation exceeding 100 milliwatts is made. The second compound semiconductor layer includes a non-doped GaInN layer (a p-side light guide layer), a Mg doped AlGaN layer (an electron barrier layer), a superlattice structure of GaN layer (Mg doped)/AlGaN layer (superlattice clad layer) and a Mg doped GaN layer (a p-side contact layer) from the third compound semiconductor layer side, for example. A band gap of the compound semiconductor of the well layer in the third compound semiconductor layer is desirably 2.4 eV or more. A laser light emitted and outputted from the third compound semiconductor layer (the active layer) has desirably a wavelength of 360 nm to 500 nm, more desirably 400 nm to 410 nm. It will be appreciated that a variety of configurations as described above will be combined.

A variety of GaN based compound semiconductor layers for forming the semiconductor laser device are sequentially formed on the substrate or the base. Examples of the substrate or the base include a GaAs substrate, a GaN substrate, a SiC substrate, an alumina substrate, a ZnS substrate, a ZnO substrate, an AlN substrate, a LiMgO substrate, a LiGaO$_2$ substrate, a MgAl$_2$O$_4$ substrate, a InP substrate, a Si substrate, these substrate on which an under layer or a buffer layer formed on a surface (a principal surface) thereof as well as a sapphire substrate. Mostly, when the GaN based compound semiconductor layer is formed on the substrate, the GaN substrate is desirable in that a defect density is low. It is known that the properties of the GaN substrate are changed as polar/non-polar/semi-polar depending on growth faces. As a method of forming a variety of compound semiconductor layers (such as the GaN based compound semiconductor layer) forming the semiconductor laser device, examples include a metal organic chemical vapor deposition (a MOCVD method, a MOVPE method), a molecular beam epitaxy method (a MBE method), a hydride vapor phase epitaxy method where a halogen contributes to a transportation or a reaction.

In the MOCVD method, examples of an organic gallium source gas include trimethyl gallium (TMG) gas and triethyl gallium (TEG) gas, and examples of a nitrogen source gas include an ammonium gas or a hydrazine gas. When a GaN based compound semiconductor layer having an n type conductivity is formed, silicon (Si) may be added as an n type impurity (an n type dopant). When a GaN based compound semiconductor layer having a p type conductivity is formed, magnesium (Mg) may be added as a p type impurity (a p type dopant). When the GaN based compound semiconductor layer includes aluminum (Al) or indium (In) as constituent atoms, trimethyl aluminum (TMA) gas may be used as an Al source or trimethyl indium (TMI) gas may be used as an In source. Furthermore, as a Si source, monosilane gas (SiH$_4$ gas) may be used. As a Mg source, cyclopentadienyl magnesium gas, methylcyclopentadienyl magnesium and biscyclopentadienyl magnesium (Cp$_2$Mg) may be used. The n type impurity (the n type dopant) includes Ge, Se, Sn, C, T, Te, S, O, Pd and Po as well as Si. The p type impurity (the p type dopant) includes Zn, Cd, Be, Ca, Ba, C, Hg and Sr as well as Mg.

When the first conductive type is the n type, the first electrode electrically connected to the first compound semiconductor layer having the n type conductive type has a single layer structure or a multilayer structure containing at least one metal selected from the group consisting of gold (Au), silver (Ag), palladium (Pd), aluminum (Al), titanium (Ti), tungsten (W), copper (Cu), zinc (Zn), tin (Sn) and indium (In), e.g., Ti/Au, Ti/Al, Ti/Pt/Au. The embodiment where the first electrode is electrically connected to the first compound semiconductor layer involves embodiments where the first electrode is formed on the first compound semiconductor layer and the first electrode is connected to the first compound semiconductor layer via a conductive material layer or a conductive substrate or base. The first electrode and the second electrode can be formed by a PVD method including a vacuum deposition method, a sputtering method and the like.

A pad electrode may be formed on the first electrode or the second electrode to electrically connect to an external electrode or circuit. The pad electrode desirably has a single layer structure or a multilayer structure containing at least one metal selected from the group consisting of titanium (Ti), aluminum (Al), platinum (Pt), gold (Au) and nickel (Ni). The pad electrode may have the multilayer structure such as a Ti/Pt/Au multilayer structure and a Ti/Al multilayer structure.

In the mode synchronous semiconductor laser device having the first configuration or the second configuration, the reverse bias pressure Vsa is desirably applied between the first electrode and the second part (in other words, the first electrode is a positive electrode and the second part is a negative electrode) as described above. A pulse current or a pulse voltage that is synchronized with a pulse current or a pulse voltage applied to the first part of the second electrode may be applied to the second part of the second electrode, or a DC bias may be applied to the second part of the second electrode. A current can be flowed from the second electrode to the first electrode via the light emitting area, and an external electrical signal can be superimposed from the second electrode to the first electrode via the light emitting area. In this manner, the laser light can be synchronized with the external electrical signal. Alternatively, the light signal can be incident from one end face of the laminated structure. Also in this manner, the laser light can be synchronized with the external electrical signal. In the second compound semiconductor layer, the non-doped compound semiconductor layer (for example, the non-doped GaInN layer or the non-doped AlGaN layer) may be formed between the third compound semiconductor layer and the electron barrier layer. Furthermore, the non-doped GaInN layer may be formed between the third compound semiconductor layer and the non-doped compound semiconductor layer as a light guide layer. An uppermost layer of the second compound semiconductor layer may be occupied by the Mg doped GaN layer (the p side contact layer).

The mode synchronous semiconductor laser device is not limited to the bi section type (two electrode type) semiconductor laser device. There may be used a multi section type (multi electrode type) semiconductor laser device, a SAL (Saturable Absorber Layer) type semiconductor laser device where the light emitting area and the saturable absorption area are disposed in a perpendicular direction or a WI (Weakly Index guide) type semiconductor laser device where the saturable absorption area is disposed along the ridge stripe structure.

As described above, the semiconductor optical amplifier, if present, is desirably composed of a laminated structure of a III-V group nitride based semiconductor layer or a laminated structure of a wide gap semiconductor layer that amplifies the laser light exited from the dispersion compensation optical system to the outside of the system. In this case, the laser light outputted from the semiconductor laser device assembly has desirably a negative frequency chirp and a pulse time width of 0.5 picoseconds or less. Here, when $\tau1$ represents the pulse time width of the laser light incident on the semiconductor amplifier, and $\tau2$ represents the pulse time width of the laser light outputted from the semiconductor optical amplifier, $\tau1 > \tau2$. The higher a driving current value of the semiconductor optical amplifier is, the lower the value of $\tau2$ is. In the semiconductor optical amplifier, a carrier intraband relaxation time is desirably 25 femtoseconds or less. Also, the laser light outputted from the semiconductor optical amplifier has a light spectrum width of 4.5 THz or more. A light spectrum width $\Delta SP_L$ of laser light having a wavelength $\lambda$ (unit: meter) is generally represented by a length unit (meter). When it is represented by a frequency $\Delta SP_F$ with a light speed of c (unit: meter/sec):

$$\Delta SP_F = \Delta SP_L \times c / (\lambda^2)$$

Furthermore, a driving current density of is desirably $5 \times 10^3$ amperes/cm$^2$ or more. The driving current density is provided by dividing a current for driving the semiconductor optical amplifier by an area where a driving current flows in the semiconductor optical amplifier. The semiconductor optical amplifier has a light confinement coefficient of 3% or less, desirably 1% or less, thereby providing a higher output from the semiconductor optical amplifier. In the semiconductor laser device assembly according to the embodiment of the present disclosure including the above-described variety of desirable embodiments, the light spectrum width of the laser light outputted from the semiconductor optical amplifier is desirably increased 2.5 THz or more against the light spectrum width of the laser light incident on the semiconductor optical amplifier.

The semiconductor optical amplifier has the light confinement coefficient of 3% or less, desirably 1% or less. In order to provide this, in the semiconductor optical amplifier,
   a first compound semiconductor layer has a laminated structure including a first clad layer and a first light guide layer,
   the laminated structure has a ridge stripe structure including a second compound semiconductor layer, a third compound semiconductor layer (an active layer) and a part of a first light guide layer in a thickness direction, it satisfies $$6 \times 10^{-7}\ m < t_1,\ \text{desirably}\ 8 \times 10^{-7}\ m \le t_1,$$

0 (m) $< t_1' \le 0.5 \cdot t_1$, desirably 0 (m) $< t_1' \le 0.3 \cdot t_1$, where $t_1$ represents a thickness of the first light guide layer and $t_1'$ represents a thickness of a part of the first light guide layer configuring the ridge stripe structure.

The semiconductor optical amplifier is called as "the semiconductor optical amplifier having a first configuration" as a matter of convenience. By defining the thickness $t_1$ of the first light guide layer, the light confinement coefficient can be lowered. A peak of a light intensity distribution is moved from the third compound semiconductor layer (the active layer) to the first light guide layer. As a result, a light density around the third compound semiconductor layer can be lowered upon the high output operation. Not only optical damages can be prevented, but also a saturated energy of an amplified laser light is increased to provide the high output operation in the semiconductor optical amplifier. By defining the thickness $t_1'$ of a part of a first light guide layer configuring the ridge stripe structure, the light beam outputted can have a single mode. A width of a slab waveguide is similar to the thickness of the first light guide layer, resulting in a light beam having a cross-sectional shape of a substantially true circle. There is no adverse effect such as degraded light collecting properties, when applying to a lens or optical fibers. When the width of the ridge stripe structure (for example, the width of the ridge stripe structure on the light exit end face) is defined as W, the following relation is desirably satisfied.

$$0.2 \times W < t_1 < 1.2 \times W,\ \text{desirably}\ t_1 \le 3 \times 10^{-6}\ m$$

When crystal is grown such that the first guide layer has the thickness $t_1$ of $3 \times 10^{-6}$ m or less, crystal surface morphology does not get rough and optical properties and electrical properties of the laser light outputted from the semiconductor optical amplifier can be prevented from degrading.

The semiconductor optical amplifier having the first configuration can output a single mode light beam. In this case, $0.2 \le LB_Y/LB_X \le 1.2$, and desirably $0.2 \le LB_Y/LB_X \le 1.0$ are satisfied where $LB_X$ represents a size of the light beam outputted from the light exit end face of the laminated structure in a width direction of the ridge stripe structure, and $LB_Y$ represents the size in a thickness direction of the ridge stripe structure. In addition, as to a distance $Y_{CC}$ from a center point of the active layer in the laminated structure to a center point of the light beam outputted from the laminated structure along the thickness direction of the ridge stripe structure on the light exit end dace of the laminated structure, $t_1' \le Y_{CC} \le t_1$, and desirably $t_1' \le Y_{CC} \le 0.5 \cdot t_1$ are satisfied.

In the semiconductor optical amplifier having the first configuration, the first light guide layer has a high refractive index layer made of a compound semiconductor material having a refractive index higher than that of the compound semiconductor material of the first light guide layer.

Specifically, in the semiconductor optical amplifier having the first configuration, $0.01 \le n_{HR} - n_{G-1} \le 0.1$, and desirably $0.03 \le n_{HR} - n_{G-1} \le 0.1$ are satisfied where $n_{G-1}$ represents a refractive index of the compound semiconductor material of the first light guide layer, and $n_{HR}$ represents a refractive index of a compound semiconductor material of the high refractive index layer. Also, $n_{HR} \le n_{AC}$ is desirably satisfied, where $n_{AC}$ represents an average refractive index of the compound semiconductor material of the third compound semiconductor layer (the active layer). In addition, the second compound semiconductor layer has a laminated structure of a second light guide layer and a second clad layer from a base side. The first light guide layer can be thicker than the second light guide layer.

As described above, the light confinement coefficient is 3% or less, desirably 1% or less. In order to provide this, in the semiconductor optical amplifier, the laminated structure has a ridge stripe structure composed at least a part of the second compound semiconductor layer in a thickness direction, the first compound semiconductor layer has a thickness of exceeding 0.6 µm (an upper limit of the thickness can be 10 µm, for example), and the first compound semiconductor layer has a high refractive index layer made of a compound semiconductor material having a refractive index higher than that of the compound semiconductor material of the first light guide layer. The semiconductor optical amplifier having such a configuration is called as "the semiconductor optical amplifier having a second configuration" as a matter of convenience.

In this way, in the semiconductor optical amplifier having the second configuration, as the first compound semiconductor layer has a thickness of exceeding 0.6 µm, the light confinement coefficient can be decreased. The peak of the light intensity distribution is moved from the third compound semiconductor layer (the active layer) to the first compound semiconductor layer. As a result, a light density around the third compound semiconductor layer can be lowered upon the high output operation. Not only optical damages can be prevented, but also a saturated energy of an amplified laser light is increased to provide the high output operation in the semiconductor optical amplifier. In addition, as the first compound semiconductor layer has a high refractive index layer made of a compound semiconductor material having a refractive index higher than that of the compound semiconductor material of the first compound semiconductor layer, single mode conditions can be satisfied in a wider range in the thickness direction of the compound semiconductor layer, as compared to the case that no high refractive index layer is disposed. Thus, cut-off conditions can be relaxed, thereby outputting the single mode light beam.

In the semiconductor optical amplifier having the second configuration, the first compound semiconductor layer has a laminated structure of a first clad layer and a first light guide layer from a base side, the first compound semiconductor layer has a thickness of exceeding 0.6 µm, and the high refractive index layer is formed within the first light guide layer. In other words, the first light guide layer has a laminated structure of a first part of the first light guide layer, the high refractive index layer, and a second part of the first light guide layer from the base. Here, the first part of the first light guide layer is called as a "first-A light guide layer" as a matter of convenience, and the second part of the first light guide layer is called as a "first-B light guide layer" as a matter of convenience.

In this case, a distance from an interface between the third compound semiconductor layer (the active layer) and the first light guide layer (an interface between the third compound semiconductor layer and the first-B light guide layer) to an interface between the part of the first light guide layer (the first-B light guide layer) positioned at a third compound semiconductor layer side and the high refractive index layer (i.e., a thickness of the first-B light guide layer) is desirably 0.25 µm or more. An upper limit by subtracting the thickness of the first light guide layer from the thickness of the high refractive index layer can be 5 µm, for example.

$0<n_{HR}-n_{G-1}\leq 0.3$, and desirably $0.02\leq n_{HR}-n_{G-1}\leq 0.2$ are satisfied where $n_{G-1}$ represents a refractive index of the compound semiconductor material of the first light guide layer, and $n_{HR}$ represents a refractive index of a compound semiconductor material of the high refractive index layer. $n_{HR}\leq n_{AC}$ is desirably satisfied, where $n_{AC}$ represents an average refractive index of the compound semiconductor material of the third compound semiconductor layer (the active layer).

The semiconductor optical amplifier having the second configuration can output a single mode light beam. In this case, $3\times 10^0 \leq LB_Y/LB_X \leq 1\times 10^3$, and desirably $1\times 10^1 \leq LB_Y/LB_X \leq 1\times 10^2$ are satisfied where $LB_X$ represents a size of the light beam outputted from the light exit end face of the laminated structure in a width direction of the ridge stripe structure, and $LB_Y$ represents the size in a thickness direction of the ridge stripe structure. In addition, as to a distance $Y_{CC}$ from a center point of the active layer in the laminated structure to a center point of the light beam outputted from the laminated structure along the thickness direction of the ridge stripe structure on the light exit end dace of the laminated structure, $0 \text{ m} < Y_{CC} \leq$(thickness of the first light guide layer), and desirably $0 \text{ m} < Y_{CC} \leq$(thickness of the first-B light guide layer) are satisfied. In addition, the second compound semiconductor layer has a laminated structure of the second light guide layer and the second clad layer from the base side. The first light guide layer can be thicker than the second light guide layer.

In the semiconductor optical amplifier, the laminated structure is specifically composed of an AlGaInN based compound semiconductor. The high refractive index layer in the semiconductor optical amplifier having the first configuration or the second configuration can be composed of the AlGaInN based compound semiconductor. The configuration and the structure of the semiconductor optical amplifier can be substantially the same as those of the mode synchronous semiconductor laser device except that the second electrode is not separated.

Furthermore, the semiconductor laser device assembly according to the embodiment of the present disclosure including the above-described desirable embodiments and configurations includes a light spectrum shaper. The light spectrum shaper shapes the light spectrum of the laser light exited from the dispersion compensation optical system to the outside of the system. The light spectrum shaper is disposed between the dispersion compensation optical system and the semiconductor optical amplifier. The light spectrum shaper is composed of a bandpass filter formed of a dielectric multilayer film. The laser light exited from the dispersion compensation optical system to the outside of the system can pass the bandpass filter a plurality of times. The bandpass filter can be provided by laminating a dielectric thin film having a low dielectric constant and dielectric thin film having a high dielectric constant. Thus, when the laser light exited from the dispersion compensation optical system to the outside of the system passes through the light spectrum shaper, a pulse can be extended adequately and reliably. The light spectrum shaper is not limited to the bandpass filter, and may be a wavelength dispersion device such as a diffraction grating, bragg diffraction grating, and volume horographic diffraction grating, so long as a necessary spectrum width can be provided.

The semiconductor laser device assembly according to the embodiment of the present disclosure can be applied to a variety of fields including an optical disc system, a communication field, an optical information field, an opto-electronic integrated circuit, a field utilizing a non-linear optical phenomenon, an optical switch, a laser measurement field, a variety of analysis fields, an ultrafast spectroscopy field, a multiphoton excitation spectroscopy field, a mass spectrography field, a microspectroscopy utilizing multiphoton absorption, a quantum control of a chemical reaction, a nano three dimensional fabrication field, a variety of fabrication fields utilizing multiphoton absorption, a medical field, a bio imaging field, a quantum information communication field and a quantum information processing field.

A light density of the laser light emitted from the semiconductor laser device can be provided by dividing power of the laser light (unit: watt, peak power when it is a pulse lase light) by a cross-section area (an area of $1/e^2$ to the peak intensity) of a near-field image in the end face of the semiconductor laser device. A carrier density can be provided as follows: Firstly, a carrier lifetime is measured. An injection current amount is divided by an area of a gain electrode (for example, the first part of the second electrode described later). A value obtained is multiplied by the carrier lifetime. In the meantime, the group velocity dispersion value can be provided by: a method of measuring a change in the pulse time width after a pulse of the light to be measured is transmitted through a medium having a known dispersion amount, or a FROG (frequency resolved optical gating) method. The pulse time width of about 1 picosecond or less can be measured by using an SHG intensity correlation measurement apparatus.

In general, when an optical path of a long wavelength component is longer than that of a short wavelength component, negative group velocity dispersion is formed. In other words, a group velocity dispersion value becomes negative. On the other hand, when an optical path of a long wavelength component is shorter than that of a short wavelength component, positive group velocity dispersion is formed. In other words, a group velocity dispersion value becomes positive. Accordingly, in order to lengthen and shorten the optical paths of the long wavelength component and the short wavelength component, the spatial phase modulator may be controlled or the spatial phase modulator may be disposed. When the spatial phase modulator is used, a phase is modulated per wavelength. A specific value of the group velocity dispersion may be determined based totally on a configuration and a structure of the semiconductor laser device, a configuration and a structure of the semiconductor laser device assembly, a driving method (for example, the current amount applied to the carrier injection areas (the gain areas), the reverse bias voltage applied to the saturable absorption area (the carrier non-injection area), and a driving temperature) and the like. The group velocity dispersion value is provided by differentiating twice the phase by the frequency.

Hereinafter, embodiments of the semiconductor laser device assembly will be described. Beforehand, the semiconductor laser device assembly in the related art having the semiconductor laser device and the dispersion compensation optical system will be described, and the semiconductor laser device assembly according to the embodiment of the present disclosure will be then described.

Figure 29:
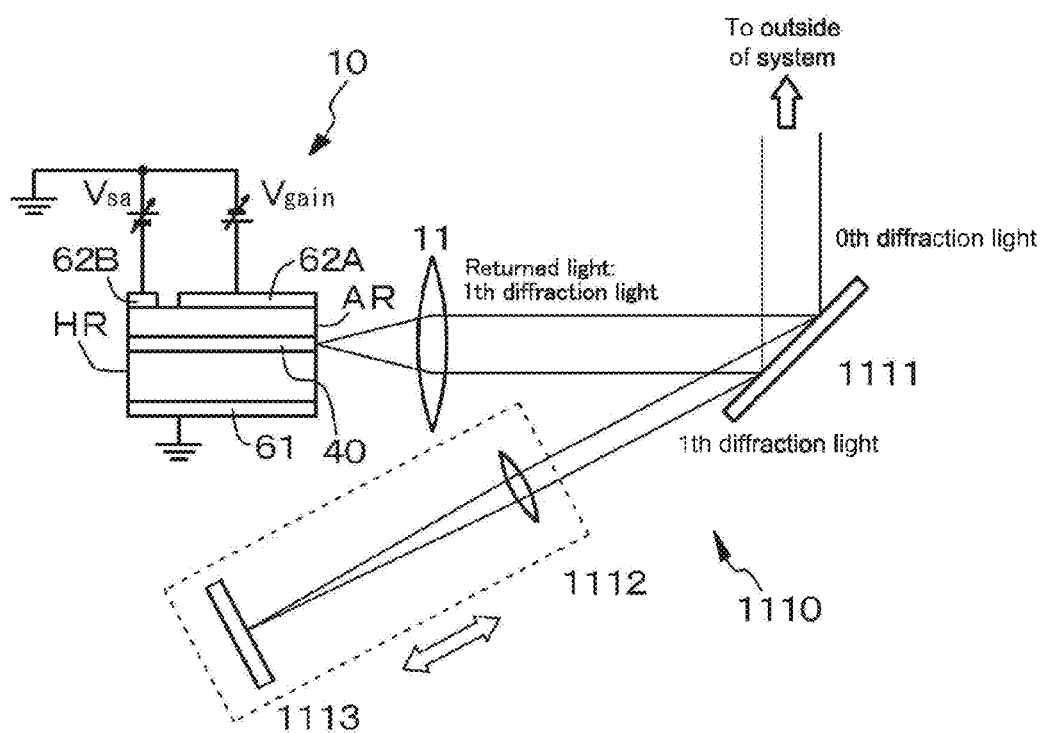
FIG. 29 is a conceptual diagram of a semiconductor laser device assembly in the related art disclosed in Japanese Patent Application Laid-open No. 2013-105813.

FIG. 29 shows a conceptual diagram of the semiconductor laser device assembly in the related art having the semiconductor laser device and the dispersion compensation optical system disclosed in Japanese Patent Application Laid-open No. 2013-105813 (hereinafter simply referred to as "the semiconductor laser device assembly in the related art").

A laser light exited from a mode synchronous semiconductor laser device 10 is incident on a dispersion compensation optical system 1110. A part of the laser light incident on the dispersion compensation optical system 1110 is exited from the dispersion compensation optical system 1110 and is returned to the mode synchronous semiconductor laser device 10. The rest of the laser light incident on the dispersion compensation optical system 1110 is outputted to the outside of the system. The dispersion compensation optical system 1110 includes a diffraction grating 1111, a light collector (specifically, a lens) 1112 and a reflecting mirror 1113. The light exited from the mode synchronous semiconductor laser device 10 is collimated to a parallel light flux by an aspheric lens 11 and is incident on the diffraction grating 1111. Refer to the description in Embodiment 1 for further details about the mode synchronous semiconductor laser device 10.

A distance between the light collector 1112 and the reflecting mirror 1113 in the dispersion compensation optical system 1110 equals to a focal length f of the light collector 1112. The light incident on the light collector 1112 and the light exited from the light collector 1112 have a relationship of an incident light and an exit light in a microscope having one power magnification. When the light collector 1112 and the reflecting mirror 1113 are moved on an optical axis along 1 order diffraction light while a distance therebetween is kept constant (the focal length f), the dispersion is changed mutually between the incident light and the exited light on/from the dispersion compensation optical system 1110. For example, when the distance between the diffraction grating 1111 and the light collector 1112 equals to the focal length f of the light collector 1112, angular dispersions of a light directing from the diffraction grating 1111 to the light collector 1112 and a light reflected by reflecting mirror 1113 and incident on the diffraction grating 1111 via the light collector 1112 are not changed. In this case, a known dispersion amount provided by the dispersion compensation optical system 1110 is zero. On the other hand, when the distance between the diffraction grating 1111 and the light collector 1112 is longer than the focal length f of the light collector 1112, an optical path of a long wavelength component is longer than that of a short wavelength component by a geometric drawing. In this case, negative group velocity dispersion is formed. In this manner, the diffraction grating 1111, the light collector 1112 and the reflecting mirror 1113 are combined to configure an external resonator being capable of dispersion compensation. The diffraction grating 1111 generates a reflected light ($0^{th}$ order diffraction light) by specular reflection other than the $1^{th}$ order diffraction light. The reflected light is used for a light output.

Figure 30A:
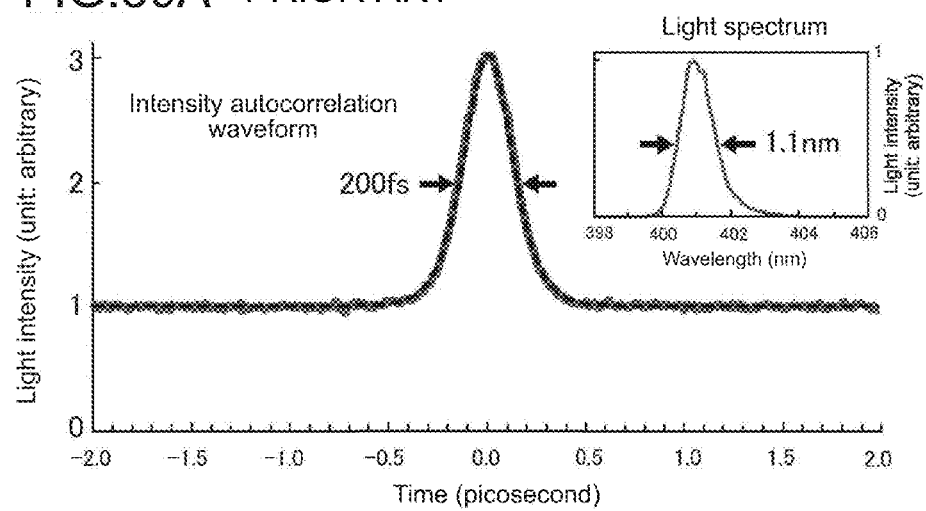
FIG. 30A is a graph showing an intensity autocorrelation waveform and a light spectrum of a laser light after a pulse laser light provided by the semiconductor laser device assembly in the related art shown in FIG. 29 is spectrum filtered.
Figure 30B:
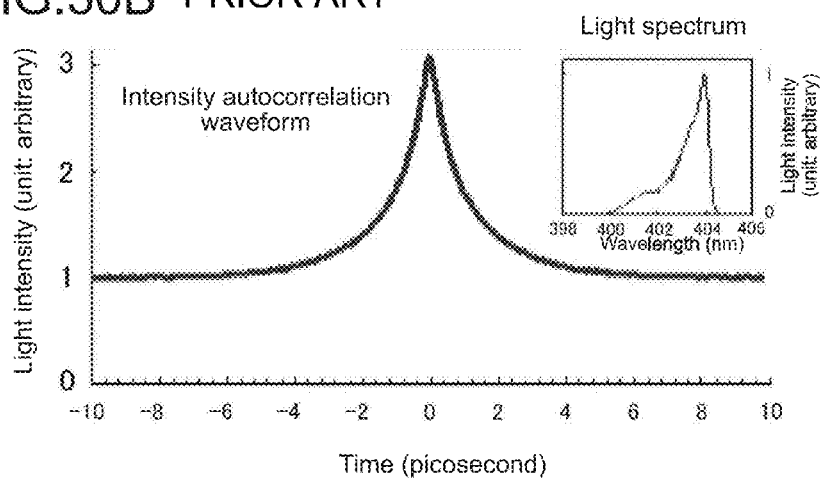
FIG. 30B is a graph showing an intensity autocorrelation waveform and a light spectrum of a pulse laser light directly outputted from the mode synchronous semiconductor laser device.

In this way, in the semiconductor laser device assembly in the related art, the distance between the diffraction grating 1111 and the light collector 1112 in the dispersion compensation optical system 1110 is changed to change the group velocity dispersion, thereby controlling the duration of the laser light generated. Typically, it is found that the pulse time width of the laser light is narrow when the group velocity dispersion value of the dispersion compensation optical system 1110 is smaller than $-0.04$ $ps^2$. In particularly, when the group velocity dispersion is $-0.058$ $ps^2$, the laser light having the pulse time width of about 200 picoseconds can be provided by spectrum filtering. FIG. 30A shows an intensity autocorrelation waveform and a light spectrum of the laser light after the laser light provided by the semiconductor laser device assembly in the related art shown in FIG. 29 is spectrum filtered. FIG. 30B shows an intensity autocorrelation waveform and a light spectrum of the laser light directly outputted from the mode synchronous semiconductor laser device 10. The intensity autocorrelation waveform has a peak at time of zero. In this case, the pulse shape shows that it is not a Gaussian function and a sech$^2$ type function. However, the intensity autocorrelation waveform has a symmetrical shape to the time zero, as the laser light is correlated with itself. An actual time pulse shape is not available.

Figure 31:
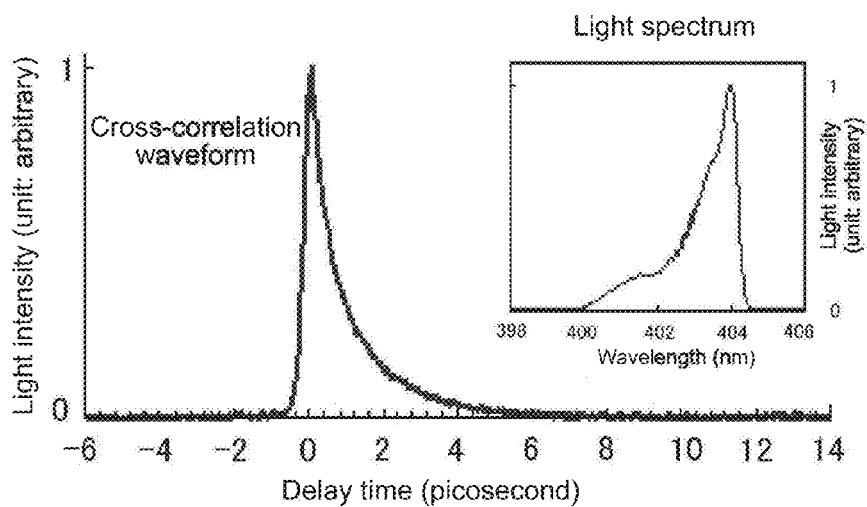
FIG. 31 is a graph showing an intensity autocorrelation waveform and a light spectrum of a pulse laser light directly outputted from the semiconductor laser device assembly in the related art shown in FIG. 29.

By using that the pulse time width in the femtosecond was provided by the spectrum filtering, a cross-correlation measurement was performed. This is a method of measuring correlation between the laser light outputted directly from the mode synchronous semiconductor laser device and the laser light having the pulse time width of 200 femtoseconds provided from the semiconductor laser device assembly. It corresponds to the way that the laser light outputted directly from the mode synchronous semiconductor laser device is sampled by the laser light having the pulse time width of 200 femtoseconds. Specifically, the measurement is done by inserting the bandpass filter formed of a dielectric multilayer film into one arm of an interferometer in an intensity autocorrelation measurement apparatus. FIG. 31 shows a result of the cross-correlation measurement thus provided. A cross-correlation waveform shown in FIG. 31 shows that the laser light outputted directly from the mode synchronous semiconductor laser device is formed by a steep time rise corresponding to the pulse time width of 200 femtoseconds and an exponentially slow decay thereafter. Accordingly, in the semiconductor laser device assembly in the related art, a spectrum component at a short wavelength side is extracted to provide the laser light in 200 femtoseconds, in other words, a steep rise in a time pulse shown in FIG. 31 is extracted.

Figure 32:
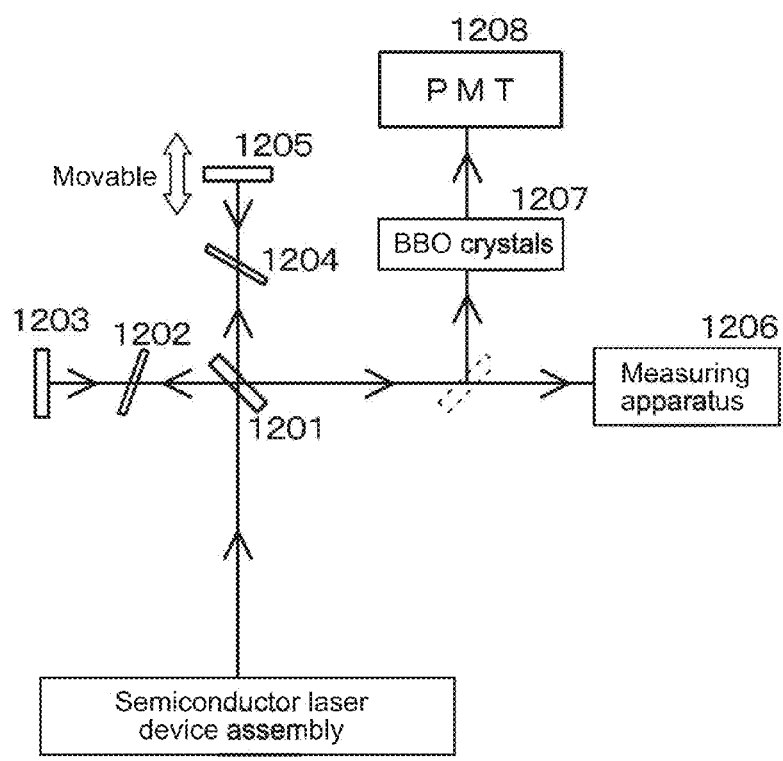
FIG. 32 is a conceptual diagram of a measuring apparatus for determining an exponentially slow decay property of the pulse laser light.

Next, the cross-correlation measurement is further applied to determine an exponentially slow decay property observed. Specifically, a relative time lag among spectrum components having different wavelengths in an output light spectrum of the semiconductor laser device assembly in the related art is determined. An end area at a short wavelength side of the laser light spectrum is extracted to provide the laser light in 200 femtoseconds. This means that all wavelength components of the laser light spectrum are not generated at the same time. FIG. 32 shows a conceptual diagram of a measuring apparatus. The laser light incident on the measuring apparatus is divided into two optical paths by a beam splitter 1201. A bandpass filter 1202 disposed at one arm has a fixed laser light incident angle and a constant transmitting wavelength. The laser light passed through the bandpass filter 1202 is reflected by the reflecting mirror 1203, and passes through the bandpass filter 1202 and the beam splitter 1201. A bandpass filter 1204 disposed at the other arm has a variable laser light incident angle and a changes the transmitting wavelength. The laser light passed through the bandpass filter 1204 is reflected by a reflecting mirror 1205, passes through the bandpass filter 1204 and is changed the direction by the beam splitter 1201. The laser light passes the measuring apparatus, specifically, a power meter/spectrum analyzer 1206, or passes through a BBO crystal 1207 and reaches a photo multi-tube (PMT) 1208. Here, a position of the reflecting mirror 1205 can be changed. A time (distance) to reach the measuring apparatus 1206 is changed for the laser light passed through the one arm and the laser light passed through the other arm. When data shown in FIG. 31 is provided, the bandpass filter may be inserted into one arm of the measuring apparatus shown in FIG. 32.

Figure 33:
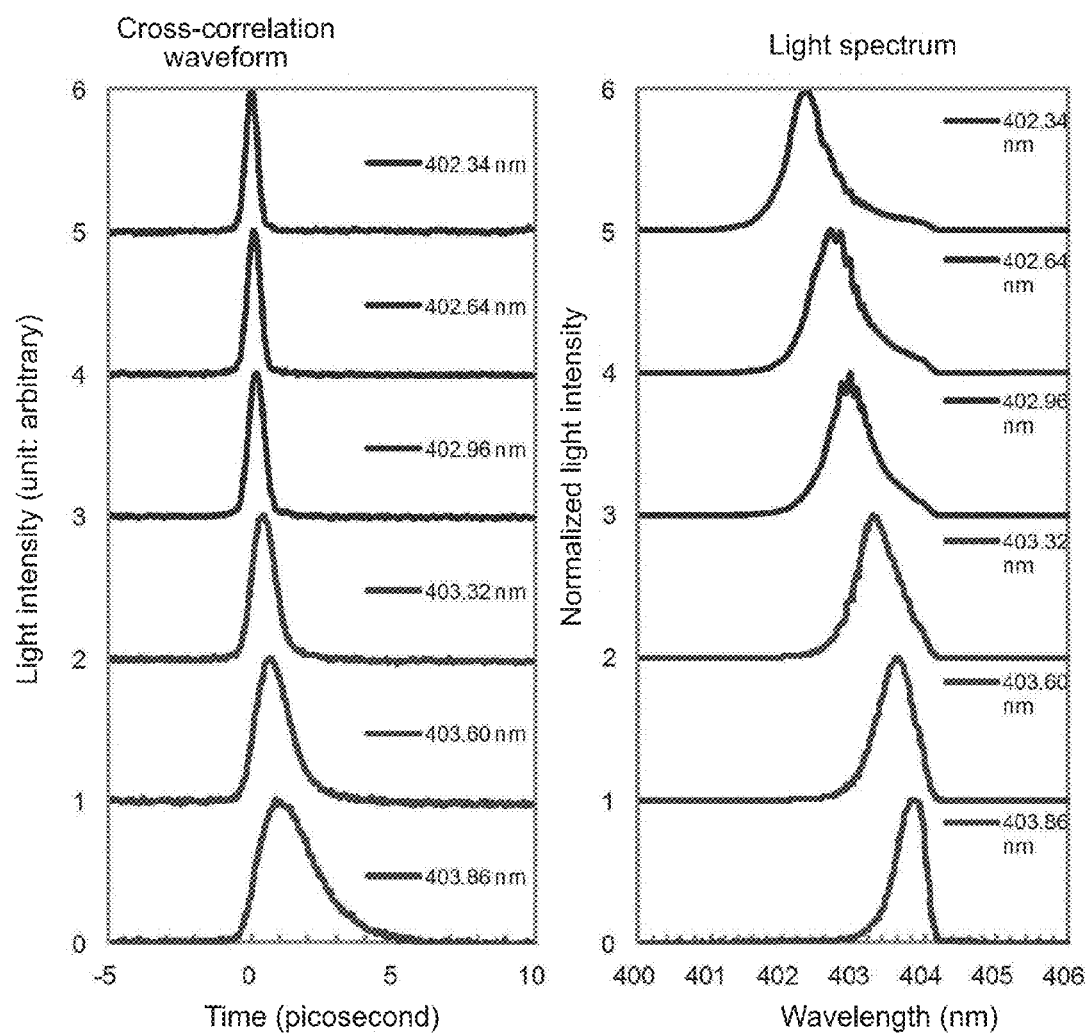
FIG. 33 are graphs showing cross-correlation waveforms and light spectra provided using the measuring apparatus shown in FIG. 32.
Figure 34A:
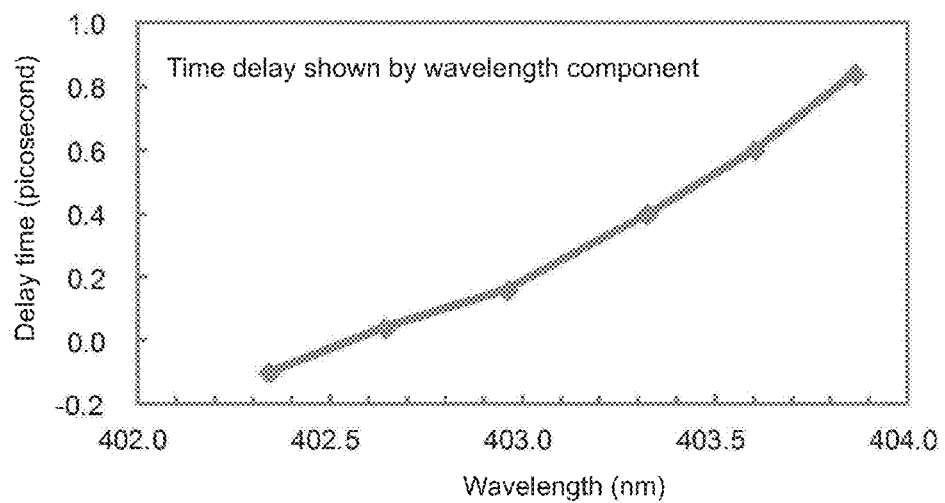
FIG. 34A is a graph showing a relationship between a wavelength spectrum component shown in FIG. 33 and a delay time.
Figure 34B:
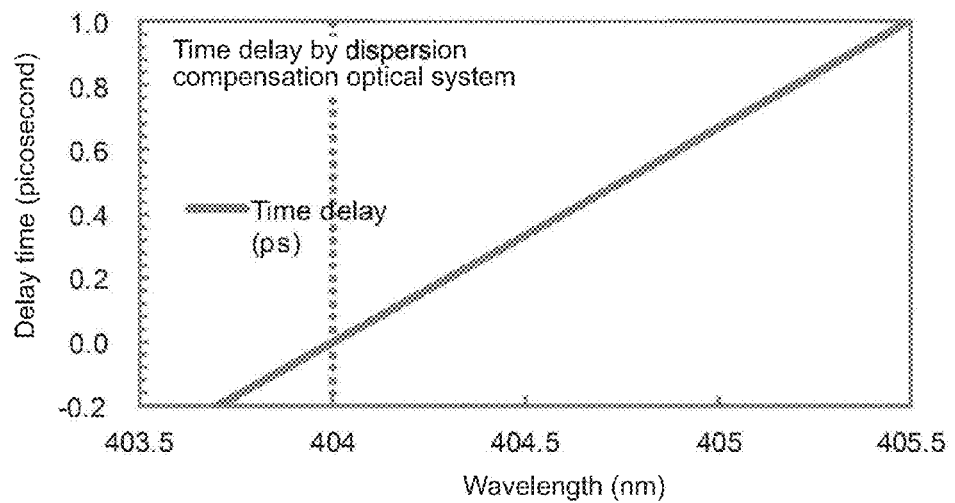
FIG. 34B is a graph showing a calculated result of a relationship between the wavelength spectrum component generated by passing through the dispersion compensation optical system of the semiconductor laser device assembly in the related art and the delay time.

FIG. 33 show cross-correlation waveforms and light spectra by the cross-correlation measurement. It shows that, as compared to a fixed wavelength spectrum component, a longer wavelength spectrum component is delayed. Also, it shows that the longer the wavelength is, the longer the delay is. FIG. 34A is a graph showing a relationship between the wavelength spectrum component shown in FIG. 33 and the delay time. FIG. 34B shows a calculated result of a relationship between the wavelength spectrum component generated by passing through the dispersion compensation optical system 1110 and the delay time. In each of FIGS. 34A and 34B, a horizontal axis represents a wavelength (unit: nm) and a vertical axis represents a delay time (unit: picosecond). The horizontal axis in FIG. 34A is a light spectrum wavelength value shown in FIG. 33. The vertical axis in FIG. 34A is the delay time between peaks in the cross-correlation waveforms. The results shown in FIGS. 34A and 34B are roughly corresponded. This shows that an exponentially slow decay component is substantially determined by the group velocity dispersion in the external resonator.

Figure 35:
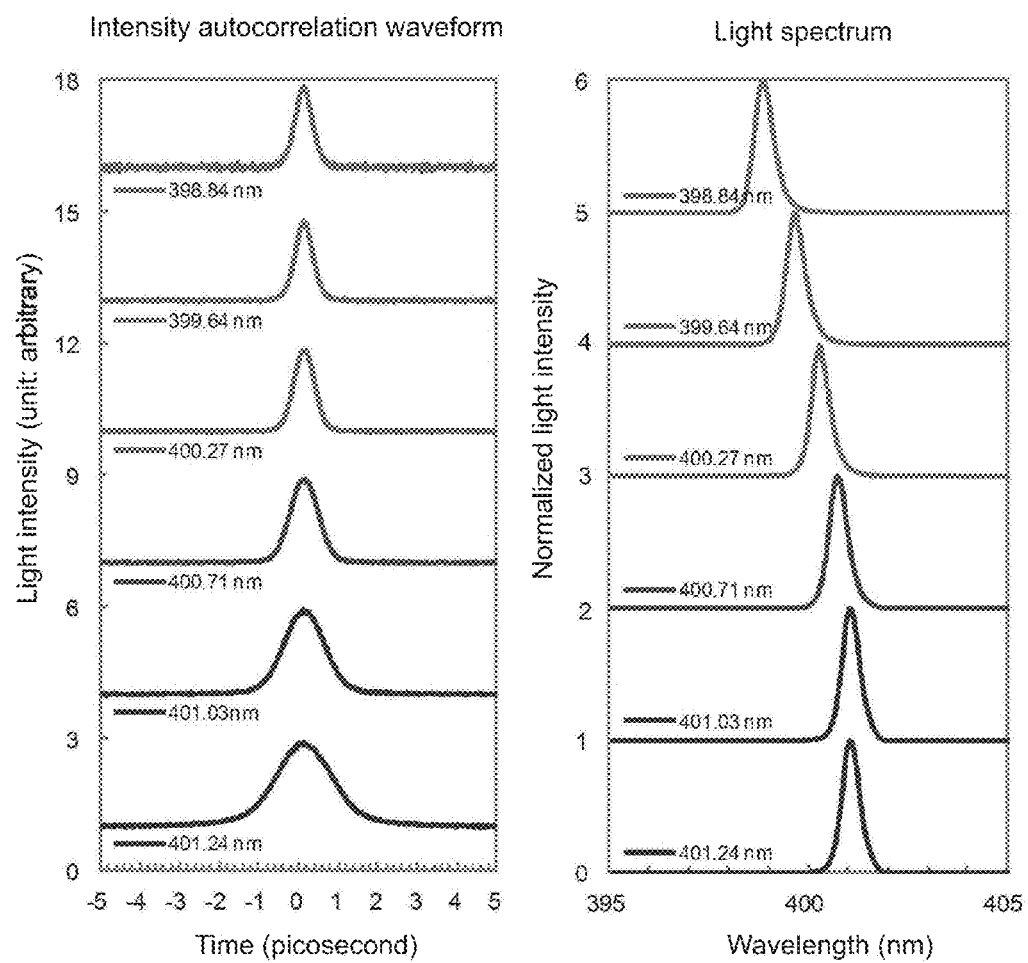
FIG. 35 are graphs showing the intensity autocorrelation waveforms and the light spectra of the pulse laser light after the pulse laser light outputted from the semiconductor laser device assembly in the related art is spectrum filtered at a constant spectrum width.
Figure 36:
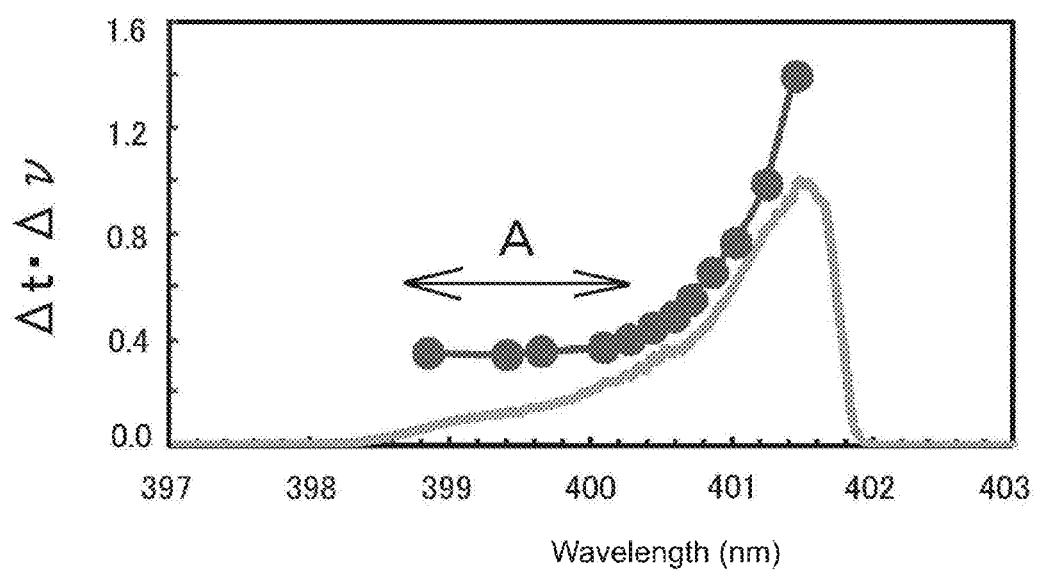
FIG. 36 is a graph showing the property of the pulse laser light shown in FIG. 35 as a time-bandwidth product.

According to the cross-correlation waveforms shown in FIG. 33, as the wavelength is longer, the pulse time width of the spectrum components extracted is longer. In order to demonstrate this, output light spectra in a variety of wavelengths were extracted from the semiconductor laser device assembly in the related art using the bandpass filter to measure the shapes of the laser light extracted. FIG. 35 show the intensity autocorrelation waveforms and the light spectra of the spectrum components extracted in different waveforms. It shows that as the wavelength is longer, the pulse time width is wider. FIG. 36 shows the property of the pulse laser light shown in FIG. 35 as a time-bandwidth product. In FIG. 36, a horizontal axis represents a wavelength (unit: nm) and a vertical axis represent ($\Delta v \cdot \Delta t$) where $\Delta t$ is a time difference and $\Delta v$ is a frequency converted from a spectrum width. Although $\Delta v$ has an almost constant value, $\Delta t$ is increased as the wavelength is longer. Accordingly, a value of ($\Delta v \cdot \Delta t$) is increased as the wavelength is longer. FIG. 36 shows that although the laser light extracted is substantially in a Fourier transform limit in the end area at the short wavelength side of the output light spectra, as the wavelength is longer, a phase rotation occurs and a chirp increases steeply.

FIGS. 34 and 36 show that the laser light outputted from the semiconductor laser device assembly in the related art in the end are at the short wavelength side includes a pulse component approaching the Fourier transform limit due to the soliton mode synchronous, but includes a pulse component that is delayed in a long wavelength side where a chirp increases. In particular, in the soliton mode synchronous, a self phase modulation (SPM) generated within the synchronous semiconductor laser device should be balanced with the negative group velocity dispersion in the dispersion compensation optical system. The results shown in FIGS. 34 and 36 reveal that the self phase modulation for the soliton mode synchronous is not balanced with the negative group velocity dispersion at the long wavelength side of the output light spectra. Since a response time of the self phase modulation accompanied by carrier saturation may impact, the self phase modulation is not balanced with the negative group velocity dispersion as oscillation spectra shift to the long wavelength wide.

The impact of a time response of a non-linear refractive index providing the self phase modulation can be explained based on the following illustrated calculation. The illustrated calculation is only for understanding and controlling a pulse generation mechanism, and values used for the calculation are not directly related to experimental conditions. In the dispersion compensation GaInN semiconductor laser device assembly in the related art, a pulse having the duration of femtoseconds may be generated by the soliton mode synchronous when the group velocity dispersion value (GVD) in the external resonator is negative. The soliton mode synchronous is characterized in that a frequency time shift accompanied by a positive self phase modulation (SPM) is balanced with a time delay per frequency by the negative group velocity dispersion value (GVD), thereby decreasing the pulse width. In a medium where a time response of a non-linear susceptibility is instantaneous (typically a relaxation time is 10 femtoseconds or less) such as the optical fibers, the time response of the non-linear refractive index to the light pulse having the duration of about 100 femtoseconds may be substantially proportional to an incident light intensity change in time. A change in the refractive index (An) is given by the following equation (1).

$$\Delta n = n_2 |E(t)|^2 \quad (1)$$

where $n_2$ represents a non-linear refractive index and $E(t)$ represents an electric field of an incident pulse.

On the other hand, as the non-linear refractive index in a semiconductor medium is impacted by the carrier generated by the current injection, an impact by the relaxation time of the carrier should be considered. As compared to the non-linear refractive index shown by the optical fibers or the like, a delay by the relaxation time of the carrier should be considered for the refractive index change in time by an incident light pulse. When the relaxation time is considered using a linear response theory, the refractive index change in time is given by the following equation:

$$\delta n(t) = \frac{n_2}{\tau} \int_{-\infty}^{t} |E(t)|^2 e^{-(t-t')/\tau} dt' \quad (2)$$

where T represents the relation time. The impact by the relaxation time on the frequency shift by the self phase modulation (SPM) is determined by a numerical calculation.

Figure 37:
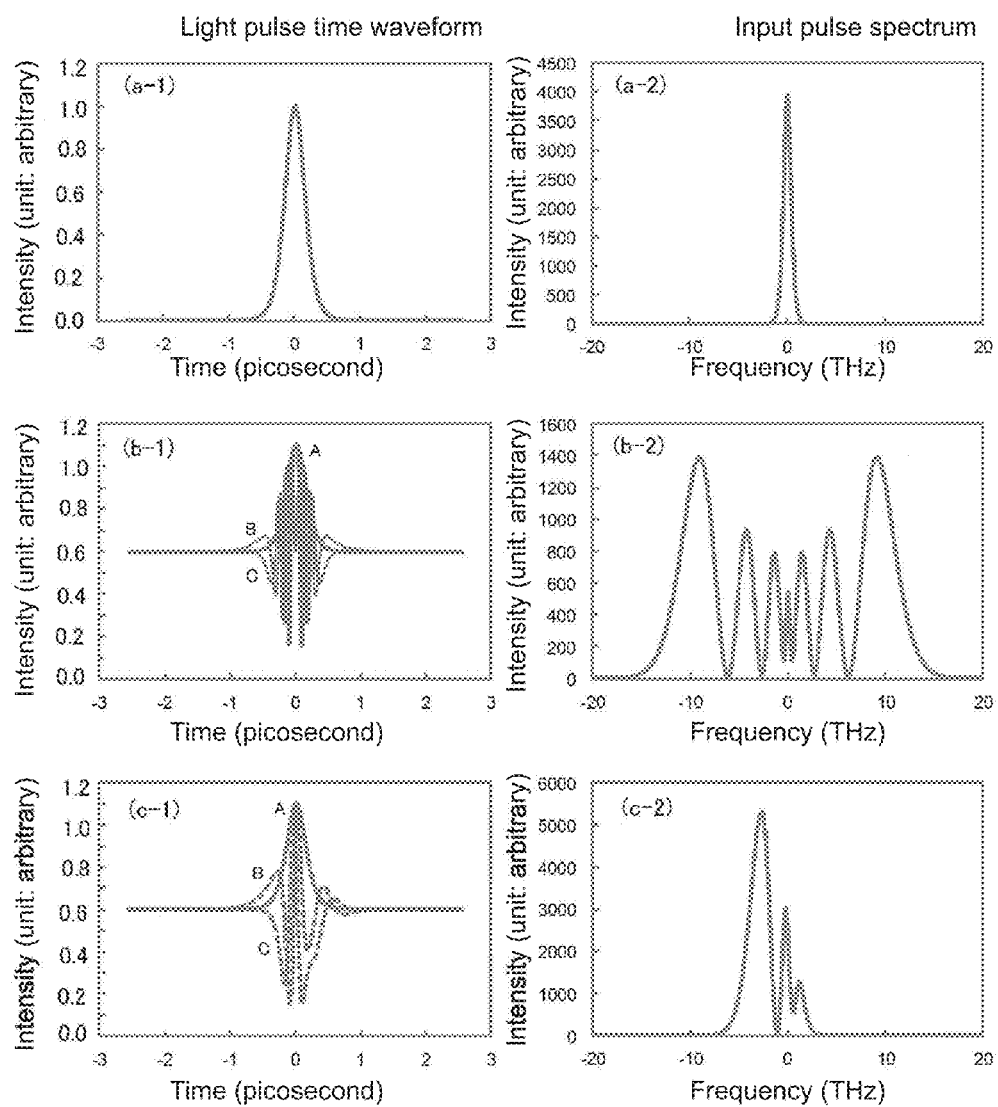
FIG. 37 are graphs showing considered results of an effect of a relaxation time on a frequency shift by a self phase modulation based on a numerical calculation.

The calculation results of the impact by the relaxation time are shown in (a-1), (a-2), (b-1), (b-2), (c-1) and (c-2) in FIG. 37. The (a-1) in FIG. 37 shows an incident pulse time width waveform. The (a-2) in FIG. 37 shows an incident pulse spectrum. The (b-1) in FIG. 37 shows a light pulse time waveform exited from a non-linear medium without considering the relaxation time where a "A" curve represents an intensity, a "B" broken line represents a real part of an electric field, and a "C" broken line represents an imaginary part of the electric field. The (b-2) in FIG. 37 shows a corresponding light spectrum. The (c-1) in FIG. 37 shows a light pulse time waveform exited from a non-linear medium with considering the relaxation time where a "A" curve represents an intensity, a "B" broken line represents a real part of an electric field, and a "C" broken line represents an imaginary part of the electric field. The (c-2) in FIG. 37 shows a corresponding light spectrum.

The pulse having the pulse width of about 20 femtoseconds is prepared as the incident pulse (see the (a-1) in FIG. 37). The corresponding spectrum is shown in the (a-2) in FIG. 37. The pulse is incident on the non-linear medium where the relaxation time of the non-linear refractive index is negligible (see the equation (1)). The pulse is incident on the non-linear medium where the relaxation time of the non-linear refractive index should be considered (see the equation (2)). Resultant light pulse properties are calculated. The (b-1) shown in FIG. 37 is the light pulse property when the relaxation time is negligible. It shows that the real part and the imaginary part of the electric field oscillate violently with time and the effect of the SPM appears. As the self phase modulation affects only on a pulse phase, no intensity waveform is changed. The self phase modulation affects on the spectrum and the spectrum is remarkably spread, as shown in the (b-2) in FIG. 37. The spectrum spread is apparently symmetrical centering around the incident light pulse spectrum.

In contrast, the (c-1) and the (c-2) in FIG. 37 show the light pulse time waveform and the spectra with considering the relaxation time. As a maximum value of a change in the non-linear refractive index is lowered by the effect of the relaxation time, the real part and the imaginary part of the electric field less oscillate as compared to the (b-1) in FIG. 37. As described above, a light pulse intensity corresponding to square of an absolute value thereof remain unchanged from the incident light pulse. On the other hand, the spectrum spread shown in the (c-2) in FIG. 37 is asymmetrical dissimilar to the (b-2) shown in FIG. 37. In particular, the spectrum component appears strongly at the long wavelength side (at a side of a frequency shift amount is negative), which reflects a time response delay of the non-linear refractive index by the relaxation.

Figure 38:
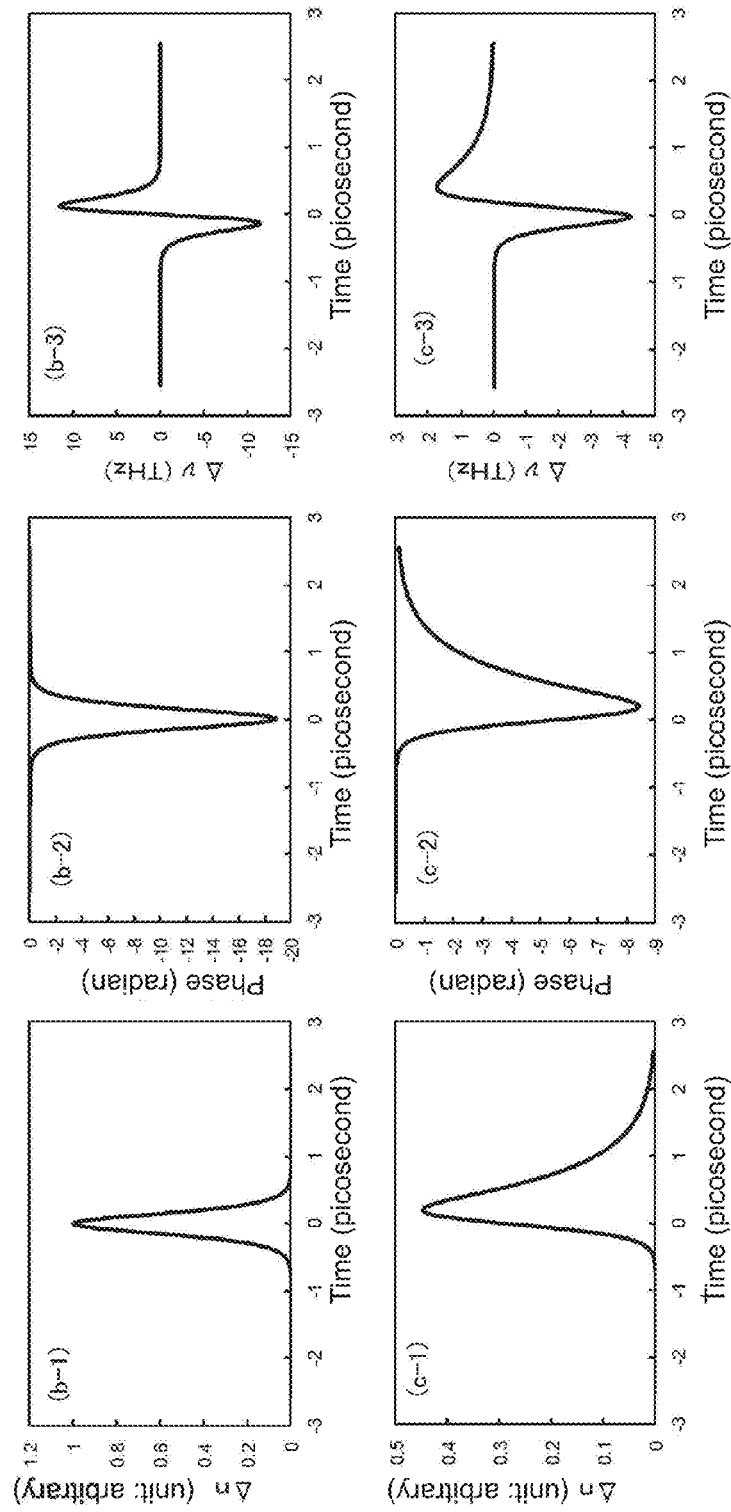
FIG. 38 are graphs showing a refractive index change in time, an intra-pulse phase change in time, and a frequency shift change in time in relation to (b) and (c) in FIG. 37, respectively.

The change in the spectrum with or without considering the relaxation time appears as a result from the refractive index change in time. By comparing a difference of the refractive index change in time in the both cases, the effect of the SPM in the soliton mode synchronous can be examined. FIG. 38 show the refractive index change in time, an intra-pulse phase change in time, and a frequency shift change in time in relation to (b) and (c) in FIG. 37, respectively. (b-1) in FIG. 38 shows the refractive index change in time without considering the relaxation time. (b-2) in FIG. 38 shows the frequency shift change in time. (c-2) in FIG. 38 shows the refractive index change in time with considering the relaxation time. (c-2) in FIG. 38 shows a phase change in time. (c-3) in FIG. 38 shows the frequency shift change in time. As the relaxation time is not considered in the (b-1) in FIG. 38, the refractive index change in time is similar to the incident light intensity change in time. The phase change in the (b-2) in FIG. 38 is similar thereto, although a sign is inverted. As a result, the frequency shift change in time provided as a temporal differentiation of the phase is also increased and decreased symmetrically centering the time zero (see the (b-3) in FIG. 38). In contrast, when the relaxation time is considered, the refractive index change in time appears delay in the refractive index change at an initial rise as shown in the (c-1) in FIG. 38 and is not similar to the incident pulse shape. The phase change in time is also time asymmetrical (see the (c-2) in FIG. 38). As a result, the frequency shift change in time largely shifts to a negative side, but less shifts to a positive side (see the (c-3) in FIG. 38). A difference of the frequency shift change in time reflects asymmetricity of the spectrum shown in FIG. 37.

Figure 39:
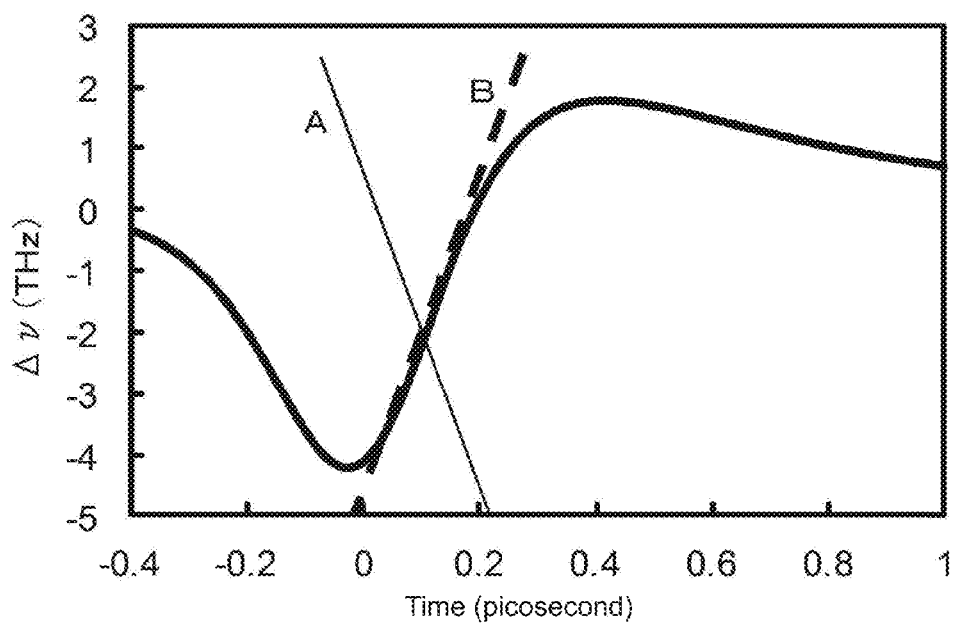
FIG. 39 is an enlarged diagram of the frequency shift change in time shown in the (c-3) in FIG. 38.

In a pulse propagation by a soliton effect, it is essential that a temporal shift of the frequency from negative to positive by the SPM is compensated by the negative group velocity dispersion to keep a temporal pulse shape. When the relaxation time is not considered, by providing the GVD having a slope (a negative GVD where a high frequency component temporally precedes and a low frequency component delays) around the time zero of the (b-3) shown in FIG. 38, the soliton effect can be greatest developed. In contrast, when the relaxation time is considered, the frequency shift change in time is not symmetrical. Accordingly, when the time delay by the GVD is linear, a curvature change is increased as the frequency shift is changed to the positive side. In the linear GVD, compensation of the time delay may be deviated (see FIG. 39). FIG. 39 is an enlarged diagram of the time delay by the negative GVD necessary for the compensation shown in the (c-3) in FIG. 38. A solid line "A" represents the time delay by the negative GVD necessary for the compensation. A wavy line "B" represents an inverted sign of the negative GVD to demonstrate the deviation from the time delay by the GVD in a time domain where the frequency shift is positive. In the compensation using a spatial phase modulator composed of LCOS, time delay is adapted to the curvature of the frequency shift, it is possible to widen a frequency range where the dispersion compensation is available. From such a consideration, the possibility that a shortest pulse width provided by the semiconductor laser device assembly in the related art is limited by a linearity of a dispersion compensation amount in the external resonator cannot be denied. In view of the above-describe discussion, by controlling the frequency dependency of the GVD utilizing the spatial phase modulator, the compensation is possible corresponding to the curvature change of the frequency shift change in time by the SPM. As a result, the shortest pulse width of the pulse generated can be widen.

The relaxation time of interest may be induced by a dispersion between carriers or a thermal redistribution within a band; or the relation time may be effectively described by the refractive index change by a gain saturation. It is unexplained that any of them is dominant. However, it may be thought that by taking into account a finite time response of the non-linear refractive index phenomenologically, the light pulse generated can be highly controlled. All calculation results about the self phase modulation shown in FIGS. 37, 38 and 39 are illustrative.

In view of the above, there may be two methods to control the pulse time width of the laser light generated in the semiconductor laser device assembly in the related art. The first method is to control the group delay time at the short wavelength side of the spectrum component such that the asymmetricity of the frequency shift generated by the response time of the non-linear refractive index is compensated, as described above. It corresponds to compensate in detail the group velocity dispersion at the initial rise of the light pulse having the shape shown in FIG. 31. The second method is to control the exponentially slow decay component of the light pulse shown in FIG. 31. It can be considered that the exponentially slow decay component can be moved to a leading edge in terms of time by controlling the group delay of the spectrum component at the long wavelength side. However, in the semiconductor laser device assembly in the related art, the group delay time (the group velocity dispersion) is geometrically determined by the distance between the diffraction grating 1111 and the light collector 1112 in the dispersion compensation optical system. Therefore, it is difficult to control the group delay time (the group velocity dispersion) per wavelength.

In Embodiments described below, by disposing the spatial phase modulator within the dispersion compensation optical system in the semiconductor laser device assembly in the related art, it is possible to control and adjust the group velocity dispersion per wavelength to generate an ultrashort light pulse of 100 femtoseconds or less can be generated that is not achieved by the semiconductor laser device assembly in the related art.

Embodiment 1

Figure 2:
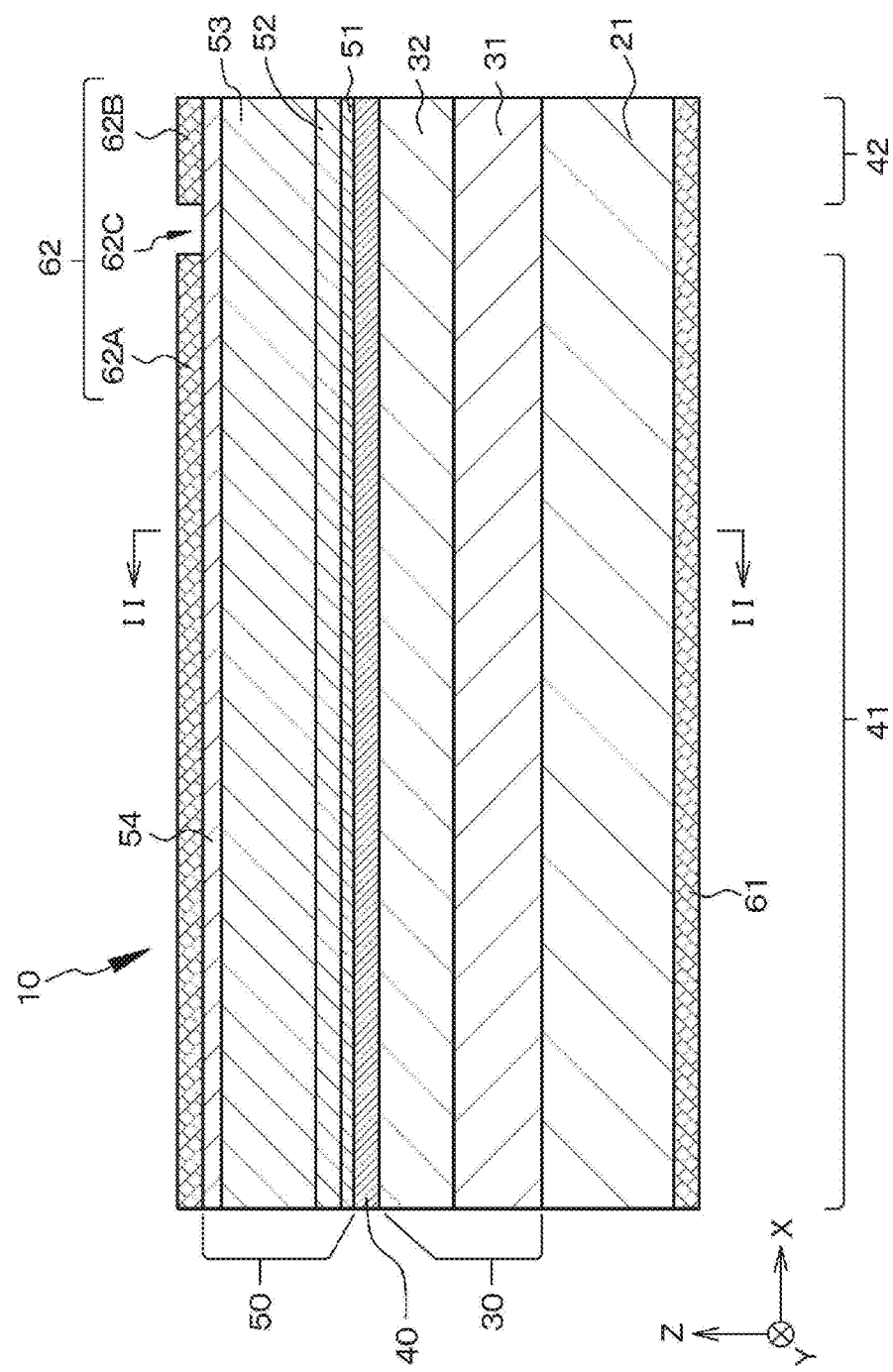
FIG. 2 is a schematic end diagram along an extending direction of a resonator of a mode synchronous semiconductor laser device in Embodiment 1.
Figure 3:
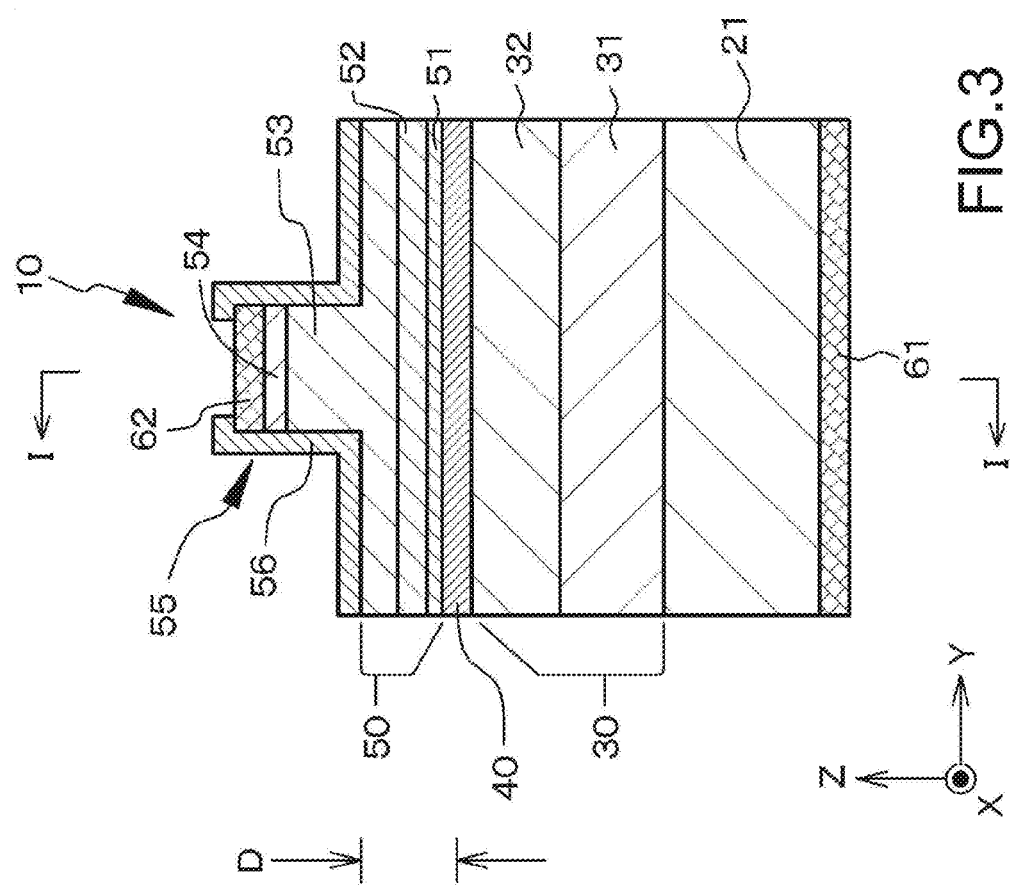
FIG. 3 is a schematic cross-sectional diagram along an extending direction and at right angle of a resonator of a mode synchronous semiconductor laser device in Embodiment 1.

Embodiment 1 relates to the semiconductor laser device assembly according to embodiment of present disclosure. FIG. 1 is a conceptual diagram of the semiconductor laser device assembly in Embodiment 1. FIG. 2 shows a schematic end diagram along an extending direction of the resonator of the mode synchronous semiconductor laser device 10 (in other words, along an arrow I-I in FIG. 3). FIG. 3 shows a schematic cross-sectional diagram along an extending direction and at right angle of the resonator of the mode synchronous semiconductor laser device.

The semiconductor laser device assembly according to Embodiment 1 or Embodiments 2 to 14 as described later is composed of:

the semiconductor laser device (specifically, the mode synchronous semiconductor laser device) 10, and a dispersion compensation optical system 110 where a laser light exited from the semiconductor laser device 10 is incident and exits, the dispersion compensation optical system 110 controls the group velocity dispersion value of the laser light exited from the semiconductor laser device 10 per wavelength.

The mode synchronous semiconductor laser device 10 according to Embodiment 1 or Embodiments 2 to 14 as described later is composed of a laminated structure where a first compound semiconductor layer 30 having a first conductive type (an n type conductive type in Embodiments) including a GaN based compound semiconductor, a third compound semiconductor layer (an active layer) 40 including a GaN based compound semiconductor, and a second compound semiconductor layer 50 having a second conductive type being different from the first conductive type (a p type conductive type in Embodiments) including a GaN based compound semiconductor are laminated in this order. The first compound semiconductor layer 30 is formed on the base (specifically, a substrate 21).

The mode synchronous semiconductor laser device 10 according to Embodiment 1 or Embodiments 2 to 14 as described later has the saturable absorption area. Specifically, the mode synchronous semiconductor laser device 10 includes the bi section type mode synchronous semiconductor laser device with a light emitting wavelength of 405 nm where the light emitting area and the saturable absorption area are juxtaposed in the resonator direction. More specifically, the bi section type mode synchronous semiconductor laser device 10 according to Embodiment 1 or Embodiments 2 to 14 as described later is the mode synchronous semiconductor laser device having the first configuration or the second configuration and includes:

(a) a laminated structure where the first compound semiconductor layer 30 having the first conductive type (the n type conductive type in Embodiments) including a GaN based compound semiconductor, the third compound semiconductor layer (the active layer) 40 including the GaN based compound semiconductor configuring a light emitting area (a gain area) 41 and a saturable absorption area 42, and the second compound semiconductor layer 50 having the second conductive type (the p type conductive type in Embodiments) being different from the first conductive type including the GaN based compound semiconductor are laminated in this order,
(b) a belt like second electrode 62 formed on the second compound semiconductor layer 50, and
(c) a first electrode 61 electrically connected to the first compound semiconductor layer 30, as shown in FIGS. 2 and 3.

The second electrode 62 has a first part 62A and a second part 62B separated by a separation groove 62C, the first part 62A for providing a forward bias state by directly flowing a current to the first electrode 61 via the light emitting area (the gain area) 41, and the second part 62B for applying the reverse bias pressure Vsa to the saturable absorption area 42. Here, the electrical resistivity (may be referred to as "separation resistivity") between the first part 62A and the second part 62B of the second electrode 62 is set to 1×10 times or more, specifically 1.5×10$^3$ times of the electrical resistivity between the second electrode 62 and the first electrode 61. The electrical resistivity (the separation resistivity) between the first part 62A and the second part 62B of the second electrode 62 is 1×10$^2$Ω or more, specifically 1.5×10$^4$Ω. The resonator length of the mode synchronous semiconductor laser device 10 is 600 μm, and lengths of the first part 62A and the second part 62B of the second electrode 62 and the separation groove 62C are 560 μm, 30 μm and 10 μm, respectively. A width of a ridge stripe structure 55 is 1.4 μm. The ridge stripe structure 55 is curved to the light exit end face (the second end face) in order to decrease end face reflection.

In Embodiment 1, the laser light emitted from the mode synchronous semiconductor laser device 10 is incident on the dispersion compensation optical system 110. A part of the laser light incident on the dispersion compensation optical system 110 is emitted from the dispersion compensation optical system 110 and returns to the mode synchronous semiconductor laser device 10. The rest of the laser light incident on the dispersion compensation optical system 110 is outputted to the outside of the system via a light isolator, or a light spectrum shaper and the light isolator (these are not shown). The light isolator is disposed to prevent the returned light from the outside of the system from directing to the mode synchronous semiconductor laser device 10. Specifically, the dispersion compensation optical system 110 includes a holographic diffraction grating 111, a light collector (specifically, lens) 112 and a spatial phase modulator 113. In Embodiment 1, the spatial phase modulator (the phase compensation optical apparatus) 113 is composed of a reflective liquid crystal display apparatus. An external resonator structure is composed of the dispersion compensation optical system 110. Specifically, the external resonator is composed of the spatial phase modulator 113 and the first end face of the mode synchronous semiconductor laser device 10. By the diffraction grating 111, the 1$^{th}$ or more diffraction light among the laser light emitted from the mode synchronous semiconductor laser device 10 is incident on the light collector 112, and the 0$^{th}$ diffraction light (the reflected light) is outputted to outside of the system. Between the mode synchronous semiconductor laser device 10 and the diffraction grating 111, an aspheric convex lens having a focal length of 4.0 m is disposed as a collimator 11 to change the laser light from the mode synchronous semiconductor laser device 10 to a parallel light flux. A grating pattern number in the diffraction grating 111 included in the laser light incident (collided) on the diffraction grating 111 is 2400 lines/mm in Embodiment 1. The laser light emitted from the mode synchronous semiconductor laser device 10 collides with the diffraction grating 111, a diffraction light (1$^{th}$ or more diffraction light) from the diffraction grating is incident on the spatial phase modulator 113 via the light collector, is then emitted from the spatial phase modulator 113 and is returned to the semiconductor laser device 10 via the light collector 112 and the diffraction grating 111. On the other hand, the 0$^{th}$ diffraction light (the reflected light) is outputted to outside of the system.

In Embodiment 1, a distance between the light collector 112 and the spatial phase modulator 113 is 100 mm. The focal length f of the light collector (the lens) 112 having a convex surface is 100 mm. In other words, the distance between the light collector 112 and the spatial phase modulator 113 and the focal length f of the light collector (the lens) 112 having the convex surface coincide. A laser light image is formed on the spatial phase modulator 113 by the light collector 112. The light incident on the light collector 112 and the light exited from the light collector 112 have a relationship of an incident light and an exit light in a microscope having one power magnification. The distance therebetween is fixed.

In Embodiment 1, the spatial phase modulator 113 is composed of the reflective liquid crystal display apparatus (specifically, LCOS). By applying a voltage to a nematic liquid crystal layer oriented in parallel, the laser light is modulated in a liquid crystal layer and the phase is modulated. The diffraction light from the diffraction grating 111 is incident on the spatial phase modulator 113 via the light collector 112. The exit angle of the diffraction light from the diffraction grating is dependent on the wavelength of the laser light. Therefore, a position incident on the spatial phase modulator 113 depends on the wavelength of the laser light. Accordingly, by applying an adequate voltage to each area (pixel) of the spatial phase modulator 113, the phase in each area (pixel) can be modulated, be incident on the spatial phase modulator 113, and the phase of the laser light exited can be modulated, thereby controlling the group velocity dispersion value of the laser light.

Figure 4:
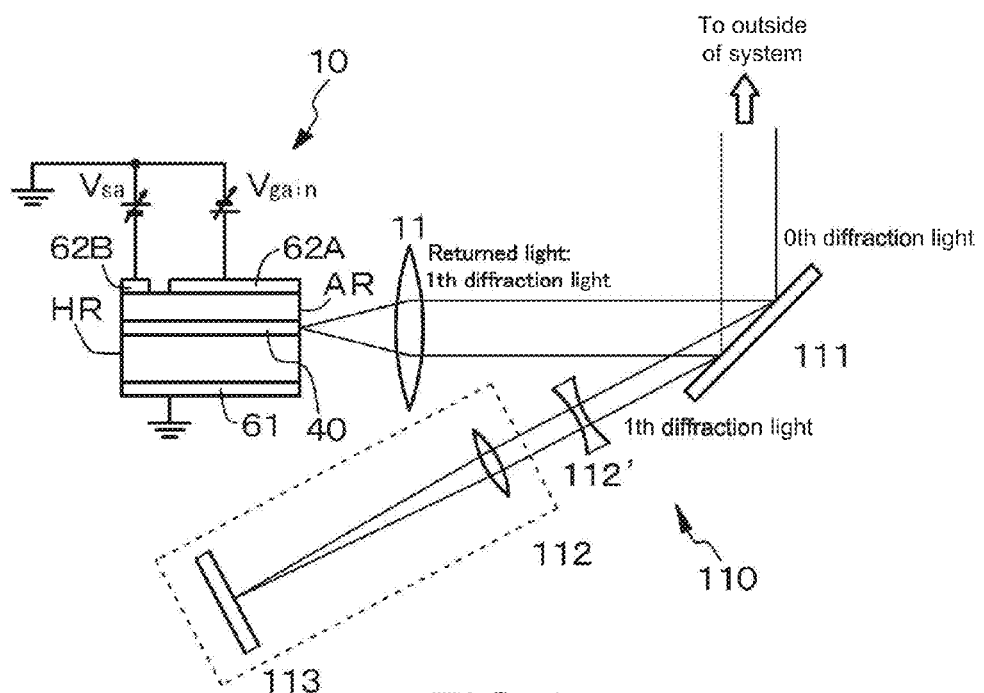
FIG. 4 is a conceptual diagram of an alternative semiconductor laser device assembly in Embodiment 1.

Data about the spatial phase modulator 113 composed of the LCOS is illustrated below:
Device size: 16 mm×12 mm
Pixel number: 800×600 pixels
Pixel size: 20×20 μm By a dispersion angle of the diffraction grating 111, a wavelength range per pixel is changed. FIG. 4 shows an illustrative dispersion compensation optical system 110 for correction. By disposing a concave lens 112' between the diffraction grating 111 and the light collector 112, a virtual image of the diffraction grating 111 is formed and angular variance can be enlarged by a desirable magnification m. The following equations hold:

$$a = f \cdot (m-1)$$

$$b = f \cdot (m-1)/m$$

$$d = f - b$$

where "a" represents a distance from the diffraction grating 111 to the concave lens 112', "d" represents a distance from the concave lens 112' to the light collector 112 (a convex lens), "b" represents a focal length of the concave lens 112', "m" represents a focal length of the light collector 112 (the convex lens), and "f" represents a distance from the light collector 112 to the spatial phase modulator 113.

Figure 41:
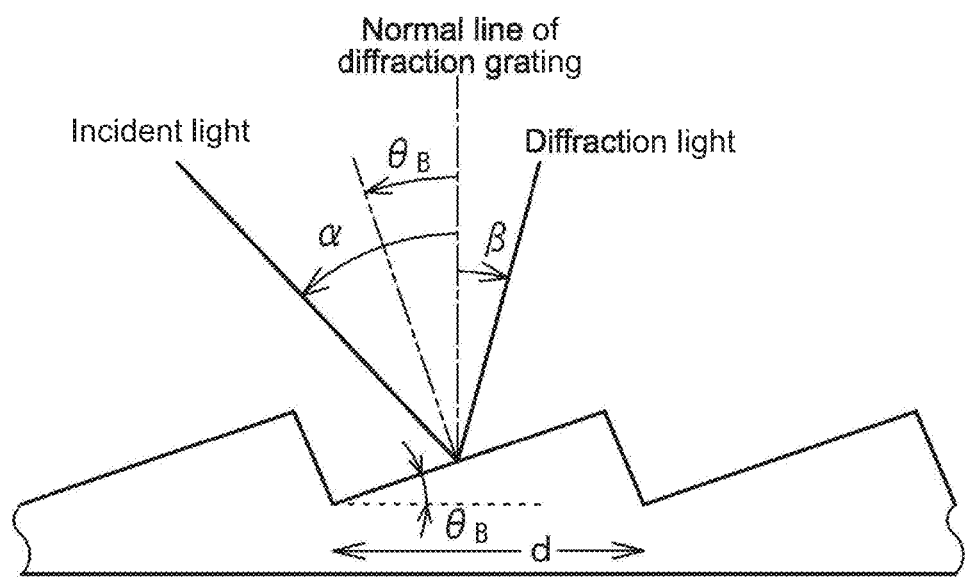
FIG. 41 is a schematic partial cross-sectional diagram of a diffraction grating.

As shown in FIG. 41, the light having the wavelength $\lambda$ is incident on a reflective diffraction grating at an angle of $\alpha$, and is diffracted at an angle of $\beta$. Here, the angles $\alpha$ and $\beta$ are from a normal line of the diffraction grating where a counterclockwise rotation is positive. Then, a grating equation is as follows:

$d_G \times \{\sin(\alpha)+\sin(\beta)\}=m\cdot\lambda$ (A) where $d_G$ represents a space between grooves of the diffraction grating, and $m$ represents a diffraction order ($m=0$, ±1,±2 . . . ).

When the incident laser light and $m^{th}$ diffraction light are in a specular reflection relationship, most energy is concentrated on the $m^{th}$ diffraction light. A slope of the groove is called as a blaze angle $\theta_B$, which is represented by $\theta_B=(\alpha+\beta)/2$. A wavelength in this case is called as a blaze wavelength $\lambda_B$, which is represented by $\lambda_B=\{2d_G/m\} \sin(\theta_B)\cdot\cos(\alpha-\theta_B)$.

Figure 5:
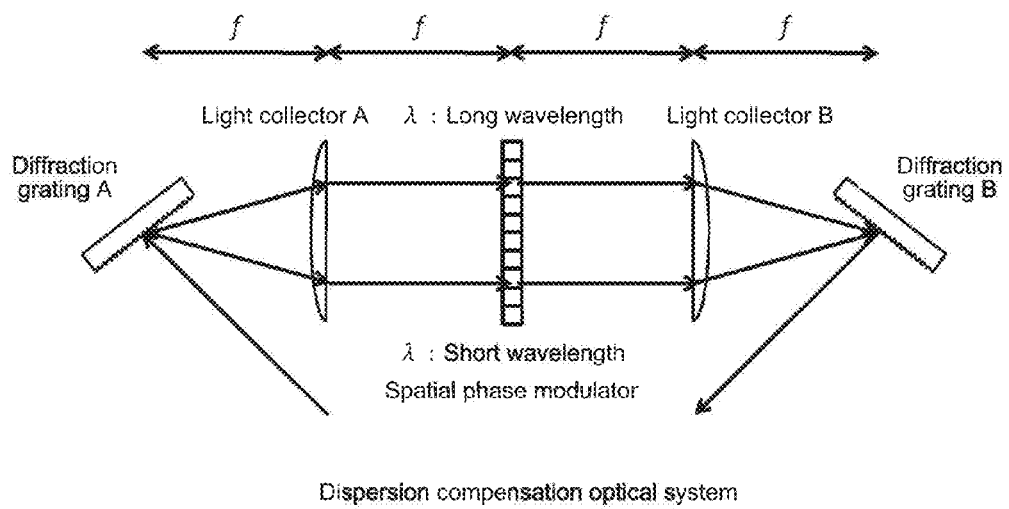
FIG. 5 is a diagram for illustrating the principle of a dispersion compensation optical system in Embodiment 1.

Referring to FIG. 5, a theorem of the dispersion compensation optical system 110 in Embodiment 1 will be explained. In the dispersion compensation optical system 110 in Embodiment 1, the laser light is folded back at the spatial phase modulator 113 composed of a reflective LCOS. FIG. 5 shows a generalization. Referring to FIG. 5, a light incident on a diffraction grating A (the diffraction grating 111) is spatially distributed as shown at a left side, is converted into a parallel light by a light collector A (the light collector 112), passes through the spatial phase modulator 113 composed of a transmissive LCOS, and is collected again by a light collector B (the light collector 112) to a diffraction grating B (the diffraction grating 111) as shown at a right side. In FIG. 5, a wavelength distribution of the incident light is spatially distributed by the diffraction grating A, and a phase of the light distributed is changed by the spatial phase modulator 113 when the light distributed transmits the spatial phase modulator 113. By controlling a phase change amount per area (per pixel) of the spatial phase modulator 113, the phase of the laser light transmitting the dispersion compensation optical system can be changed per wavelength. Each distance among the diffraction grating A, the light collector A, the spatial phase modulator, the light collector B and the diffraction grating B is equal to the focal length f between the light collector A and the light collector B. According to the configuration, angular information about the laser light on the diffraction grating and positional information about the spatial phase modulator composed of the reflective LCOS have a Fourier transform relationship.

Next, a method of modulating the phase per wavelength in the dispersion compensation optical system and providing a desirable wavelength dependency of the group velocity dispersion will be described. By analyzing the properties of the laser light provided by the semiconductor laser device assembly in the related art, a femtosecond laser light is provided in a short wavelength component in the output light spectrum. As to the short wavelength component, when the group velocity dispersion is compensated by taking the impact of the relaxation time of the non-linear refractive index into account, the pulse width of the femtosecond pulse component at the leading edge of the pulse can be narrower, as described above. As to a spectrum component having a wavelength longer than the short wavelength component, when the group delay time is controlled, it can be moved to the leading edge, whereby light pulse energy outputted from a mode synchronous semiconductor laser device assembly can be concentrated in a narrower time domain.

As shown in FIG. 39, in the non-linear refractive index of the semiconductor laser, the frequency shift change in time of the non-linear refractive index may be provided time asymmetrical due to the relaxation time of the carrier inherent to the semiconductor. The frequency shift changes from a low frequency component to a high frequency component in time. By the negative group velocity dispersion provided by the dispersion compensation optical system in the external resonator, a high frequency spectrum component temporally precedes to compensate a temporal change in the frequency. The group velocity dispersion provided by the semiconductor laser device assembly in the related art is roughly linear to the frequency. Consequently, the asymmetricity of the frequency shift change in time caused by the time response of the non-linear refractive index cannot be compensated adequately. Specifically, in the frequency shift from negative to positive at around a time of 0.1 picoseconds shown in FIG. 39, the frequency shift amount to time is deviated from the linear relationship shown in the broken line. It shows that to a positive frequency shift component, the greater negative group velocity dispersion is provided, and as compared to an area where the frequency shift can be approximate linearly to the time, it is further necessary to be temporally preceded. It reveals that when the group velocity dispersion is provided for a faster group velocity to a high frequency spectrum component, i.e., an end at a short wavelength side of an oscillation spectrum, a spectrum shift can be compensated by the self phase modulation in a wider frequency range.

In the semiconductor laser device assembly according to embodiment of present disclosure, the group velocity dispersion is controlled per wavelength. In the dispersion compensation optical system 110 in Embodiment 1, the laser light exited from the semiconductor laser device 10 provides a laser light having a shortest wavelength with a negative group velocity dispersion value (GVDmin<0 [picosecond, ps]$^2$), and provides a laser light having a wavelength longer than the shortest wavelength with a group velocity dispersion value greater than the group velocity dispersion value (GVDmin) for the laser light having the shortest wavelength. In Embodiment 1, the dispersion compensation optical system 110 provides the negative group velocity dispersion value to the laser light having the shortest wavelength exited from the semiconductor laser device 10. An absolute value of the negative group velocity dispersion value provided is constant not depending on the laser light wavelength as to the laser light having a wavelength shorter than the predetermined wavelength (specifically, 402 nm, for example). Also, the dispersion compensation optical system 110 provides the laser light having a longer wavelength (specifically, the laser light having a wavelength longer than the predetermined wavelength) with a constant group velocity dispersion value (GVDconst) greater than the group velocity dispersion value (GVDmin) for the laser light having the shortest wavelength not depending on the wavelength. In this case, the constant group velocity dispersion value (GVDconst) can be 0 [(picosecond)$^2$].

Figure 6A:
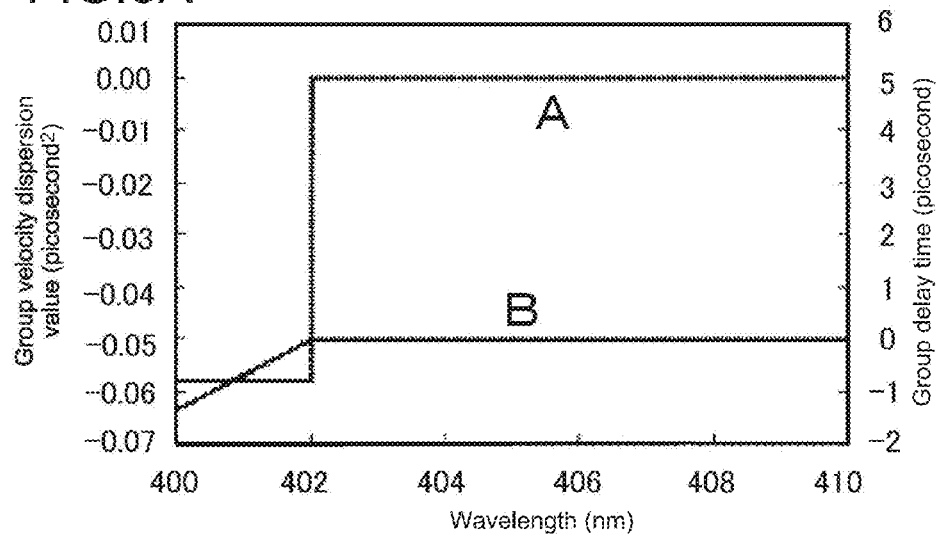
FIG. 6A is a graph showing a group velocity dispersion value set in the semiconductor laser device assembly in Embodiment 1 and a group delay time provided based on the group velocity dispersion value set.
Figure 6B:
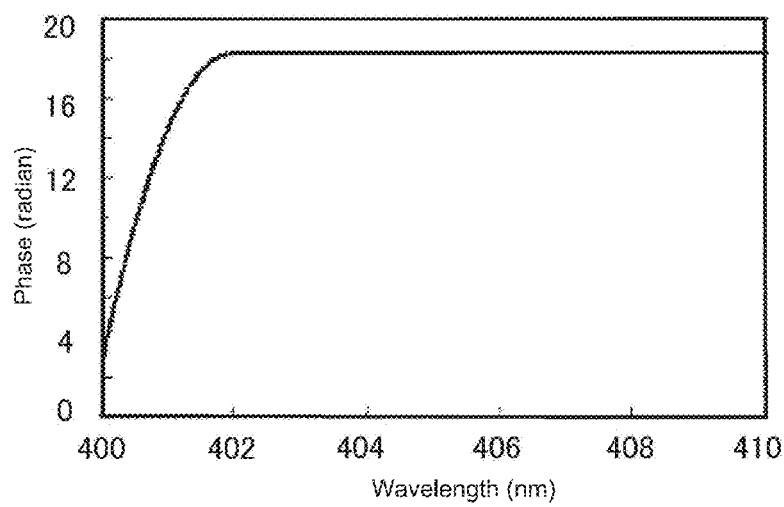
FIG. 6B is a graph showing a frequency dependency of a phase provided by integrating twice a function of the group velocity dispersion value using a wavelength shown in FIG. 6A as a variable.
Figure 7:
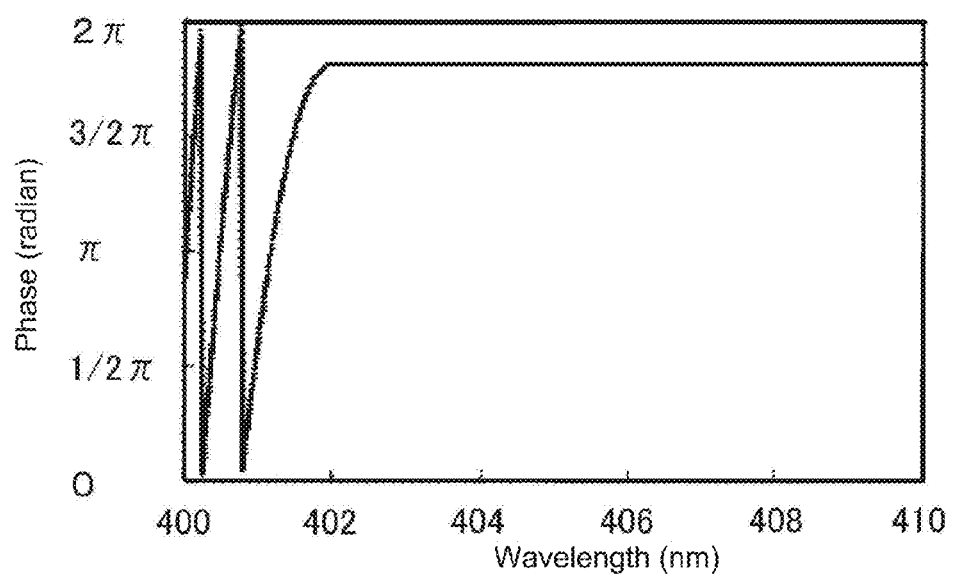
FIG. 7 is a graph provided by converting the graph showing the frequency dependency of the phase shown in FIG. 6B into a phase on a spatial phase modulator.

In other words, as shown in "A" in FIG. 6A, the negative group velocity dispersion value is set only on the wavelength range including the spectrum component at the short wavelength side having the femtosecond pulse, and the group velocity dispersion value is set to zero to the spectrum component at a longer wavelength side. In this case, the wavelength range providing the negative group velocity dispersion value is suitably selected from the wavelength range where a time-bandwidth product can be regarded as constant in FIG. 36 (the wavelength range shown by an arrow "A"). As shown in "B" in FIG. 6A, a function of the group velocity dispersion value using a wavelength as a variable is integrated once (the group delay time). FIG. 6B shows a function of the group velocity dispersion value integrated twice, and is provided by converting that shown in FIG. 6A into the frequency dependency of the phase. Furthermore, FIG. 7 is provided by converting that shown in FIG. 6B into the phase on the spatial phase modulator 113 composed of the reflective LCOS.

Each horizontal axis in FIGS. 6A, 6B, 7, 8A, 8B, 9, 10A, 10B, 11, 12A, 12B, 13, 14A, 14B and 15 represents a wavelength (unit: nm), each vertical axis in FIGS. 6A, 8A, 10A, 12A and 14A represents a group velocity dispersion value GVD (unit: $ps^2$) and a group delay time (unit: picosecond, ps), and each vertical axis in FIGS. 6B, 7, 8B, 9, 10B, 11, 12B, 13, 14B and 15 represents a phase (unit: radian). In FIGS. 7, 9, 11, 13 and 15, each horizontal axis represents the wavelength for convenient understanding. Actually, from a spatial dispersion of the diffraction grating 111 and the focal length of the light collector 112, the wavelength should be converted into a position on the spatial phase modulator. Although a boundary (the predetermined wavelength) for controlling the group velocity dispersion in Embodiments 1 to 4 is defined as 402 nm, it is only illustrative and is changed depending on the configuration of the first and second electrodes of the mode synchronous semiconductor laser and driving conditions such as the gain current and the reverse bias voltage.

The group velocity dispersion value using a wavelength as a variable is integrated once to provide the group delay time, and is integrated twice to provide the phase. An electric field of a plane wave is represented by the following equation (A-1). In a vibrational term, $k(\omega)z$ representing the dispersion can be represented by a phase $\phi(\omega)$. The phase $\phi(\omega)$ is a dimensionless number of a product of $\omega$ and t. When the phase $\phi$ is differentiated by $\omega$ once to provide a dimension of $\omega$ the time t, and is differentiated twice to provide a change in the time t per $\omega$ (the group velocity dispersion). In other words, it corresponds to a twice differential coefficient in a second order term of the equation (A-2) where $\phi$ is expanded for $\omega_0$. Thus, when $\omega$ is integrated once, the time delay is provided, and when $\omega$ is integrated twice, a necessary phase amount is provided.

$$E(z, t) = \qquad (A\text{-}1)$$
$$A(z, t) \cdot e_0 \cdot \exp i(\omega_0 t - k(\omega)z) = A(z, t) \cdot e_0 \cdot \exp i(\omega_0 t + \phi(\omega))$$

$$\phi(\omega) = \qquad (A\text{-}2)$$
$$\phi(\omega_0) + \dot\phi(\omega - \omega_0) + \frac{1}{2!}\ddot\phi(\omega_0)(\omega - \omega_0)^2 + \frac{1}{3!}\dddot\phi(\omega_0)(\omega - \omega_0)^3 + \ldots$$

Figure 14A:
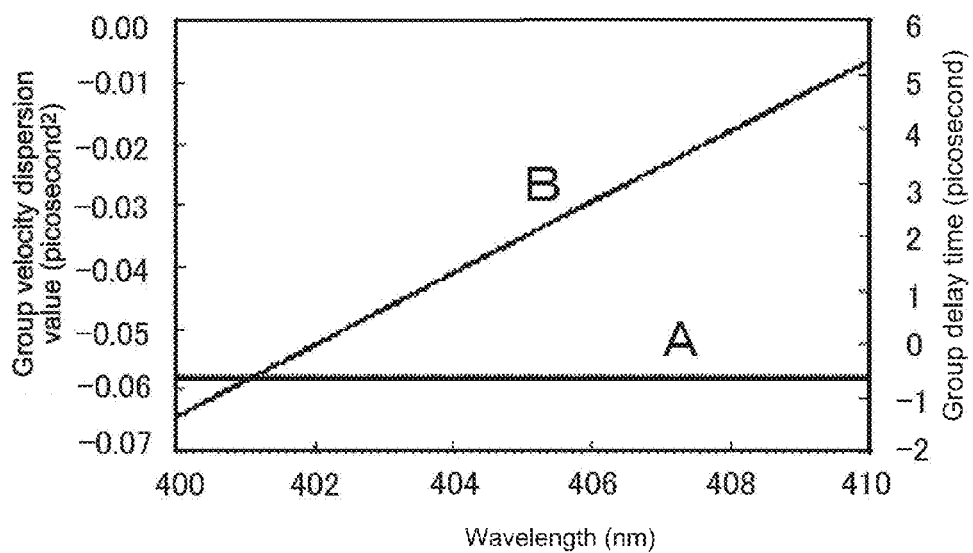
FIG. 14A is a graph showing a group velocity dispersion value set in the semiconductor laser device assembly in Comparative Embodiment 1 and a group delay time provided based on the group velocity dispersion value set.
Figure 14B:
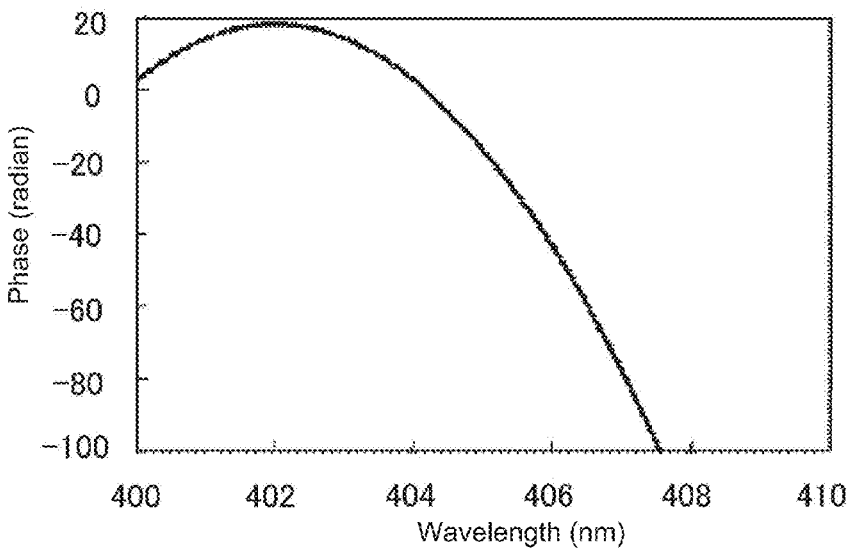
FIG. 14B is a graph showing a frequency dependency of a phase provided by integrating twice a function of the group velocity dispersion value using a wavelength shown in FIG. 14A as a variable.
Figure 15:
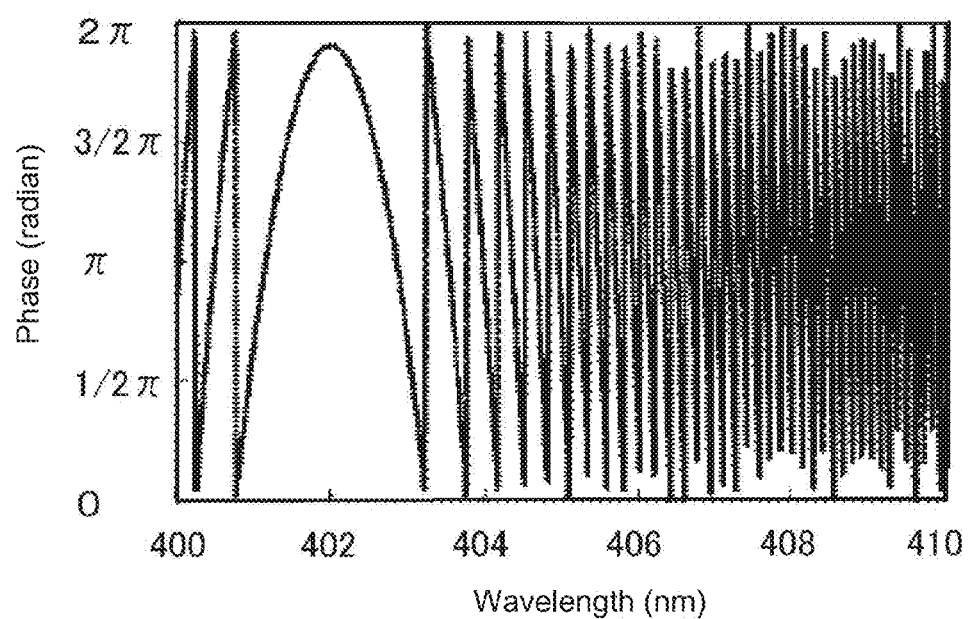
FIG. 15 is a graph provided by converting the graph showing the frequency dependency of the phase shown in FIG. 14B into a phase on a spatial phase modulator.

In Comparative Embodiment 1, the group velocity dispersion is not controlled per wavelength, and is constant to the wavelength. In other words, as shown in "A" in FIG. 14A, the group velocity dispersion value is constant to the wavelength. The function of the group velocity dispersion value using the wavelength as a variable is integrated once (the group delay time) shown in "B" in FIG. 14A. FIG. 14B shows the function of the group velocity dispersion value integrated twice, and is provided by converting that shown in FIG. 14A into the frequency dependency of the phase. Furthermore, FIG. 15 is provided by converting that shown in FIG. 14B into the phase on the spatial phase modulator composed of the reflective LCOS.

In Embodiment 1, the group velocity dispersion value is controlled per wavelength, whereby a time delay of the pulse component exponentially decayed generated temporally-delayed in the semiconductor laser device assembly in the related art can be prevented. In the semiconductor laser device assembly in Embodiment 1, as the dispersion compensation optical system controls the group velocity dispersion value of the laser light exited from the semiconductor laser device per wavelength, the light spectrum of the laser light finally exited from the semiconductor laser device assembly is shaped. The full width at half maximum can be widen. As a result, the pulse laser light having the pulse time width of 200 femtoseconds or less, for example, the pulse laser light having the pulse time width of 100 femtoseconds or less can be generated. Among the spectrum components outputted, energy contributed to the femtosecond pulse is increased. Energy efficiency is high within the pulse time width, which contributes to increased pulse peak power.

Embodiment 2

Embodiment 2 is alternative of Embodiment 1. In Embodiment 2, the dispersion compensation optical system 110 provides the negative group velocity dispersion value to the laser light having the shortest wavelength exited from the semiconductor laser device 10. An absolute value of the negative group velocity dispersion value provided is greater as the laser light wavelength is shorter, as to the laser light having a wavelength shorter than the predetermined wavelength (specifically, 402 nm, for example). Also, the dispersion compensation optical system 110 provides the laser light having a wavelength longer than the predetermined wavelength (specifically, 402 nm, for example) with a larger group velocity dispersion value greater than the group velocity dispersion value for the laser light having the predetermined wavelength.

In other words, in the dispersion compensation optical system 110 in Embodiment 2, the laser light exited from the semiconductor laser device provides the laser light having the shortest wavelength with the negative group velocity dispersion value (GVDmin<0 [picosecond, ps]$^2$), and provides the laser light having the wavelength longer than the predetermined wavelength with the group velocity dispersion value greater than the group velocity dispersion value (GVDmin) for the laser light having the shortest wavelength, similar to Embodiment 1. Specifically, the dispersion compensation optical system 110 provides the laser light having the wavelength longer than the predetermined wavelength (specifically, 402 nm, for example) with the constant group velocity dispersion value (GVDconst) greater than the group velocity dispersion value for the laser light having the predetermined wavelength not depending on the wavelength. Here, the constant group velocity dispersion value (GVDconst) is 0 [picosecond]$^2$) similar to Embodiment 1.

Figure 8A:
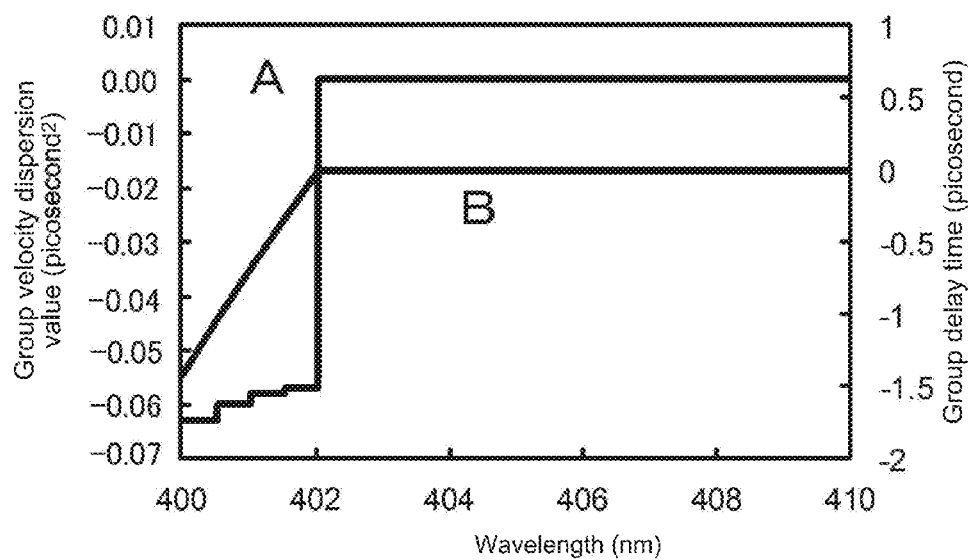
FIG. 8A is a graph showing a group velocity dispersion value set in the semiconductor laser device assembly in Embodiment 2 and a group delay time provided based on the group velocity dispersion value set.
Figure 8B:
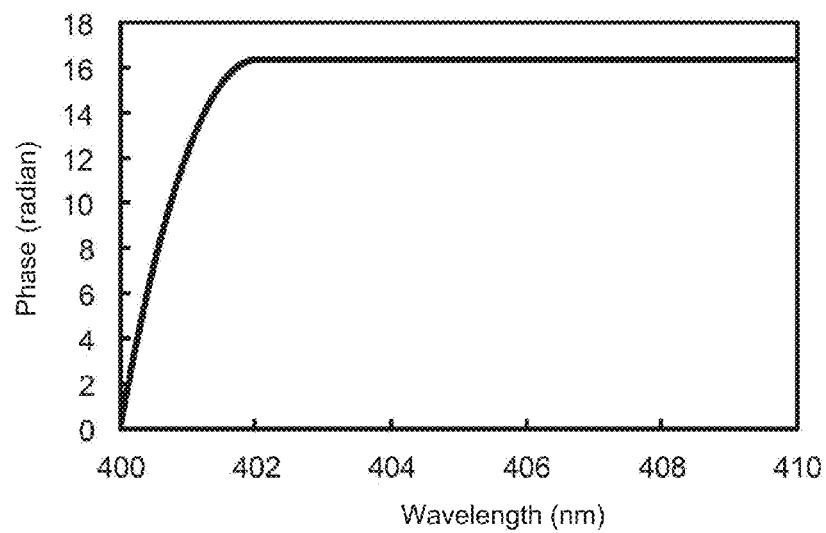
FIG. 8B is a graph showing a frequency dependency of a phase provided by integrating twice a function of the group velocity dispersion value using a wavelength shown in FIG. 8A as a variable.
Figure 9:
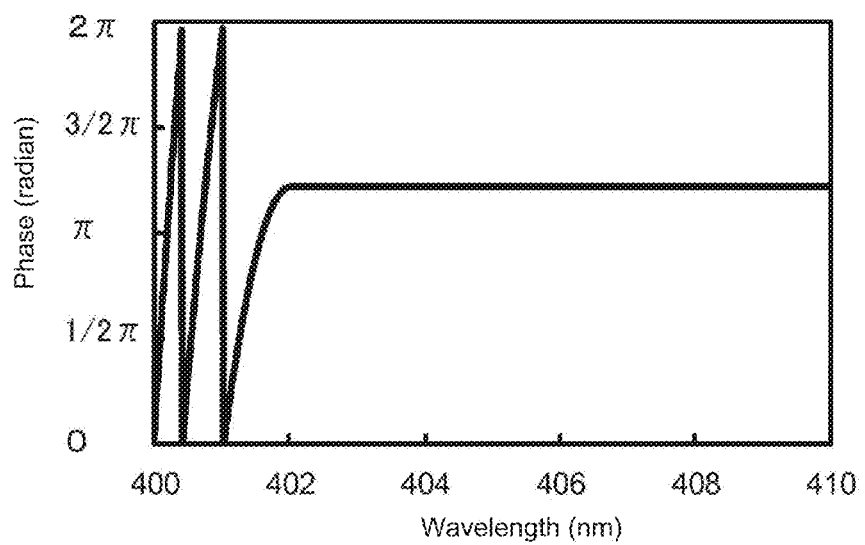
FIG. 9 is a graph provided by converting the graph showing the frequency dependency of the phase shown in FIG. 8B into a phase on a spatial phase modulator.

In other words, as shown in "A" in FIG. 8A, the negative group velocity dispersion value is set only on the wavelength range including the spectrum component at the short wavelength side having the femtosecond pulse, and the group velocity dispersion value is decreased not constant but stepwise to the shortest wavelength dissimilar to Embodiment 1 shown in FIG. 6A. Note that it is not limited thereto, and the group velocity dispersion value may be changed continuously so long as the desirable effect is provided. As shown in "B" in FIG. 8A, a function of the group velocity dispersion value using a wavelength as a variable is integrated once (the group delay time). FIG. 8B shows a function of the group velocity dispersion value integrated twice, and is provided by converting that shown in FIG. 8A into the frequency dependency of the phase. Furthermore, FIG. 9 is provided by converting that shown in FIG. 8B into the phase on the spatial phase modulator 113 composed of the reflective LCOS.

The constant group velocity dispersion value (GVDconst) can be positive similar to Embodiment 3 as described next, or the dispersion compensation optical system may provide the laser light having a wavelength longer than the predetermined wavelength with a group velocity dispersion value greater than the group velocity dispersion value for the laser light having the predetermined wavelength depending on the wavelength, similar to Embodiment 4. In this case, the longer the wavelength is, the greater the group velocity dispersion value for the laser light having a longer wavelength.

Embodiment 3

Embodiment 3 is also alternative of Embodiment 1. In Embodiment 1, the constant group velocity dispersion value (GVDconst) is 0 [(picosecond)$^2$]. On the other hand, in Embodiment 3, the constant group velocity dispersion value (GVDconst) is positive. Embodiment 3 may be suitable to narrow the pulse width.

In Embodiment 3, the constant group velocity dispersion value (GVDconst) is positive. The reason is that the carrier density is changed by a gain saturation accompanied by oscillation in the semiconductor laser device and the refractive index of the compound semiconductor layer configuring the semiconductor laser device is also varied. This is the self phase modulation (SPM) accompanied by the gain saturation, and is observed as the wavelength shift to the long wavelength side. As the wavelength shift is accompanied by the time delay, it may be insufficient that the group velocity dispersion value is zero at the long wavelength side, as in Embodiment 1. In Embodiment 3, the positive group velocity dispersion value is provided at the long wavelength side to correct the refractive index change by the self phase modulation.

Figure 10A:
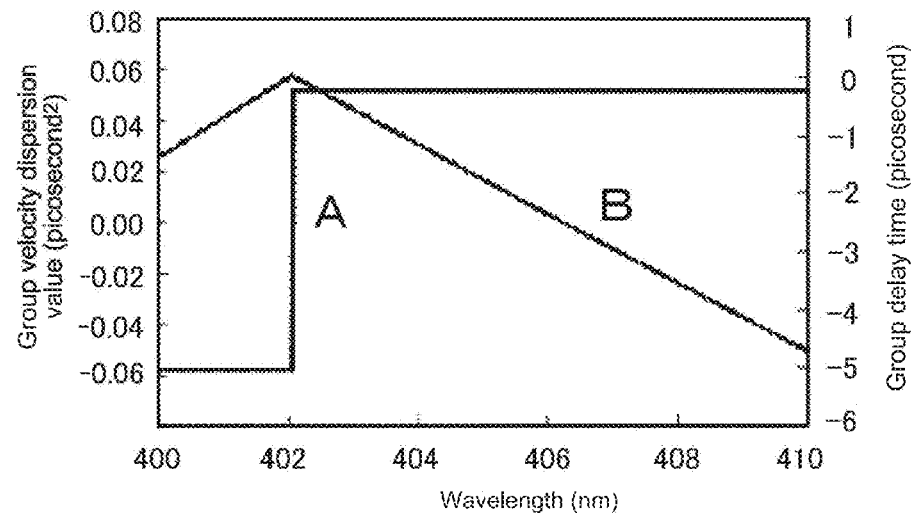
FIG. 10A is a graph showing a group velocity dispersion value set in the semiconductor laser device assembly in Embodiment 3 and a group delay time provided based on the group velocity dispersion value set.
Figure 10B:
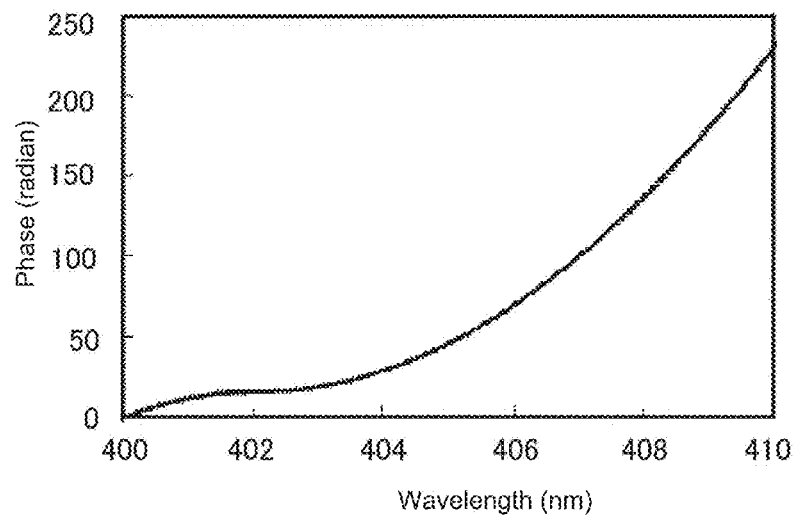
FIG. 10B is a graph showing a frequency dependency of a phase provided by integrating twice a function of the group velocity dispersion value using a wavelength shown in FIG. 10A as a variable.
Figure 11:
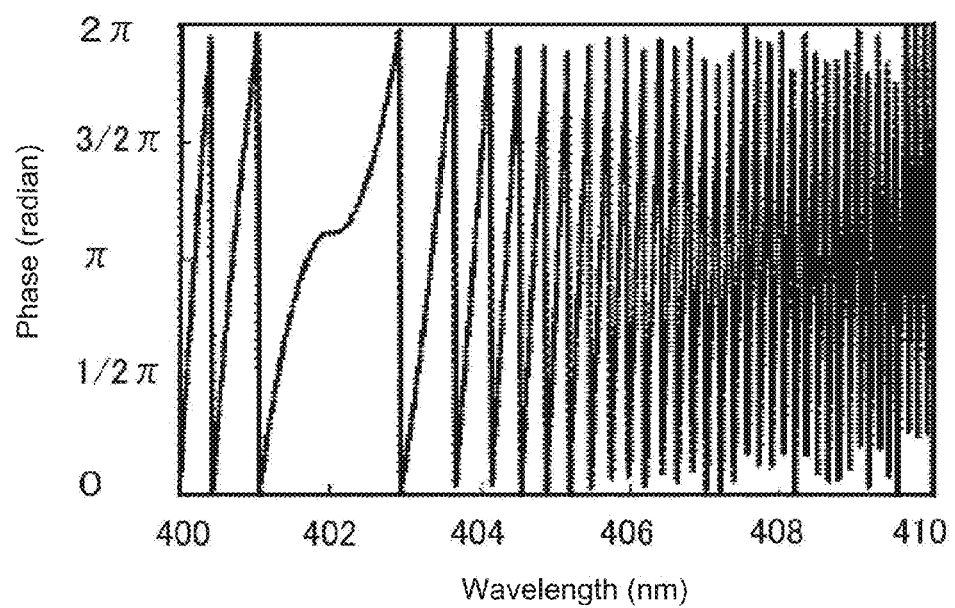
FIG. 11 is a graph provided by converting the graph showing the frequency dependency of the phase shown in FIG. 10B into a phase on a spatial phase modulator.

As shown in "A" in FIG. 10A, the group velocity dispersion value is set on the semiconductor laser device assembly in Embodiment 3. As shown in "B" in FIG. 10A, a function of the group velocity dispersion value using a wavelength as a variable is integrated once (the group delay time). FIG. 10B shows a function of the group velocity dispersion value integrated twice, and is provided by converting that shown in FIG. 10A into the frequency dependency of the phase. Furthermore, FIG. 11 is provided by converting that shown in FIG. 10B into the phase on the spatial phase modulator 113 composed of the reflective LCOS.

Embodiment 4

Embodiment 4 is also alternative of Embodiment 1. According to the control of the group velocity dispersion value in Embodiments 1 to 3, the exponentially slow decay component of the laser light provided by the semiconductor laser device assembly in the related art is tried to be moved to a pulse leading edge. When the part forming the exponentially slow decay component is moved to the leading edge in terms of time, the wavelength width may narrow at the long wavelength side at the initial rise of the oscillation spectrum shown in FIG. 30B. In Embodiment 4, an oscillation spectrum width is limited and the group velocity dispersion value is controlled by the spatial phase modulator in an appropriate manner, thereby providing a pulse time width narrower than the shortest pulse time width of 200 femtoseconds provided by the semiconductor laser device assembly in the related art.

In Embodiment 4, the dispersion compensation optical system 110 provide the laser light having the long wavelength with the group velocity dispersion value greater than the group velocity dispersion value (GVDmin) for the laser light having the shortest wavelength depending on the wavelength. In this case, the longer the wavelength is, the greater the group velocity dispersion value for the laser light having a longer wavelength.

Figure 12A:
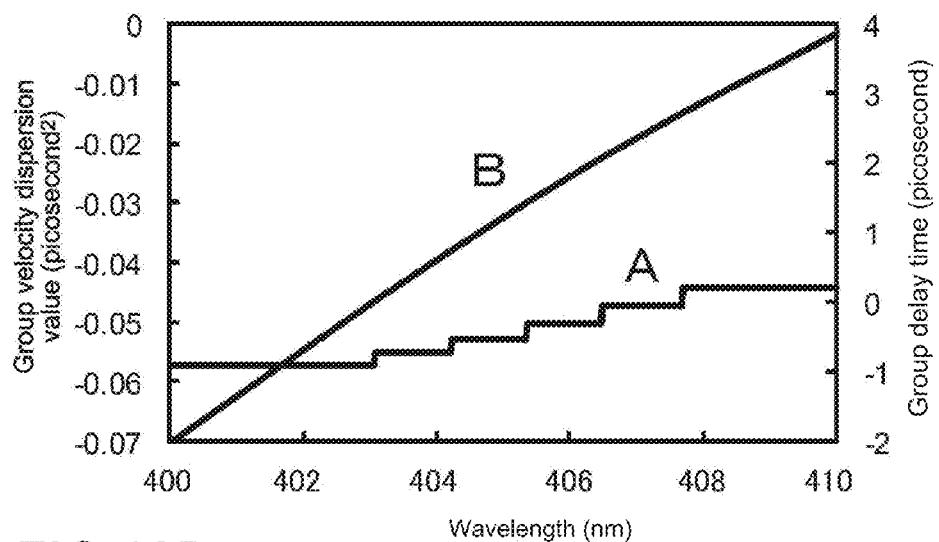
FIG. 12A is a graph showing a group velocity dispersion value set in the semiconductor laser device assembly in Embodiment 4 and a group delay time provided based on the group velocity dispersion value set.
Figure 12B:
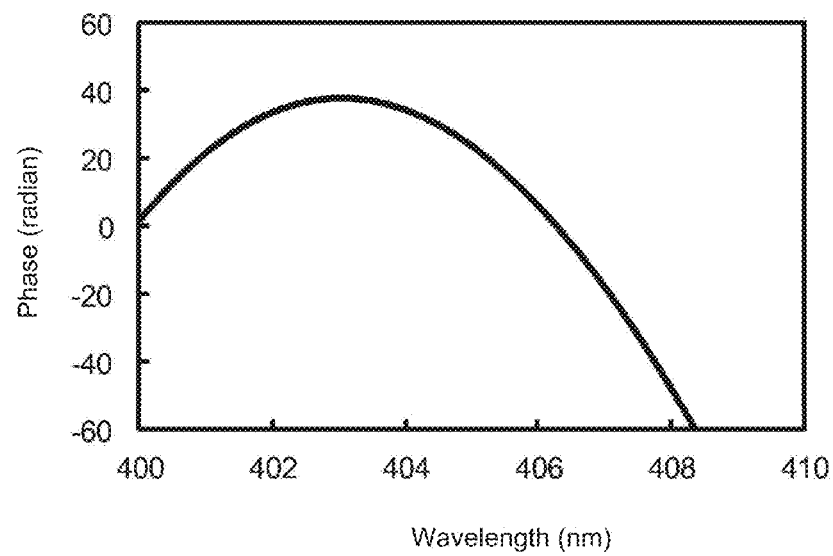
FIG. 12B is a graph showing a frequency dependency of a phase provided by integrating twice a function of the group velocity dispersion value using a wavelength shown in FIG. 12A as a variable.
Figure 13:
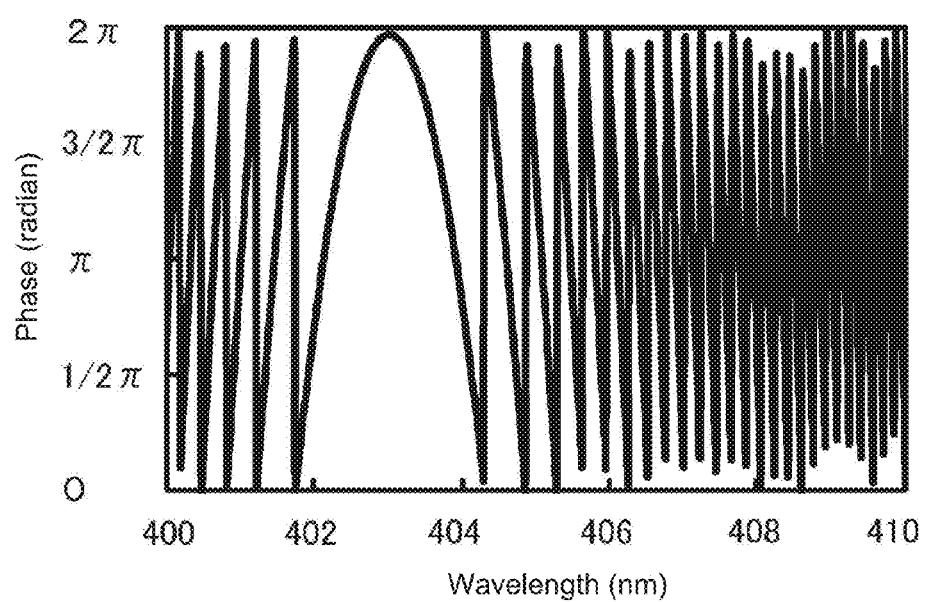
FIG. 13 is a graph provided by converting the graph showing the frequency dependency of the phase shown in FIG. 12B into a phase on a spatial phase modulator.

As shown in "A" in FIG. 12A, the group velocity dispersion value is set in the semiconductor laser device assembly in Embodiment 4. As shown in "B" in FIG. 12A, a function of the group velocity dispersion value using a wavelength as a variable is integrated once (the group delay time). FIG. 12B shows a function of the group velocity dispersion value integrated twice, and is provided by converting that shown in FIG. 12A into the frequency dependency of the phase. Furthermore, FIG. 13 is provided by converting that shown in FIG. 12B into the phase on the spatial phase modulator 113 composed of the reflective LCOS. FIG. 12A shows the group velocity dispersion value is changed stepwise. Note that the group velocity dispersion value may be changed continuously so long as the desirable effect is provided.

Figure 40:
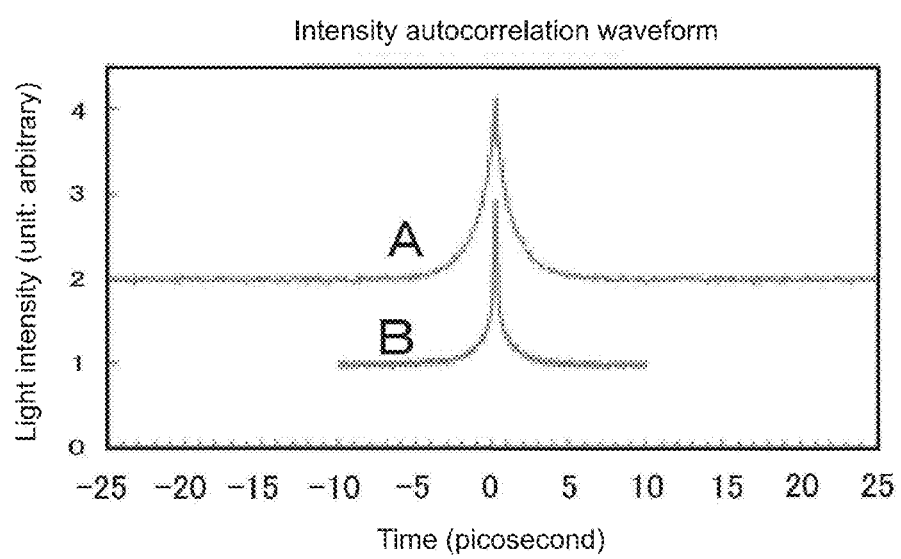
FIG. 40 is a graph showing an intensity autocorrelation waveform and an intensity autocorrelation waveform after compression of a pulse laser light outputted from the semiconductor laser device assembly in the related art.

In Embodiment 4, a wavelength dependency of the time-bandwidth product of the laser light provided from the semiconductor laser device assembly in the related art shown in FIG. 36 is kept as constant as possible to the wavelength change. This is because the wavelength dependency of the time-bandwidth product of the laser light shown in FIG. 36 is changed non-linearly to the wavelength. When the laser light directly outputted from the semiconductor laser device assembly in the related art is compressed using an external compressor, all energy does not have a time waveform in a single sech$^2$ type function. Even after the compression, a shape similar to the exponentially slow decay component remains at the bottom of the pulse. FIG. 40 shows an intensity autocorrelation waveform (see "A" in FIG. 40) and an intensity autocorrelation waveform after compression (see "B" in FIG. 40) of the laser light outputted from the semiconductor laser device assembly in the related art.

According to the control of the group velocity dispersion value in Embodiments 1 to 3, the exponentially decay component of the laser light provided by the semiconductor laser device assembly in the related art is tried to be moved to the pulse leading edge. As a result, the light spectrum width narrows. If the wavelength width of the output light spectrum narrows, a gain bandwidth used for the laser amplification is decreased, which may not suitable to provide a great output. In Embodiment 4, by controlling the group velocity dispersion by the dispersion compensation optical system as appropriate, a non-linear phase rotation at a long wavelength side is prevented from increasing and a linear chirp is added, as shown in FIG. 36. In this manner, it is possible to widen the wavelength width of the oscillation spectrum and to increase the output light. In this case, the outputted from the mode synchronous semiconductor laser device can be compressed to an adequate pulse time width by a pulse compression optical system using a pair of diffractive gratings and optical fibers. In particular, an output pulse is down chirped and can be, therefore, compressed by the optical fibers having adequate lengths. As a light output is increased by controlling the group velocity dispersion, a decrease in a throughput caused by the pulse compressor can be compensated.

Embodiment 5

Figure 16A:
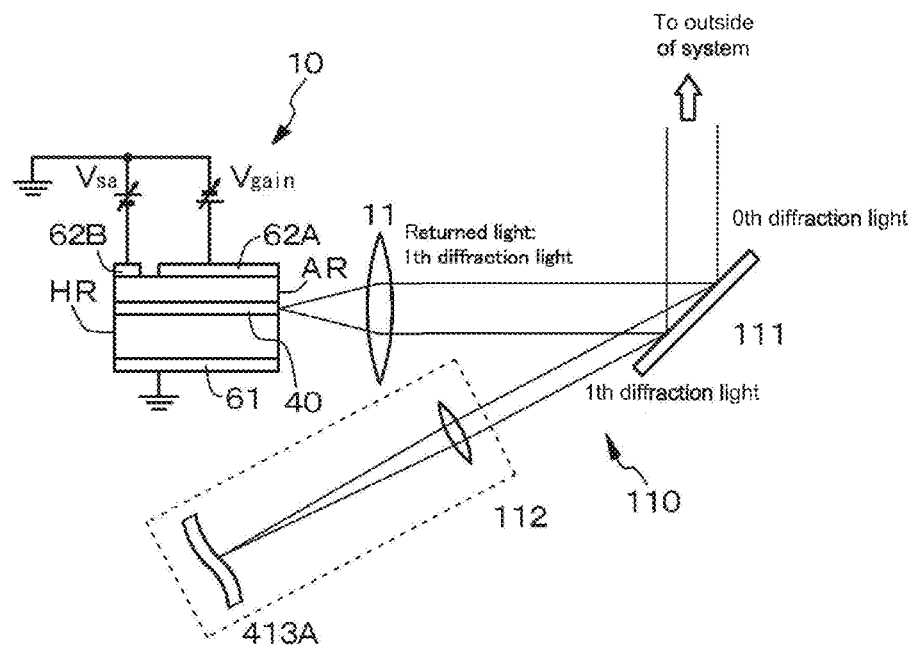
FIG. 16A and FIG. 16B each is a conceptual diagram of a semiconductor laser device assembly in Embodiment 5.
Figure 16B:
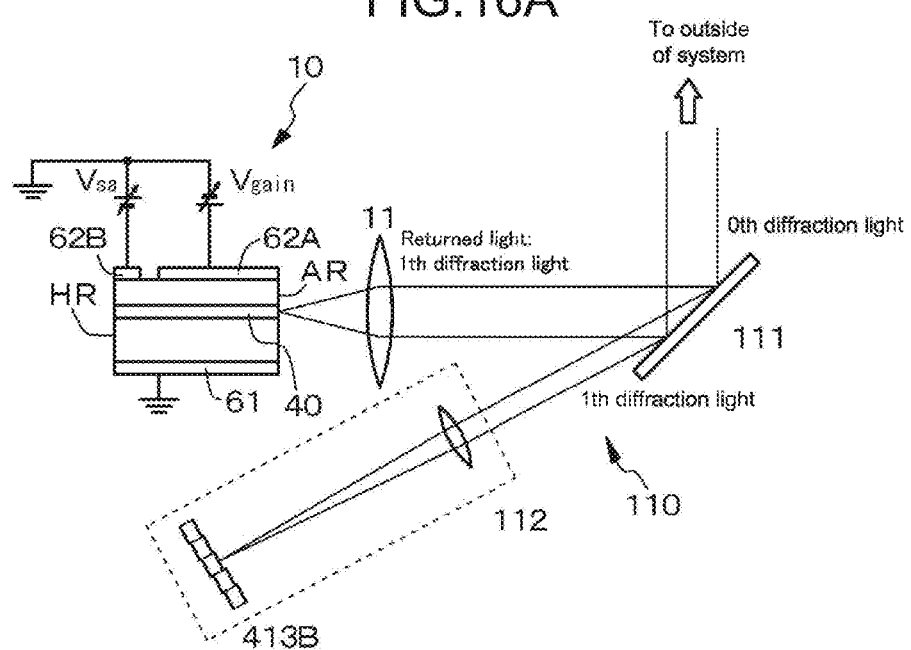

Embodiment 5 is alternative of Embodiments 1 to 4. In Embodiment 5, the spatial phase modulator is composed of a deformable mirror 413A (see FIG. 16A) or a plurality of reflecting mirrors 413B (see FIG. 16B). When the spatial phase modulator is composed of a wavefront compensation device such as a deformable mirror, a shape of a light reflection surface of the deformable mirror is controlled by actuating an actuator produced based on an MEMS technology. Alternatively, when the spatial phase modulator is composed of a plurality of reflecting mirrors 413B, a spatial distance from the diffraction grating to each reflecting mirror 413B is controlled such that a spatial distance where the laser light is passed can be changed depending on the wavelength of the laser light. The laser light is exited from the diffraction grating, incident on the spatial phase modulator and then exited from the spatial phase modulator. As a result, the group velocity dispersion of the laser light can be controlled.

Embodiment 6

Embodiment 6 is alternative of Embodiment 4. Embodiment 6 further includes the pulse compressor that provides the laser light outputted to outside of the system with the positive group velocity dispersion value and the semiconductor optical amplifier. The semiconductor optical amplifier (SOA) amplifies the laser light by a method called as "Master Oscillator Power Amplifier, MOPA". Here, the semiconductor optical amplifier does not convert a light signal to an electrical signal, amplifies directly the light signal as the light, has a laser structure excluding a resonator effect as much as possible, and amplifies the incident light based on a light gain of the semiconductor optical amplifier. The semiconductor optical amplifier is composed of a well-known semiconductor optical amplifier. Embodiment 4 is desirable in that the pulse time width outputted from the semiconductor laser device assembly is widen to increase amplifying energy by the semiconductor optical amplifier.

By the control of the group velocity dispersion as described in Embodiment 4, the laser light chirped linearly having a negative sign is outputted. Therefore, the pulse time width and the light spectrum width of the laser light are long and wide, whereby a high efficient amplification is possible by the semiconductor optical amplifier. Accordingly, by using the control method of the group velocity dispersion as described in Embodiment 4, the laser light is outputted from the semiconductor laser device assembly as described in Embodiment 1 or 5 and is amplified by the semiconductor optical amplifier in Embodiment 6. An amplified output is compressed by a diffraction grating compressor or optical fibers. Note that the pulse amplification by the semiconductor optical amplifier may provide the amplified light with excess chirps. In this case, when the group velocity dispersion is controlled as in Embodiment 4, the group velocity dispersion may be fed back in order to inhibit the excess chirps by the amplification.

Excluding the above description, the semiconductor laser device assembly in Embodiment 6 has the structure and the configuration similar to those of the semiconductor laser device assembly in Embodiment 4. Therefore, detailed description is omitted. In Embodiment 6, light pulse chirps outputted from the semiconductor laser device can be variously controlled such that the amplification. In order to amplify efficiently by the semiconductor optical amplifier, the laser light pulse having the controlled pulse time width and pulse width can be generated. By a combination with the semiconductor optical amplifier, a higher amplifying ratio can be provided.

The light pulse amplification by the semiconductor optical amplifier is roughly determined by the carrier lifetime. The carriers in the semiconductor optical amplifier are recombined to light in a definite carrier lifetime even if they are excited by a steady current. An absolute value of the carriers being accumulated within the semiconductor amplifier has an upper limit. The carrier lifetime largely depends on a gain current amount. As the gain current increases, the carrier lifetime decreases. The carrier lifetime is changed from the order of nanoseconds is changed to the order of several tens picoseconds. When the light pulse having the time width narrower than the carrier lifetime is incident, the carriers within the duration in which the light pulse is incident contribute to amplify the light pulse. In this case, a long carrier lifetime is advantageous for a number of carriers accumulated and increased amplifying energy. When the light pulse time width is longer than the carrier lifetime, the number of the carriers is recovered by the current injection while the light pulse is amplified and the carriers are consumed. Thus, more efficient amplification is possible. As a general rule, when the light pulse time width is longer, the amplification energy often increases.

Figure 17:
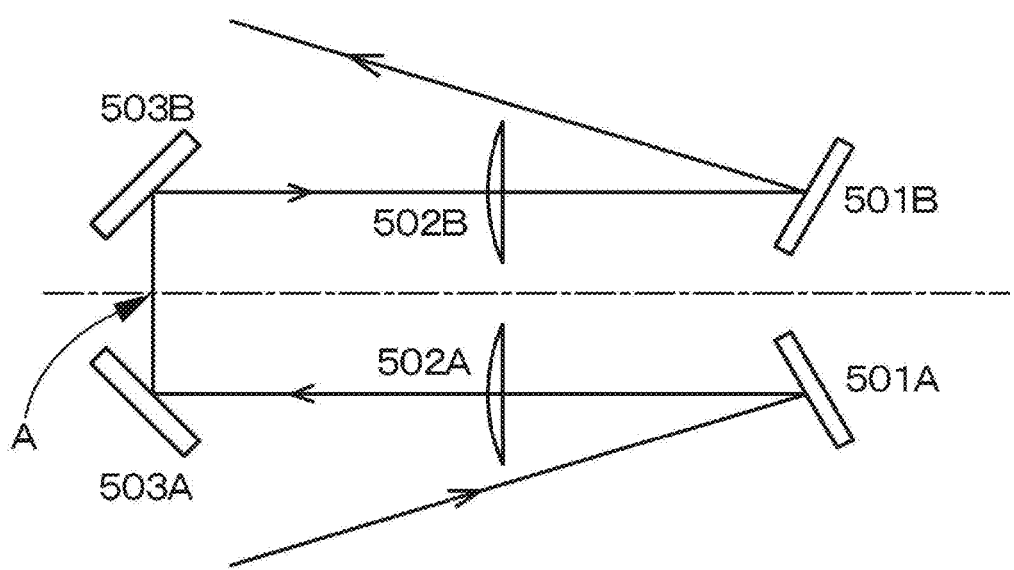
FIG. 17 is a conceptual diagram of a diffraction grating compressor.

When the diffraction grating compressor is used, spaces among diffraction gratings 501A and 501B, lenses 502A and 502B and mirrors 503A and 503B are adjusted for the positive group velocity dispersion (see FIG. 17). Specifically, the diffraction grating 501A, the lens 502A and the mirror 503A are disposed in a mirror symmetry across a dashed-dotted line to the diffraction grating 501B, the lens 502B and the mirror 503B. A distance from the lenses 502A and 502B to a symmetry plane (A) via the mirrors 503A and 503B is equals to a focal length of the lenses 502A and 502B. When the distance from the diffraction gratings 501A and 501B to the lenses 502A and 502B is shorter than the focal length of the lenses 502A and 502B, the positive group velocity dispersion can be provided. When the optical fibers are used, a material dispersion of the optical fibers provides the positive group velocity dispersion. Accordingly, when single mode optical fibers each having an adequate length are prepared and pass through the light pulse outputted, compression is possible.

Embodiment 7

In the general GaAs semiconductor light amplifier, the energy of the laser light incident on the semiconductor light amplifier is amplified, but the pulse time width of the laser light is not compressed by the semiconductor light amplifier itself. As described above, after the amplification by the semiconductor light amplifier, the pulse compressor utilizing a dispersive light device is necessary. On the other hand, in a wide gap semiconductor such as a GaN based compound semiconductor, the amplification of the ultrashort laser light and the pulse compression can be performed at the same time. This may result from a carrier relaxation time in the band shorter than that of other III-V group compound such as GaAs because of a large exciter binding energy and an effective mass observed in the wide gap semiconductor such as the GaN based compound semiconductor.

Embodiment 7 is also alternative of Embodiment 4. In Embodiment 7, the semiconductor light amplifier is composed of a laminated structure of a III-V group nitride based semiconductor layer or a laminated structure of a wide gap semiconductor layer that amplifies the laser light exited from the dispersion compensation optical system 110 to the outside of the system. The semiconductor optical amplifier has the structure and the configuration substantially similar to those of the mode synchronous semiconductor laser device 10 except that the second electrode is not separated, and the ridge stripe structure is not curved and is instead wide from a light incident end fade (the first end face) to a light exit end face (the second end face). Specifically, the semiconductor optical amplifier is tapered, has a device length of 3.0 mm and a flare width of 15 µm, and has a light confinement coefficient of 2.6% due to its specification. The laser light outputted from the semiconductor laser device assembly should have a negative frequency chirp and a pulse time width of 0.5 picoseconds or less. The same is applied to Embodiments 10 to 14.

In other words, the semiconductor optical amplifier is composed of
the laminated structure where
the first compound semiconductor layer 30 having the first conductive type including the GaN based compound semiconductor,
the third compound semiconductor layer (the active layer) 40 including the GaN based compound semiconductor, and
the second compound semiconductor layer 50 having the second conductive type being different from the first conductive type including the GaN based compound semiconductor, laminated in this order;
the second electrode 62 formed on the second compound semiconductor layer 50; and
the first electrode 61 electrically connected to the first compound semiconductor layer 30. The first compound semiconductor layer 30 is formed on the base (specifically, a substrate 21).

As described above, in Embodiment 7, as the amplification of the ultrashort laser light and the pulse compression can be performed at the same time by the semiconductor optical amplifier, no pulse compressor is necessary dissimilar to Embodiment 6. Therefore, the semiconductor laser device assembly can be downsized. In addition, as no pulse compressor is necessary, an optical loss by the pulse compressor will not be generated. Excluding the above description, the semiconductor laser device assembly in Embodiment 7 has the structure and the configuration similar to those of the semiconductor laser device assembly in Embodiment 4 or 6. Therefore, detailed description is omitted.

Embodiment 8

In Embodiment 8, the mode synchronous semiconductor laser device used in the above-described Embodiments or Embodiments 10 to 14 will be described.

The mode synchronous semiconductor laser device 10 in Embodiments has a ridge stripe type Separate Confinement Hetrostructure (SCH structure). Specifically, mode synchronous semiconductor laser device 10 is the GaN based semiconductor laser device composed of an index guide type AlGaInN, and has a ridge stripe structure. The first compound semiconductor layer 30, the third compound semiconductor layer (the active layer) 40 and the second compound semiconductor layer are specifically composed of the AlGaInN based compound semiconductor, and more specifically the layer structure shown in Table 1 below. In Table 1, the compound semiconductor layers described lower are nearer to the n type GaN substrate 21. A band gap of the compound semiconductor of the well layer in the third compound semiconductor layer 40 is 3.06 eV. The mode synchronous semiconductor laser device 10 is formed on a (0001) face of the n type GaN substrate 21, and the third compound semiconductor layer 40 has the quantum well structure. The (0001) face of the n type GaN substrate 21 is also called as a "C face" that is a crystal face having polarity.

TABLE 1

Second compound semiconductor layer 50
    p type GaN contact layer (Mg doped) 54
    p type GaN (Mg doped)/AlGaN superlattice clad layer 53
    p type AlGaN electron barrier layer (Mg doped) 52
    non-doped GaInN light guide layer 51
Third compound semiconductor layer 40
    GaInN quantum well active layer (well layer:$Ga_{0.92}In_{0.08}N$/
    barrier layer:$Ga_{0.98}In_{0.02}N$)
First compound semiconductor layer 30
    n type GaN clad layer 32
    n type AlGaN clad layer 31
where
    well layer (two layers)    8 nm non-doped
    barrier layer (three layers)    14 nm Si doped Parts of the p type GaN contact layer 54 and the p type GaN/AlGaN superlattice clad layer 53 are removed by a RIE method, and the ridge stripe structure 55 is formed thereon. On both sides of the ridge stripe structure 55, a laminated insulation film 56 composed of $SiO_2$/Si is formed. An $SiO_2$ layer is a lower layer, and an Si layer is an upper layer. A difference between an effective refractive index of the ridge stripe structure 55 and an effective refractive index of the laminated insulation film 56 is $5 \times 10^{-3}$ to $1 \times 10^{-2}$, specifically, $7 \times 10^{-3}$. On the p type GaN contact layer 54 corresponding to a top face of the ridge stripe structure 55, the second electrode (a p side ohmic electrode) 62 is formed. On the other hand, on a rear face of the n type GaN substrate 21, the first electrode (an n side ohmic electrode) 61 composed of Ti/Pt/Au is formed.

In the mode synchronous semiconductor laser device 10, an optical density distribution generated from the third compound semiconductor layer 40 and therearound is not overlapped with those of the p type AlGaN electron barrier layer 52 that is the Mg doped compound semiconductor layer, the p type GaN (Mg doped)/AlGaN superlattice clad layer 53 and the p type GaN contact layer 54 as much as possible, thereby preventing the internal loss so long as the internal quantum efficiency is not decreased. This allows a threshold current density where a laser is started to be oscillated to be decreased. Specifically, a distance d from the third compound semiconductor layer 40 to the p type AlGaN electron barrier layer 52 is 0.10 µm, a height of the ridge stripe structure 55 is 0.30 µm, a thickness of the second compound semiconductor layer 50 disposed between the second electrode 62 and the third compound semiconductor layer 40 is 0.50 µm, and a thickness of the p type GaN (Mg doped)/AlGaN superlattice clad layer 53 is 0.40 µm. Although the ridge stripe structure 55 is curved to the second end face in order to decrease the end face reflection, the shape is not limited thereto.

In the mode synchronous semiconductor laser device 10, a non-reflective coat layer (AR) is formed at the light exit end face (the end face) opposed to the collimator 11. On the other hand, a high reflective coat layer (HR) is formed at the end face (the first end face) opposed to the light exit end face (the second end face) in the mode synchronous semiconductor laser device 10. The saturable absorption area 42 is disposed at a first end face side in the mode synchronous semiconductor laser device 10. The non-reflective coat layer (the low reflective coat layer) includes a laminated structure including at least two layers selected from the group consisting of a titanium oxide layer, a tantalum oxide layer, a zirconia oxide layer, a silicon oxide layer and an aluminum oxide layer.

A pulse repetition frequency of the mode synchronous semiconductor laser device 10 is set to 1 GHz. A repetition frequency f of a pulse string of the laser light is determined by a length X' (a distance between the first end face and the spatial phase modulator 113) of the external resonator and is represented by the following equation: $f=c/(2n \cdot X')$ where c is a light speed and n is an effective refractive index of the resonator.

In order to provide the light gain necessary for laser oscillation, high density carriers are injected (excited) into the third compound semiconductor layer (the active layer) to form an inverted distribution. When the semiconductor laser device is composed of the GaN based compound semiconductor having great effective masses of electrons and holes, the third compound semiconductor layer 40 should exceed $10^{19}/cm^3$ for a positive light gain (see "wide-gap semiconductor optical and electronic devices" supervised by Kiyoshi Takahasi, written and edited by Akihiko Yoshikawa, Fumio Hasegawa, published by Morikita Publishing Co., pp. 124-126, for example). The inversed distribution of the carrier density is one digit higher than the semiconductor laser device composed of the GaAs based compound semiconductor. For the oscillation of the semiconductor laser device composed of the GaN based compound semiconductor, the carriers having a significantly high density should be injected. In the mode synchronous semiconductor laser device 10 in Embodiments, the carrier density (inverted distribution carrier density) is estimated to about $1.7 \times 10^{19}/cm^3$.

As described above, the second electrode 62 having a separating resistance of $1 \times 10^2 \Omega$ or more is desirably formed on the second compound semiconductor layer 50. In the case of the GaN based semiconductor laser device, dissimilar to the GaAs based semiconductor laser device in the related art, a mobility in the second compound semiconductor layer 50 in the p type conductive type is small. Without providing the p type conductive type second compound semiconductor layer 50 with high resistance by an ion implantation, the second electrode 62 formed thereon is separated by the separation groove 62C, whereby an electrical resistivity value between the first part 62A and the second part 62b of the second electrode 62 is 10 times greater than that between the second electrode 62 and the first electrode 61, or the electrical resistivity value between the first part 62A and the second part 62b of the second electrode 62 can be $1 \times 10^2 \Omega$ or more.

Necessary properties of the second electrode 62 are as follows:
(1) The second electrode 62 has a function as an etching mask for etching the second compound semiconductor layer 50,
(2) The second electrode 62 can be wet-etched without damaging the optical and electrical properties of the second compound semiconductor layer 50,
(3) The second electrode 62 has a specific contact resistivity value of $10^{-2} \cdot \Omega \cdot cm^2$ or less when formed on the second compound semiconductor layer 50,
(4) When the second electrode 62 has the laminated structure, a material for a lower metal layer has a great work function, has a low specific contact resistivity to the second compound semiconductor layer 50, and can be wet-etched, and
(5) When the second electrode 62 has the laminated structure, a material for an upper metal layer has resistance to an etching for forming the ridge stripe structure (for example, to $Cl_2$ gas used in the RIE method), and can be wet-etched.

The second electrode 62 is composed of a Pd monolayer having a thickness of 0.1 µm.

The p type GaN/AlGaN superlattice clad layer 53 having a superlattice structure where p-type GaN layers and p-type AlGaN layers are laminated alternately has a thickness of 0.7 µm or less, specifically, 0.4 µm. The p-type GaN layer having the superlattice structure has a thickness of 2.5 nm. The p-type AlGaN layer having the super lattice structure has a thickness of 2.5 nm. A total layer number of the p-type GaN layers and the p-type AlGaN layers is 160. A distance from the third compound semiconductor layer 40 to the second electrode 62 is 1 µm or less, specifically 0.5 µm or less. Into the p type AlGaN electron barrier layer 52, the p type GaN/AlGaN superlattice clad layer 53 and the p type GaN contact layer 54 of the second compound semiconductor layer 50, $1 \times 10^{19}$ $cm^{-3}$ or more (specifically, $2 \times 10^{19}$ $cm^{-3}$) of Mg is doped. The second compound semiconductor layer 50 has an absorption coefficient of at least 50 $cm^{-1}$, specifically 65 $cm^{-1}$ to the light having a wavelength of 405 nm. Also, the second compound semiconductor layer 50 has the non-doped GaInN light guide layer 51 and the p-type compound semiconductor layer from a third compound semiconductor layer side. A distance (d) from the third compound semiconductor layer 40 to the p-type compound semiconductor layer (specifically, the p type AlGaN electron barrier layer 52) is $1.2 \times 10^{-7}$ m or less, specifically 100 nm.

Referring to FIG. 26A, FIG. 26B, FIG. 27A, FIG. 27B and FIG. 28, a method of producing the mode synchronous semiconductor laser device in Embodiment 1 etc. will be described. FIG. 26A, FIG. 26B, FIG. 27A and FIG. 27B each is a schematic partial cross-sectional diagram for cutting a substrate etc. in an Y-Z plane. FIG. 28 is a schematic partial cross-sectional diagram for cutting the substrate etc. in an X-Z plane.

[Process-A]

Firstly, on the base, i.e., on the (0001) face of the n type GaN substrate 21, based on a well-known MOCVD method, the laminated structure where the first compound semiconductor layer 30 having the first conductive type including the GaN based compound semiconductor, the third compound semiconductor layer (the active layer) 40 including the GaN based compound semiconductor configuring the light emitting area (a gain area) 41 and the saturable absorption area 42, and the second compound semiconductor layer 50 having the second conductive type (the p type conductive type) being different from the first conductive type including the GaN based compound semiconductor, laminated in this order (see FIG. 26A).

[Process-B]

Then, the belt like second electrode 62 is formed on the second compound semiconductor layer 50. Specifically, after a Pd layer 63 is formed on an entire surface based on a vacuum deposition method (see FIG. 26B). On the Pd layer 63, a belt like resist layer for etching is formed based on a photoresist technology. After the Pd layer 63 not covered by the resist layer for etching is removed using aqua regalis, the resist layer for etching is removed. In this manner, the structure shown in FIG. 27A is provided. Based on a liftoff method, the belt like second electrode 62 may be formed on the second compound semiconductor layer 50.

[Process-C]

Next, a part of the second compound semiconductor layer 50 is at least etched using the second electrode 62 as the etching mask (specifically, a part of the second compound semiconductor layer 50 is etched) to form the ridge stripe structure. Specifically, based on the RIE method using $Cl_2$ gas, a part of the second compound semiconductor layer 50 is etched using the second electrode 62 as the etching mask. In this manner, the structure shown in FIG. 27B is provided. As the ridge stripe structure is formed by a self align method using the belt like second electrode 62 patterned as the etching mask, there is no chance to generate misalignment between the second electrode 62 and the ridge stripe structure.

[Process-D]

Thereafter, the resist layer 64 is formed for forming the separation groove on the second electrode 62 (see FIG. 28). A reference number 65 represents an opening formed in the resist layer 64 for forming the separation groove. Next, the separation groove 62C is formed on the second electrode 62 by a wet etching method using the resist layer 64 as a wet etching mask, thereby separating the second electrode 62 into the first part 62A and the second part 62B by the separating groove 62C. Specifically, aqua regalis is used as the etching liquid, the whole is immersed into aqua regalis for about 10 seconds to form the separation groove 62C in the second electrode 62. Thereafter, the resist layer 64 is removed. In this manner, the structure shown in FIGS. 2 and 3 is provided. Unlike the dry etching method, the wet etching method allows the second compound semiconductor layer 50 to be inhibited from degrading of optical and electrical properties. Therefore, the light emitting properties of the mode synchronous semiconductor laser device will not be degraded. If the dry etching method is used, the internal loss a, of the second compound semiconductor layer 50 is increased which may increase a threshold voltage or decrease a light output. When an etching rate of the second electrode 62 is represented by $ER_0$ and an etching rate of the laminated structure is represented by $ER_1$, $ER_0/ER_1$ nearly equals to $1\times10^2$. Thus, as there is a high etching selectivity between the second electrode 62 and the second compound semiconductor layer 50, the second electrode 62 can be etched with certainty without etching the laminated structure (a few, if etched). It is desirable to satisfy: $ER_0/ER_1 \geq 1\times10$, more desirably $ER_0/ER_1 \geq 1\times10^2$.

The second electrode may be the laminated structure having the lower metal layer made of the palladium (Pd) having a thickness of 20 nm and the upper meta layer made of nickel (Ni) having a thickness of 200 nm. In the wet etching using aqua regalis, Nickel has an etching rate about 1.25 times faster than that of palladium.

[Process-E]

Thereafter, an n side electrode is formed, the substrate is cleaved, and packaging is performed to produce the mode synchronous semiconductor laser device 10.

The electrical resistivity between the first part 62A and the second part 62B of the second electrode 62 of the mode synchronous semiconductor laser device 10 produced was measured by a four-terminal method. As a result, when the width of the separation groove 62C was 20 μm, the electrical resistivity between the first part 62A and the second part 62B of the second electrode 62 was $1\times15$ kΩ. Also, in the mode synchronous semiconductor laser device 10 produced, a DC current flowed from the first part 62A to the second part 62B of the second electrode 62 via the light emitting area 41 to provide the forward bias state, and the reverse bias voltage Vsa was applied between the first electrode 61 and the second part 62B of the second electrode 62 to apply an electric field to the saturable absorption area 42, thereby causing a self pulsation operation. In other words, the electrical resistivity between the first part 62A and the second part 62B of the second electrode 62 was 10 times or more of the electrical resistivity between the second electrode 62 and the first electrode 61, or $1\times10^2$Ω or more. Therefore, a leak current flow from the first part 62A to the second part 62B of the second electrode 62 can be inhibited with certainty. As a result, the light emitting area 41 can be in the forward bias state and the saturable absorption area 42 can be in the reverse bias state to cause a single mode self pulsation operation with certainty.

Embodiment 9

Embodiment 9 is an alternative of the mode synchronous semiconductor laser device described in Embodiment 8, and relates to the mode synchronous semiconductor laser device having a third configuration. In Embodiment 8, the mode synchronous semiconductor laser device 10 was formed on the (0001) face that is a crystal face having polarity, i.e., the C face, of the n type GaN substrate 21. When such a substrate is used, it may be difficult that the saturable absorption is electrically controlled due to a QCSE effect (quantum confined Stark effect) by an internal electric field caused by piezo polarization and spontaneous polarization in the third compound semiconductor layer (the active layer) 40. In other words, it is revealed that a DC current value flowing to the first electrode and a reverse bias voltage value that is applied to the saturable absorption area should be higher for the self pulsation operation and the mode synchronous operation in some cases, the subpulse components accompanied by a main pulse may be generated, and synchronization between the external signal and the light pulse is difficult to be established.

In order to prevent such a phenomenon, it is revealed that the well layer of the third compound semiconductor layer (the active layer) 40 should have an optimal thickness and of the barrier layer of the third compound semiconductor layer 40 should have an optimal impurity doping concentration.

Specifically, the well layer of the GaInN quantum well active layer has a thickness of 1 nm or more to 10 nm or less, desirably 1 nm or more to 8 nm or less. By decreasing the thickness of the well layer, the effects of the piezo polarization and the spontaneous polarization can be decreased. In addition, the barrier layer has an impurity doping concentration of $2\times10^{18}$ cm$^{-3}$ or more to $1\times10^{20}$ cm$^{-3}$ or less, desirably $1\times10^{19}$ cm$^{-3}$ or more to $1\times10^{20}$ cm$^{-3}$ or less. Here, the impurity may be silicon (Si) or oxygen (O). When the impurity doping concentration in the barrier layer is as described above, the carriers in the active layer can be increased. As a result, the effects of the piezo polarization and the spontaneous polarization can be decreased.

In Embodiment 9, the third compound semiconductor layer (the active layer) 40 is composed of the GaInN quantum well active layer including three barrier layers ($Ga_{0.98}In_{0.02}N$) shown in the layer structure in Table 1 and two well layers ($Ga_{0.92}In_{0.08}N$) as shown in Table 2. In the mode synchronous semiconductor laser device in Reference 8, the third compound semiconductor layer 40 composed of the layer structure in Table 1 is as shown in Table 2.

TABLE 2

|  | Embodiment 9 | Reference 8 |
|---|---|---|
| well layer | 8 nm | 10.5 nm |
| barrier layer | 12 nm | 14 nm |
| impurity doped concentration in well layer | non-doped | non-doped |
| impurity doped concentration in barrier layer | Si: $2 \times 10^{18}$ cm$^{-3}$ | non-doped |

In Embodiment 9, the well layer has a thickness of 8 nm and the barrier layer is doped with Si at $2\times10^{18}$ cm$^{-3}$, thereby relieving the QCSE effect in the active layer. On the other hand, in Reference 8, the well layer has a thickness of 10.5 nm and the barrier layer is not doped with impurities.

The mode synchronization is determined by the DC current applied to the light emitting area and the reverse bias voltage Vsa applied to the saturable absorption area similar to Embodiment 1. The reverse bias voltage dependency of a relationship between the injection current and the light output in Embodiment 9 and Reference 8 was determined. As a result, in Reference 8, as the reverse bias voltage Vsa increased, the threshold current where the laser started to oscillate gradually increased. It was revealed that a change is caused at lower reverse bias voltage Vsa in Reference 8 as compared to that in Embodiment 9. This suggests that, in the active layer in Embodiment 9, the effect of the saturable absorption is electrically controlled by the reverse bias voltage Vsa. Note that the self pulsation operation by the single mode (single basic lateral mode) and the mode synchronous (mode lock) operation are observed also in Reference 8 in the sate that the reverse bias is applied to the saturable absorption area. It should be appreciated that Reference 8 is involved in the present disclosure.

Embodiment 10

Embodiment 10 is alternative of Embodiment 7. In order to provide a large quantity of energy in the laser light pulse amplification by the semiconductor optical amplifier, gain saturation energy should be increased. It is effective that the light confinement coefficient corresponding to a volume percentage of the active layer to a volume occupied by the light mode in a waveguide is decreased. In Embodiment 10, the light confinement coefficient in the semiconductor optical amplifier is decreased. Specifically, the semiconductor optical amplifier utilizes a slab coupled waveguide (SCOWA) in Embodiment 10. In Embodiment 7, the light confinement coefficient is 2.6%. In contrast, in Embodiment 10, the light confinement coefficient is 0.8%.

The semiconductor optical amplifier utilizing the SCOWA has a structure that a rod (bar) like waveguide is coupled to a slab (plate) like two dimensional waveguide to weakly confine light in a coupled part between the slab and the rod. By disposing the third compound semiconductor layer (the active layer) in the rod like waveguide, a volume occupied by the active layer can be decreased to a mode field of the laser light. It is possible to provide the semiconductor optical amplifier having the low light confinement coefficient. Detailed description about structure and configuration of the SCOWA semiconductor optical amplifier will be in Embodiment 11 below.

The semiconductor laser device assembly further includes a light spectrum shaper that shapes the light spectrum of the laser light exited from the dispersion compensation optical system to the outside of the system. The shaped laser light may be incident on the dispersion compensation optical system. The laser light spectrum has an increased intensity at the long wavelength side. Therefore, when only one bandpass filter is used, the light spectrum is not fully shaped and a good correlation waveform (time waveform) may not be provided. This is caused by the fact that, in the bandpass filter using the dielectric multilayer film, a transmission function is approximated by a Lorenz function. Accordingly, the light spectrum shaper is composed of the bandpass filter formed of the dielectric multilayer film. Desirably, the laser light exited from the dispersion compensation optical system to the outside of the system is passed through the bandpass filter a plurality of times (e.g., two times). By passing the laser light through the bandpass filter a plurality of times, a late time pulse component and an incoherent component can be removed. More specifically, as the light spectrum shaper, the bandpass filter formed by laminating a dielectric thin film having a low dielectric constant and dielectric thin film having a high dielectric constant. The bandpass filter is composed of a dielectric multilayer oscillator where a single half-wave oscillator is built in, and can decrease a passed amount of wavelength components other than those having the desirable wavelength as appropriate by passing the laser light a plurality of times. However, it should not be limited to the single half-wave oscillator so long as a necessary value of a light attenuation other than that having the desirable wavelength is provided. The bandpass filter composed of a plurality of oscillators or an integral multiple half-wave oscillator can be used. Furthermore, the light spectrum shaper is not limited to the bandpass filter so long as a light spectrum shape necessary for being incident on the semiconductor optical amplifier is provided and a dispersion state of the laser light is not changed after the light spectrum is shaped.

Figure 18:
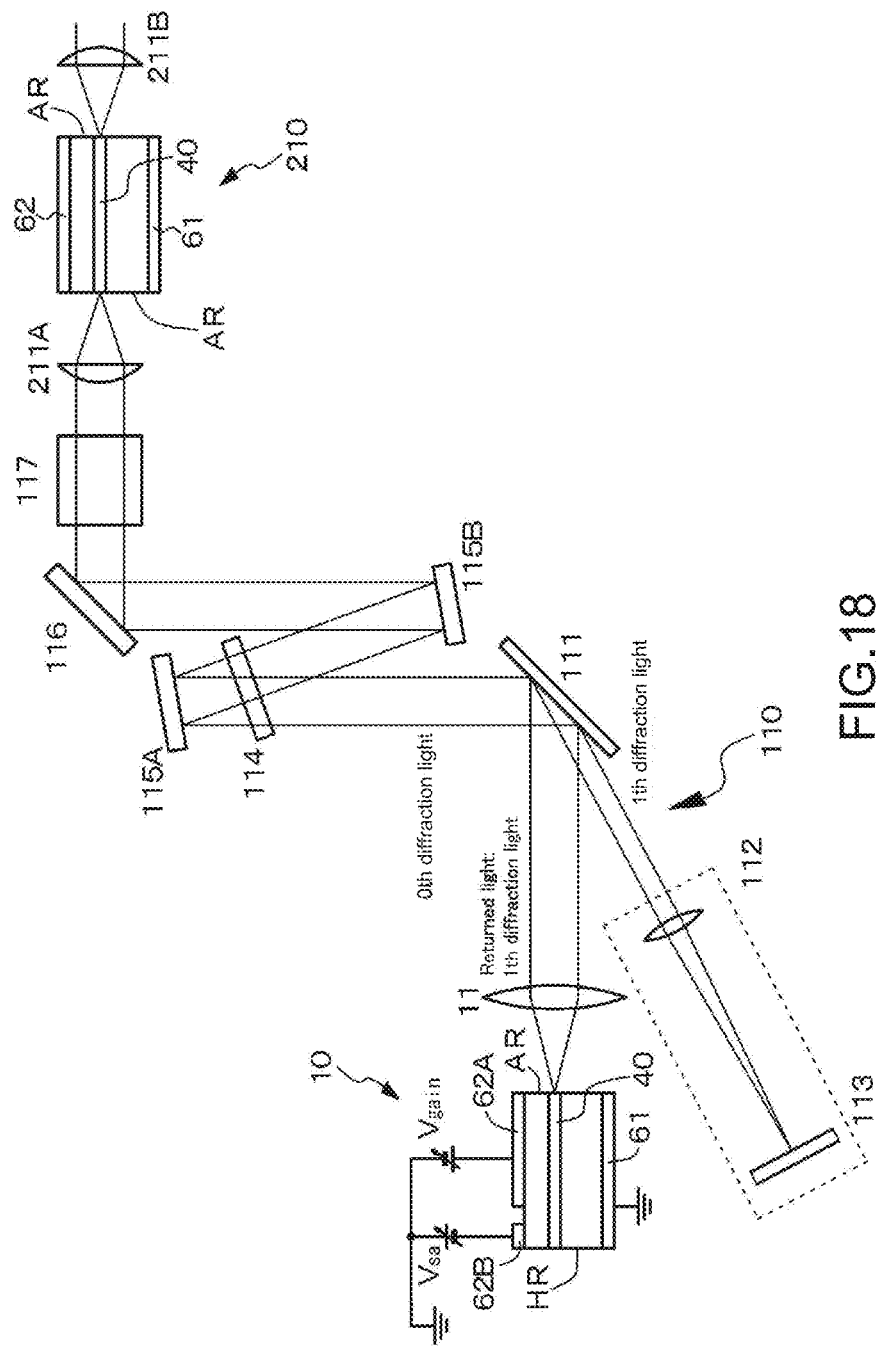
FIG. 18 is a conceptual diagram of a semiconductor laser device assembly in Embodiment 10 including a light spectrum shaper and a semiconductor optical amplifier.

FIG. 18 shows an example of an optical arrangement when the bandpass filter is transmitted two times. The laser light emitted from the dispersion compensation optical system to the outside of the system passes through a light spectrum shaper 114, is reflected by a reflecting mirror 115A, passes again the light spectrum shaper 114, is reflected by reflecting mirrors 115B, 116, is guided to a light isolator 117, passes through the light isolator 117, passes through a light collector (a lens) 211A, and is incident on a semiconductor optical amplifier 210. Then, the laser light outputted from the semiconductor optical amplifier 210 is outputted to the outside of the system via a light collecting means (a lens) 211B.

Excluding the above description, the semiconductor laser device assembly in Embodiment 10 has the structure and the configuration similar to those of the semiconductor laser device assembly in Embodiment 7. Therefore, detailed description is omitted.

Embodiment 11

Embodiment 11 is alternative of Embodiment 10. In Embodiment 11, a value of the light confinement coefficient in the semiconductor optical amplifier of the semiconductor laser device assembly is decreased. The semiconductor optical amplifier in Embodiment 11 has the first configuration.

Figure 19:
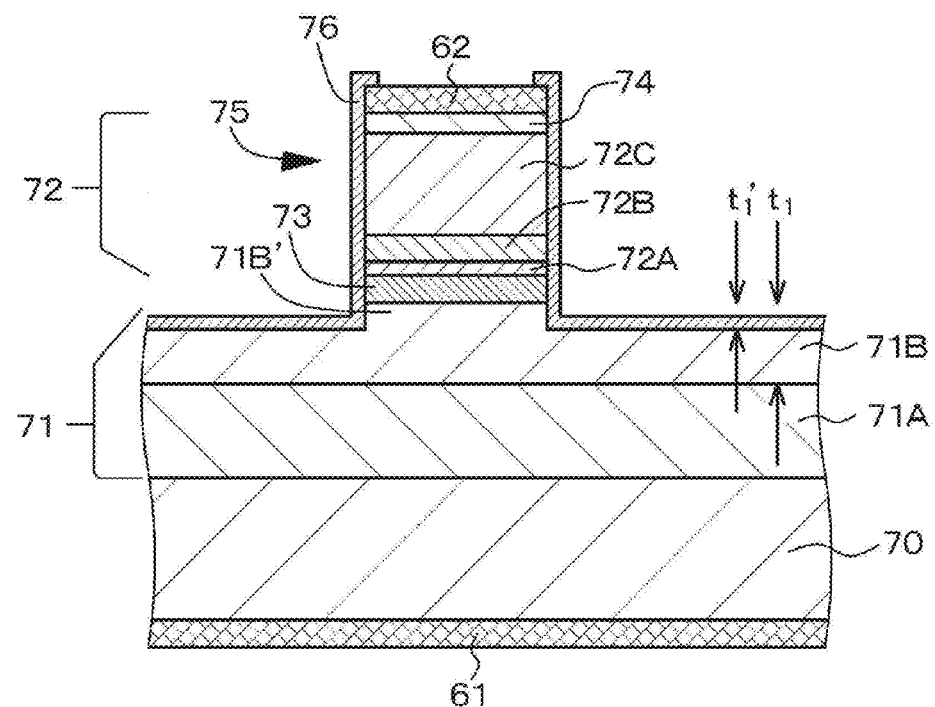
FIG. 19 is a schematic partial cross-sectional diagram of a semiconductor optical amplifier in Embodiment 11 when the semiconductor optical amplifier is cut on a virtual plane perpendicular to an axis line of the semiconductor optical amplifier.

FIG. 19 shows a schematic partial cross-sectional diagram of the semiconductor optical amplifier when the semiconductor optical amplifier is cut on a virtual plane perpendicular to an axis line of the semiconductor optical amplifier. The laminated structure has a first compound semiconductor layer 71 having a first conductive type, a third compound semiconductor layer (the active layer, the gain area) composed of the compound semiconductor 73 and a second compound semiconductor layer 72 having a second conductive type being different from the first conductive type sequentially laminated on a base 70. The first compound semiconductor layer 71 has a laminated structure including a first clad layer (an n type AlGaN layer) 71A and a first light guide layer (an n type GaN layer) 71B from the base side. It satisfies $6\times10^{-7}$ m$<t_1$, desirably $8\times10^{-7}$ m$\leq t_1$, 0 (m)$<t_1'\leq 0.5 \cdot t_1$, desirably 0 (m)$<t_1'\leq 0.3 \cdot t_1$, where $t_1$ represents a thickness of the first light guide layer 71B and $t_1'$ represents a thickness of a part 71B' of the first light guide layer configuring the ridge stripe structure 75. Specifically, in Embodiment 11, $t_1=1.25$ μm and $t_1'=0.15$ μm. The length and the width of the ridge stripe structure 75 are 1.0 mm and 1.6 μm, respectively.

Specifically, the base 70 is composed of an n type GaN substrate, and the compound semiconductor layer is disposed on the (0001) face of the n type GaN substrate. The laminated structure composed of the first compound semiconductor layer 71, the active layer 73 and the second compound semiconductor layer 72 are composed of the GaN based compound semiconductor, specifically composed of an AlGaInN based compound semiconductor, and more specifically the layer structure shown in Table 3 below. In Table 3, the compound semiconductor layers described lower are nearer to the base 70. A band gap of the compound semiconductor of the well layer in the active layer 73 is 3.06 eV. The active layer 73 has a quantum well structure including a well layer and a barrier layer. The barrier layer has an impurity (specifically, silicon Si) doping concentration of $2\times10^{17}$ cm$^{-3}$ or more to $1\times10^{20}$ cm$^{-3}$ or less. On both sides of the ridge stripe structure 75, a laminated insulation film 76 composed of SiO$_2$/Si is formed. An SiO$_2$ layer is a lower layer, and an Si layer is an upper layer. On a p type GaN contact layer 74 corresponding to a top face of the ridge stripe structure 75, the second electrode (a p side ohmic electrode) 62 is formed. On the other hand, on a rear face of the base 70, the first electrode (an n side ohmic electrode) 61 composed of Ti/Pt/Au is formed. In Embodiment 11, the second electrode 62 is composed of a Pd monolayer having a thickness of 0.1 μm. A p type AlGaN electron barrier layer 72A has a thickness of 10 nm. A second light guide layer (p type AlGaN layer) 72B has a thickness of 50 nm. A second clad layer (a p type AlGaN layer 72C has a thickness of 0.5 μm. A p type GaN contact layer 74 has a thickness of 100 nm. Furthermore, into the p type AlGaN electron barrier layer 72A, the second light guide layer 72B, the second clad layer 72C and the p type GaN contact layer 74 configuring the second compound semiconductor layer 72, $1\times10^{19}$ cm$^{-3}$ or more (specifically, $2\times10^{19}$ cm$^{-3}$) of Mg is doped. On the other hand, the first clad layer (the n type AlGaN layer) 71A has a thickness of 2.5 μm. The thickness of the first light guide layer (the n type GaN layer) 71B is as described above. The thickness (1.25 μm) of the first light guide layer 71B is greater than that (100 nm) of the second light guide layer. The first light guide layer 71B is composed of GaN. Alternatively, the first light guide layer 71B may be composed of a compound semiconductor having a band gap wider than the active layer 73 and narrower than the first clad layer 71A.

TABLE 3

Second compound semiconductor layer 72
    p type GaN contact layer (Mg doped) 74
    second clad layer (p type Al$_{0.05}$Ga$_{0.95}$N layer (Mg doped)) 72C
    second light guide layer (p type Al$_{0.01}$Ga$_{0.99}$N layer (Mg doped)) 72B
    p type Al$_{0.20}$Ga$_{0.80}$N electron barrier layer (Mg doped) 72A
Active layer 73
    GaInN quantum well active layer 73
    (well layer:Ga$_{0.92}$In$_{0.08}$N/barrier layer:Ga$_{0.98}$In$_{0.02}$N)
First compound semiconductor layer 71
    first light guide layer (n type GaN layer) 71B
    first clad layer (n type Al$_{0.03}$Ga$_{0.97}$N layer) 71A
where
    well layer (two layers): 10 nm [non-doped]
    barrier layer (three layers): 12 nm [doping concentration (Si): $2\times10^{18}$cm$^{-3}$]

In the semiconductor optical amplifier in Embodiment 11, as the thickness $t_1$ of the first light guide layer is defined, the light absorption coefficient can be decreased. A peak of a light intensity distribution is moved from the active layer to the first light guide layer. As a result, a light density around the active layer can be lowered upon the high output operation. Not only optical damages can be prevented, but also a saturated energy of an amplified laser light is increased to provide the high output operation in the semiconductor optical amplifier. By defining the thickness $t_1'$ of a part of the first light guide layer configuring the ridge stripe structure in Embodiment 11, the light beam outputted can have a single mode. A width of a slab waveguide is similar to the thickness of the first light guide layer, resulting in a light beam having a cross-sectional shape of a substantially true circle. There is no adverse effect such as degraded light collecting properties, when applying to a lens or optical fibers.

Excluding the above description, the semiconductor laser device assembly in Embodiment 11 has the structure and the configuration similar to those of the semiconductor laser device assembly in Embodiment 10. Therefore, detailed description is omitted.

Embodiment 12

Figure 20:
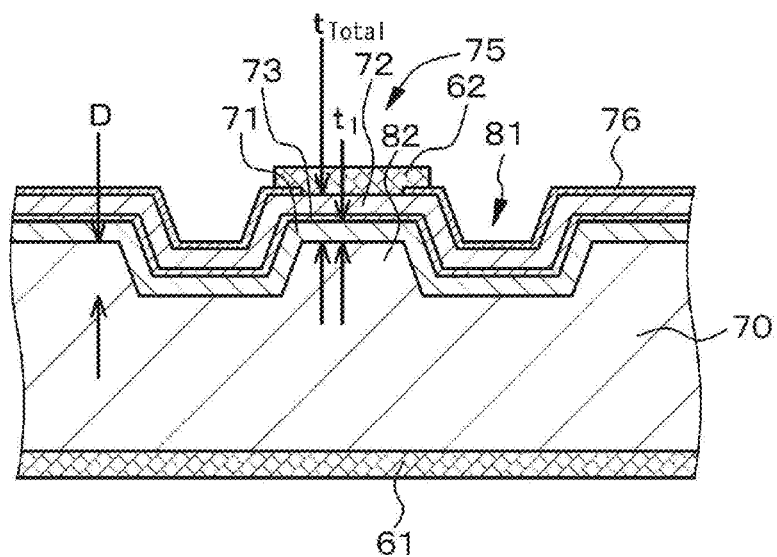
FIG. 20 is a schematic partial cross-sectional diagram of a semiconductor optical amplifier in Embodiment 12 when the semiconductor optical amplifier is cut on a virtual plane perpendicular to an axis line of the semiconductor optical amplifier.

Embodiment 12 is alternative of Embodiments 7, 10 to 11. FIG. 20 shows a schematic partial cross-sectional diagram of a semiconductor optical amplifier in Embodiment 12 when the semiconductor optical amplifier is cut on a virtual plane perpendicular to an axis line of the semiconductor optical amplifier. In the base 70, two concave parts 81 are formed extending along an axis line direction of the semiconductor optical amplifier. On an entire surface, i.e., the two concave parts 81 and an area 82 of the base 70 sandwiched between the two concave parts 82, the laminated structure described in Embodiment 11 is formed. In addition, the second electrode 62 is disposed above the area 82.

Here, the first compound semiconductor layer 71 has a laminated structure of the first clad layer and the first light guide layer from the base side.

When the thickness of the first light guide layer above the area 82 of the base 70 sandwiched between the two concave parts 81 is represented by $t_1$, a total thickness of the laminated structure is represented by $T_{Total}$, and a depth of the concave part 81 is represented by D, $6\times10^{-7}$ m$<t_1$, desirably $8\times10^{-7}$ m$\leq t_1$, $(T_{Total}-0.5 \cdot t_1)\leq D \leq T_{Total}$, desirably $(T_{Total}-0.3 \cdot t_1)\leq D \leq T_{Total}$. Specifically, in Embodiment 12, $t_1=1.25$ μm, $T_{Total}=4.1$ μm, and D=3.7 μm. A width of the concave part 81 is set to 20 µm. A width of the area 82 of the base sandwiched between the two concave parts 81 is set to 1.5 µm.

Excluding the above description, the semiconductor optical amplifier in Embodiment 12 has the structure and the configuration similar to those of the semiconductor optical amplifier in Embodiment 11. Therefore, detailed description is omitted.

In the semiconductor optical amplifier in Embodiment 12, as the thickness $t_1$ of the first light guide layer above the area of the base sandwiched between the two concave parts (in other words, the parts of the base positioned between the concave part and the concave part) is defined, a light density around the active layer can be lowered upon the high output operation. Not only optical damages can be prevented, but also a saturated energy of an amplified laser light is increased to provide the high output operation in the semiconductor optical amplifier. In addition, as the depth D of the concave part is defined in Embodiment 12, the light beam outputted can have a single mode. A width of a slab waveguide is similar to the thickness of the first light guide layer, resulting in a light beam having a cross-sectional shape of a substantially true circle. There is no adverse effect such as degraded light collecting properties, when applying to a lens or optical fibers.

Embodiment 13

Figure 21:
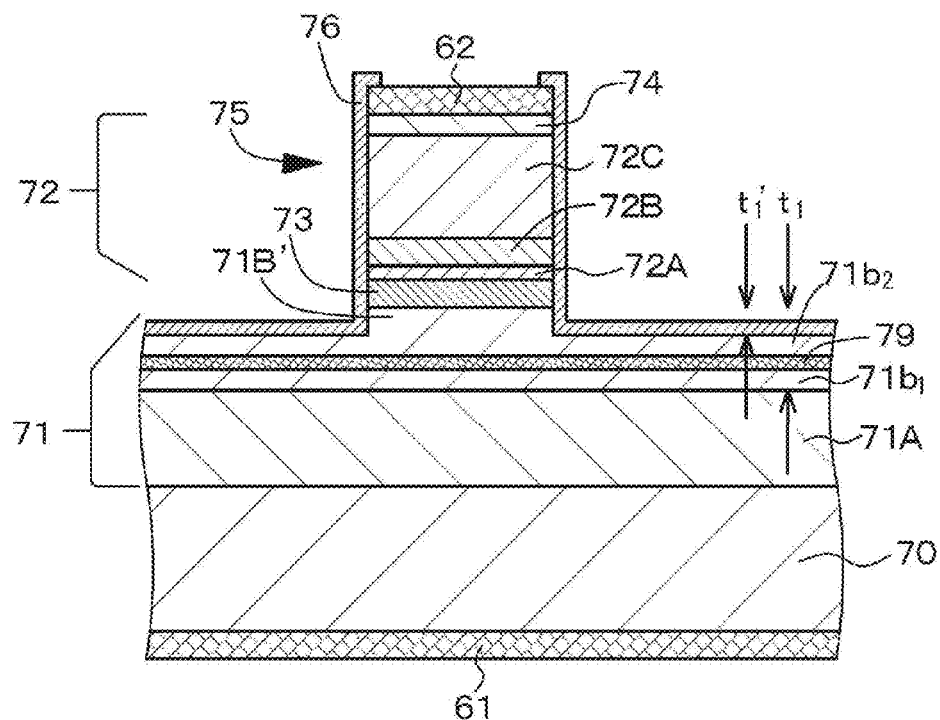
FIG. 21 is a schematic partial cross-sectional diagram of a semiconductor optical amplifier in Embodiment 13 when the semiconductor optical amplifier is cut on a virtual plane perpendicular to an axis line of the semiconductor optical amplifier.

Embodiment 13 is alternative of Embodiments 7, 10 to 12. As shown in a schematic partial cross-sectional diagram of FIG. 21, in a semiconductor optical amplifier in Embodiment 13, the first compound semiconductor layer 71 has a laminated structure of the first clad layer 71A and first light guide layers $71b_1$, $71b_2$. In the first light guide layer $71b_1$, $71b_2$, a high refractive index layer 79 composed of a compound semiconductor material having a refractive index higher than that of the compound semiconductor material of the first light guide layer 71, specifically a high refractive index layer 79 composed of $In_{0.02}Ga_{0.98}N$ having a thickness of 50 nm is formed. A distance from a boundary between the active layer 73 and the upper layer, i.e., the first light guide layer $71b_2$, to a boundary between the upper layer i.e., the first light guide layer $71b_2$, and the high refractive index layer 79 is set to 0.35 µm. When $n_{G-1}$ represents a refractive index of the compound semiconductor material of the first light guide layers $71b_1$, $71b_2$, $n_{HR}$ represents a refractive index of the compound semiconductor material of the high refractive index layer 79, and $n_{AC}$ represents an average refractive index of the compound semiconductor material of the active layer 73, $0.01 \leq n_{HR} - n_{G-1} \leq 0.1$ is satisfied.

$n_{HR} \leq n_{AC}$ is satisfied. Specifically, $n_{HR} = 2.547$, $n_{G-1} = 2.520$, and $n_{AC} = 2.620$.

Embodiment 14

Embodiment 14 is alternative of Embodiments 10 to 13. In Embodiment 14, a value of the light confinement coefficient in the semiconductor optical amplifier of the semiconductor laser device assembly is decreased. The semiconductor optical amplifier in Embodiment 14 has the second configuration.

Figure 22:
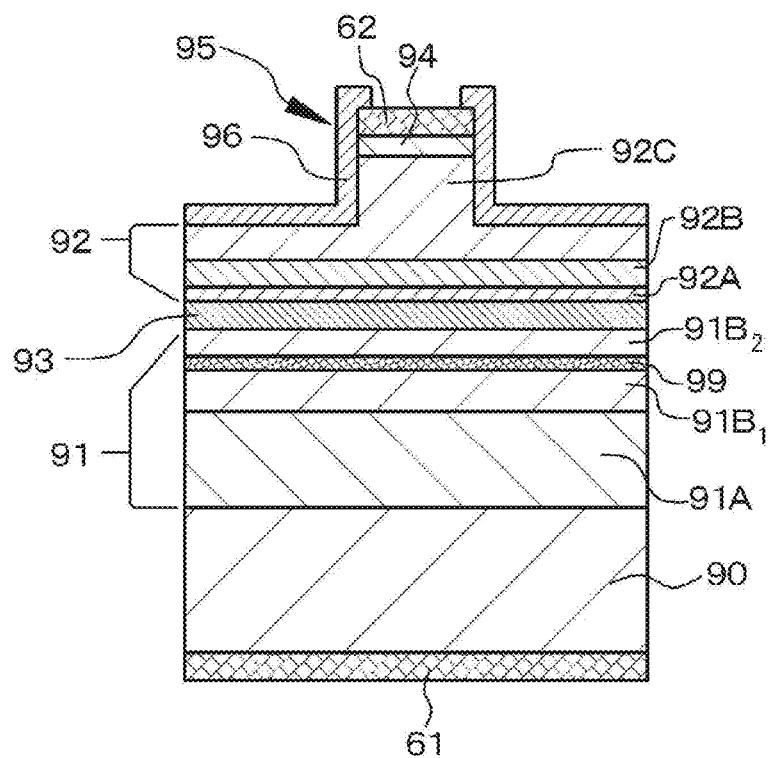
FIG. 22 is a schematic partial cross-sectional diagram of a semiconductor optical amplifier in Embodiment 14 when the semiconductor optical amplifier is cut on a virtual plane perpendicular to an axis line of the semiconductor optical amplifier.

As shown in a schematic partial cross-sectional diagram of FIG. 22, in a semiconductor optical amplifier in Embodiment 14, a laminated structure has a ridge stripe structure 95 composed of a part of at least the second compound semiconductor layer in a thickness direction, a first compound semiconductor layer 91 has a thickness of exceeding 0.6 µm, a high refractive index layer 99 made of a compound semiconductor material having a refractive index higher than that of the compound semiconductor material of the first compound semiconductor layer 91. Specifically, the first compound semiconductor layer 91 has a laminated structure of a first clad layer 91A and a first light guide layer 91B, the first light guide layer 91B has a thickness of exceeding 0.6 µm, and the high refractive index layer 99 is formed in the first light guide layer 91B. Here, the first light guide layer 91B has a structure where a first part of the first light guide layer (a first-A light guide layer $91B_1$), the high refractive index layer 99, and a second part of the first light guide layer (a first-B light guide layer $91B_2$) from the base side.

A total thickness of the first light guide layer 91B including the high refractive index layer 99 is set to 1.25 µm. A distance from a boundary between the active layer 93 and the first light guide layer 91B (a boundary between the active layer 93 and the first-B light guide layer $91B_2$) to a boundary between the part of the first light guide layer positioned at an active layer side (the first-B light guide layer $91B_2$) and the high refractive index layer 99 is 0.25 µm or more. In Embodiment 14, specifically, it is 0.35 µm. In other words, the first-B light guide layer $91B_2$ has a thickness of 0.35 µm. The high refractive index layer 99 is composed of $In_{0.02}Ga_{0.98}N$ having a thickness of 50 nm. When $n_{G-1}$ represents a refractive index of the compound semiconductor material of the first light guide layers $91B_1$ and $91B_2$, $n_{HR}$ represents a refractive index of a compound semiconductor material of the high refractive index layer 99 and $n_{AC}$ represents an average refractive index of the compound semiconductor material of the active layer 93, $0 < n_{HR} - n_{G-1} \leq 0.3$, and desirably $0.02 \leq n_{HR} - n_{G-1} \leq 0.2$ are satisfied. Specifically, $n_{HR} = 2.547$, $n_{G-1} = 2.520$, and $n_{AC} = 2.620$.

The length and the width of the ridge stripe structure 75 are 1.0 mm and 1.6 µm, respectively.

Specifically, the base 90 is composed of an n type GaN substrate, and the compound semiconductor layer is disposed on the (0001) face of the n type GaN substrate. The laminated structure composed of the first compound semiconductor layer 91, the active layer 93 and the second compound semiconductor layer 92 are composed of the GaN based compound semiconductor, specifically composed of an AlGaInN based compound semiconductor, and more specifically the layer structure shown in Table 4 below. In Table 4, the compound semiconductor layers described lower are nearer to the base 90. A band gap of the compound semiconductor of the well layer in the active layer 93 is 3.06 eV. The active layer 93 has a quantum well structure including a well layer and a barrier layer. The barrier layer has an impurity (specifically, silicon Si) doping concentration of $2 \times 10^{17}$ cm$^{-3}$ or more to $1 \times 10^{20}$ cm$^{-3}$ or less. On both sides of the ridge stripe structure 95, a laminated insulation film 96 composed of $SiO_2/Si$ is formed. An $SiO_2$ layer is a lower layer, and an Si layer is an upper layer. On a p type GaN contact layer 94 corresponding to a top face of the ridge stripe structure 95, the second electrode (a p side ohmic electrode) 62 is formed. On the other hand, on a rear face of the base 90, the first electrode (an n side ohmic electrode) 61 composed of Ti/Pt/Au is formed. In Embodiment 14, the second electrode 62 is composed of a Pd monolayer having a thickness of 0.1 µm. A p type AlGaN electron barrier layer 92A has a thickness of 10 nm. A second light guide layer (p type AlGaN layer) 92B has a thickness of 50 nm. A second clad layer (a p type AlGaN layer 92C has a thickness of 0.5 µm. A p type GaN contact layer 94 has a thickness of 100 nm. Furthermore, into the p type AlGaN electron barrier layer 92A, the second light guide layer 92B, the second clad layer 92C and the p type GaN contact layer 94 configuring the second compound semiconductor layer 92, $1 \times 10^{19}$ cm$^{-3}$ or more (specifically, $2 \times 10^{19}$ cm$^{-3}$) of Mg is doped. On the other hand, the first clad layer (the n type AlGaN layer) 91A has a thickness of 2.5 µm. The thickness of the first light guide layer (the n type GaN layer) 91B is as described above. The thickness (1.25 µm) of the first light guide layer 91B is greater than that (100 nm) of the second light guide layer 92B. The first light guide layer 91B is composed of GaN. Alternatively, the first light guide layer 91B may be composed of a compound semiconductor having a band gap wider than the active layer 93 and narrower than the first clad layer 91A.

TABLE 4

Second compound semiconductor layer 92
    p type GaN contact layer (Mg doped) 94
    second clad layer (p type Al$_{0.05}$Ga$_{0.95}$N layer (Mg doped)) 92C
    second light guide layer (p type Al$_{0.01}$Ga$_{0.99}$N layer (Mg doped)) 92B
    p type Al$_{0.20}$Ga$_{0.80}$N electron barrier layer (Mg doped) 92A
Active layer 93
    GaInN quantum well active layer 93
    (well layer:Ga$_{0.92}$In$_{0.08}$N/barrier layer:Ga$_{0.98}$In$_{0.02}$N)
First compound semiconductor layer 91
    first-B light guide layer (n type GaN layer) 91B$_2$
    high refractive index layer (n type In$_{0.02}$Ga$_{0.98}$N high refractive index layer) 99
    first-A light guide layer (n type GaN layer) 91B$_1$
    first clad layer (n type Al$_{0.03}$Ga$_{0.97}$N layer) 91A
where
    well layer (two layers): 10 nm [non-doped]
    barrier layer (three layers): 12 nm [doping concentration (Si): $2 \times 10^{18}$ cm$^{-3}$]

In Embodiment 14, the high refractive index layer is formed within the first light guide layer. In some cases, the high refractive index layer may be formed within the first clad layer. In this case, the refractive index of the compound semiconductor material of the high refractive index layer is higher than that of the first clad layer.

While the present application is described herein with reference to illustrative embodiments for particular applications, it should be understood that the present application is not limited thereto. The structures and the configurations of the semiconductor laser device assembly, the mode synchronous semiconductor laser device, the dispersion compensation optical system, the spatial phase modulator and the semiconductor optical amplifier described in Embodiments are illustrative and can be changed as appropriate. Although a variety of values are shown in Embodiments, it will be appreciated that these are also illustrative and may be changed if the specifications of the mode synchronous semiconductor laser device and the like. As the spatial phase modulator, a concave mirror providing the similar focal length or a transmissive diffraction grating providing the similar spatial dispersion, instead of the light collector (the lens). A plurality of spatial phase modulators can be used. For example, the axis line of the semiconductor laser device or the semiconductor optical amplifier and the axis line of the ridge stripe type structure may be intersected at a predetermined angle. The ridge stripe structure may have a planar shape tapered.

Figure 23:
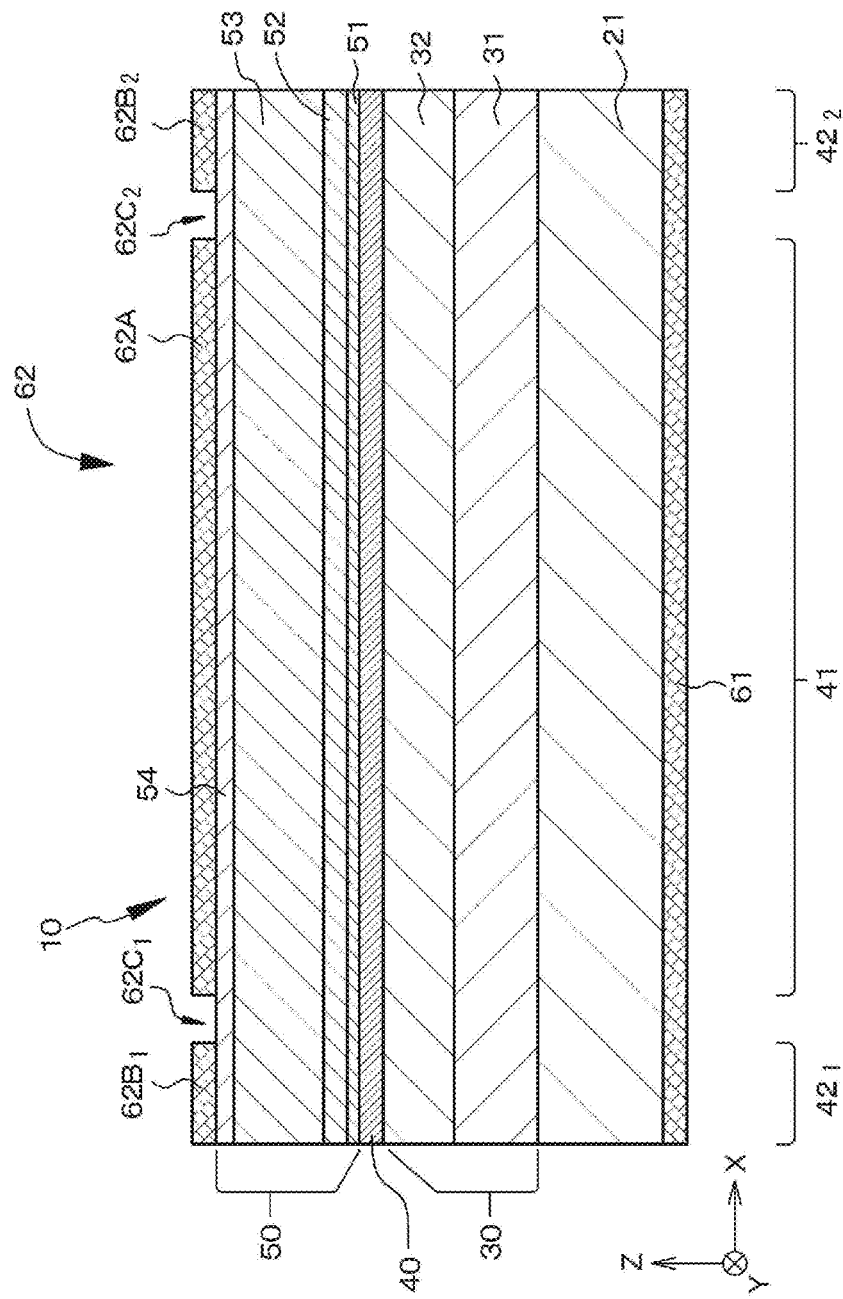
FIG. 23 is a schematic end diagram along an extending direction of an alternative resonator of a mode synchronous semiconductor laser device in Embodiment 1.
Figure 24:
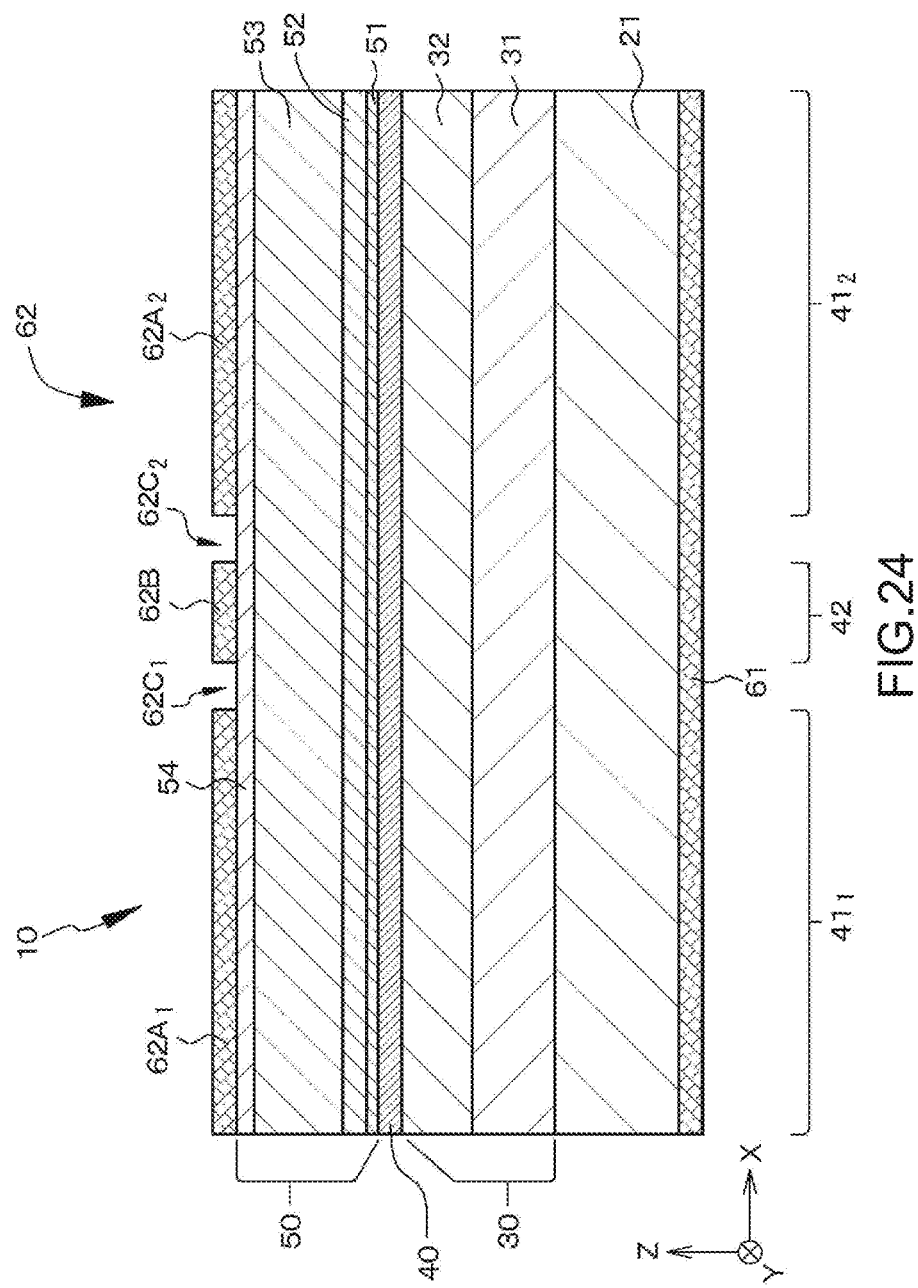
FIG. 24 is a schematic conceptual diagram along an extending direction of another alternative resonator of the semiconductor laser device in Embodiment 1.

The number of the light emitting area 41 and the saturable absorption area 42 is not limited to one. FIGS. 23 and 24 show schematic end diagrams of a multi section type (multi electrode type) mode synchronous semiconductor laser device including one first part 62A of the second electrode and two second parts 62B$_1$ and 62B$_2$ of the second electrode. In the mode synchronous semiconductor laser device shown in FIG. 23, one end of the first part 62A faces to one second part 62B$_1$ across one separation groove 62C$_1$, and the other end of the first part 62A faces to the other second part 62B$_2$ across the other separation groove 62C$_2$. One light emitting area 41 is sandwiched between two saturable absorption areas 42$_1$ and 42$_2$. FIG. 24 shows the schematic end diagram of the mode synchronous semiconductor laser device having two first parts 62A$_1$ and 62A$_2$ of the second electrode and one second part 62B of the second electrode. In the mode synchronous semiconductor laser device, an end of the second part 62B faces to one first part 62A$_1$ across one separation groove 62C$_1$, and the other end of the second part 62B faces to the other first part 62A$_2$ across the other separation groove 62C$_2$. One saturable absorption area 42 is sandwiched between two light emitting areas 41$_1$ and 41$_2$.

Figure 25:
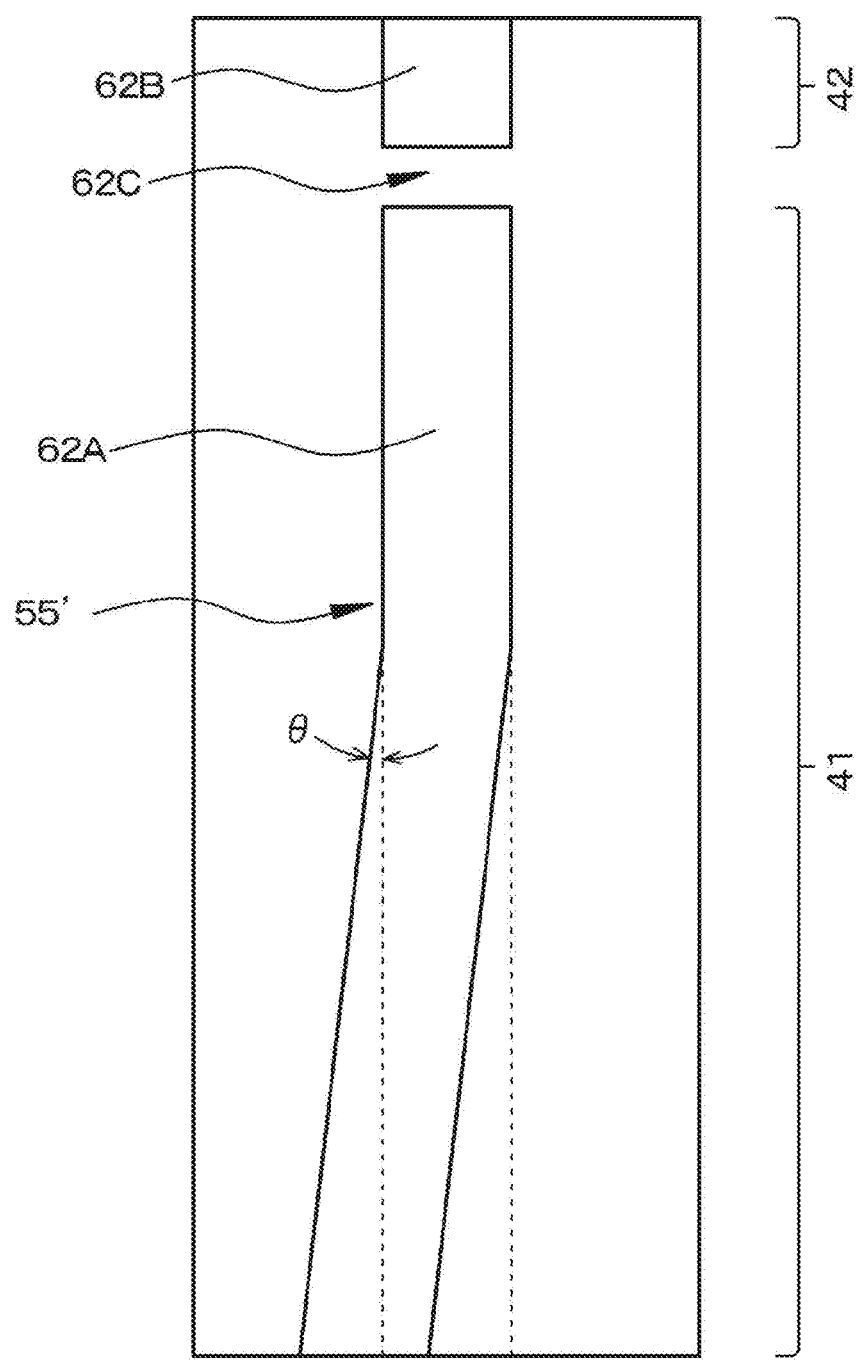
FIG. 25 is a schematic diagram of a ridge stripe structure viewed from above in other alternative semiconductor laser device in Embodiment 1.

The mode synchronous semiconductor laser device may have a slant ridge stripe type Separate Confinement Heterostructure having a slant waveguide. FIG. 25 shows a schematic diagram of a ridge stripe structure 55' viewed from above in the mode synchronous semiconductor laser device. In the mode synchronous semiconductor laser device, two straight ridge stripe structures are combined, and an angle θ where the two ridge stripe structures intersect is, for example, 0 θ≤10 (degrees), desirably 0 θ≤6 (degrees). By using the slant ridge stripe type, a refractive index of a non-reflecting coated second end face can approach to an ideal value, 0%. As a result, the laser light revolved within the mode synchronous semiconductor laser device is prevented from generating. Advantageously, the laser light generated collaterally to a main laser light can be controlled.

In Embodiments, the mode synchronous semiconductor laser device and the semiconductor optical amplifier are disposed on a polar face, a C face, i.e., a {0001} face of the n type GaN substrate. Alternatively, the mode synchronous semiconductor laser device and the semiconductor optical amplifier may be disposed on a non-polar face such as a {11-20} face, i.e., an A face, a {1-100} face, i.e., an M face; or a semi-polar face such as a {11-24} face, a {11-2n} face including a {11-22} face, a {10-11} face and a {10-12} face. With this, even if the piezo polarization and the spontaneous polarization are generated in the third compound semiconductor layer (the active layer) of the mode synchronous semiconductor laser device and the semiconductor optical amplifier, the piezo polarization will not be generated in a thickness direction of the third compound semiconductor layer, and the piezo polarization will be generated in a direction substantially perpendicular to the thickness direction of the third compound semiconductor layer. Thus, adverse effects of the piezo polarization and the spontaneous polarization can be avoided. The {11-2n} face means the nonpolar face at 40 degrees substantially to the C face. When the mode synchronous semiconductor laser device 10 is disposed on the non-polar face or the semi-polar face, it is possible to remove the limitation in the thickness of the well layer (1 nm or more to 10 nm or less) and the limitation in the impurity doping concentration of the barrier layer ($2 \times 10^{18}$ cm$^{-3}$ or more to $1 \times 10^{20}$ cm$^{-3}$ or less).

The present disclosure may have the following configurations.

[A01] <<Semiconductor laser device assembly>>

A semiconductor laser device assembly, including:
a semiconductor laser device, and
a dispersion compensation optical system, where a laser light exited from the semiconductor laser device is incident and exits that controls a group velocity dispersion value of the laser light exited from the semiconductor laser device per wavelength.

[A02] The semiconductor laser device assembly according to [A01], in which
the dispersion compensation optical system provides, in a laser light exited from the semiconductor laser device, a laser light having a shortest wavelength with a negative group velocity dispersion value and provides a laser light having a wavelength longer than the shortest wavelength with a group velocity dispersion value greater than the group velocity dispersion value for the laser light having the shortest wavelength.

[A03] The semiconductor laser device assembly according to [A02], in which
the dispersion compensation optical system provides the laser light having a longer wavelength with a constant group velocity dispersion value greater than the group velocity dispersion value for the laser light having the shortest wavelength not depending on the wavelength.

[A04] The semiconductor laser device assembly according to [A03], in which
the constant group velocity dispersion value is 0 [(picosecond)$^2$].

[A05] The semiconductor laser device assembly according to [A03], in which
the constant group velocity dispersion value is positive.

[A06] The semiconductor laser device assembly according to [A02], in which
the dispersion compensation optical system provides the laser light having a longer wavelength with a group velocity dispersion value greater than the group velocity dispersion value for the laser light having the shortest wavelength depending on the wavelength.

[A07] The semiconductor laser device assembly according to [A06], in which
the longer the wavelength is, the greater the group velocity dispersion value for the laser light having the longer wavelength.

[A08] The semiconductor laser device assembly according to [A01], in which
the dispersion compensation optical system provides, in the laser light exited from the semiconductor laser device, the laser light having the shortest wavelength with a negative group velocity dispersion value, and
the greater an absolute value of the negative group velocity dispersion value provided is, the shorter the laser light having a wavelength shorter than the predetermined wavelength is.

[A09] The semiconductor laser device assembly according to [A08], in which
the dispersion compensation optical system provides the laser light having the wavelength longer than the predetermined wavelength with a group velocity dispersion value greater than the group velocity dispersion value for the laser light having the predetermined wavelength.

[A10] The semiconductor laser device assembly according to [A09], in which
the dispersion compensation optical system provides the laser light having a wavelength longer than the predetermined wavelength with a constant group velocity dispersion value greater than the group velocity dispersion value for the laser light having the predetermined wavelength not depending on the wavelength.

[A11] The semiconductor laser device assembly according to [A10], in which
the constant group velocity dispersion value is 0 [(picosecond)$^2$].

[A12] The semiconductor laser device assembly according to [A10], in which
the constant group velocity dispersion value is positive.

[A13] The semiconductor laser device assembly according to [A08], in which
the dispersion compensation optical system provides the laser light having a wavelength longer than the predetermined wavelength with a group velocity dispersion value greater than the group velocity dispersion value for the laser light having the predetermined wavelength depending on the wavelength.

[A14] The semiconductor laser device assembly according to [A13], in which
the longer the wavelength is, the greater the group velocity dispersion value for the laser light having a longer wavelength.

[A15] The semiconductor laser device assembly according to any one of [A01] to [A14], in which
the laser light emitted from the semiconductor laser device is incident on the dispersion compensation optical system, a part of the laser light incident on the dispersion compensation optical system is emitted from the dispersion compensation optical system and returns to the semiconductor laser device, and the rest of the laser light incident on the dispersion compensation optical system is outputted to outside of the system.

[A16] The semiconductor laser device assembly according to [A15], further including:
a pulse compressor that provides a laser light outputted to outside of the system with the positive group velocity dispersion value.

[A17] The semiconductor laser device assembly according to [A15] or [A16], in which
the dispersion compensation optical system includes a diffraction grating, a light collector, and a spatial phase modulator,
the laser light emitted from the semiconductor laser device collided with the diffraction grating,
a $0^{th}$ order light from the diffraction grating being outputted to outside of the system, and
a diffraction light from the diffraction grating being incident on the spatial phase modulator via the light collector, then emitted from the spatial phase modulator and returned to the semiconductor laser device via the light collector and the diffraction grating.

[A18] The semiconductor laser device assembly according to [A17], in which
the spatial phase modulator is composed of a reflective liquid crystal display apparatus.

[A19] The semiconductor laser device assembly according to [A17], in which
the spatial phase modulator is composed of a deformable mirror.

[A20] The semiconductor laser device assembly according to [A17], in which
the spatial phase modulator is composed of a plurality of reflecting mirrors.

[A21] The semiconductor laser device assembly according to any one of [A01] to [A20], in which the semiconductor laser device includes a mode synchronous semiconductor laser device having a saturable absorption area.

[A22] The semiconductor laser device assembly according to [A21], in which
the mode synchronous semiconductor laser device is composed of a laminated structure where
a first compound semiconductor layer having a first conductive type including a GaN based compound semiconductor,
a third compound semiconductor layer (an active layer) including a GaN based compound semiconductor, and
a second compound semiconductor layer having a second conductive type being different from the first conductive type including a GaN based compound semiconductor are laminated in this order.

[B01] The semiconductor laser device assembly according to any one of [A01] to [A22], further including:
a semiconductor optical amplifier for amplifying the laser light exited to the outside of the system.

[B02] The semiconductor laser device assembly according to [B01], in which
the semiconductor optical amplifier is composed of a laminated structure of a III-V group nitride based semiconductor layer or a laminated structure of a wide gap semiconductor layer.

[B03] The semiconductor laser device assembly according to [B01] or [B02], in which
when τ1 represents the pulse time width of the laser light incident on the semiconductor amplifier, and τ2 represents the pulse time width of the laser light outputted from the semiconductor optical amplifier, τ1>τ2, and the higher a driving current value of the semiconductor optical amplifier is, the lower the value of τ2 is.

[B04] The semiconductor laser device assembly according to any one of [B01] to [B03], in which
the laser light outputted from the semiconductor optical amplifier has a light spectrum width of 4.5 THz or more.

[B05] The semiconductor laser device assembly according to any one of [B01] to [B04], in which
the semiconductor optical amplifier has a driving current density of $5 \times 10^3$ amperes/cm² or more.

[B06] The semiconductor laser device assembly according to any one of [B01] to [B05], in which
the semiconductor optical amplifier has a light confinement coefficient of 3% or less.

[B07] The semiconductor laser device assembly according to any one of [B01] to [B06], in which
the light spectrum width of the laser light outputted from the semiconductor optical amplifier is increased 2.5 THz or more against the light spectrum width of the laser light incident on the semiconductor optical amplifier.

[B08] The semiconductor laser device assembly according to any one of [B01] to [B07], in which
the mode synchronous semiconductor laser device has a peak power optical density of $1 \times 10^{10}$ watt/cm² or more, and a carrier density of $1 \times 10^{19}$/cm³ or more.

[B09] The semiconductor laser device assembly according to any one of [B01] to [B08], in which
a noise component for a main oscillation frequency of the laser light incident on the semiconductor optical amplifier is −60 dB or less.

[B10] The semiconductor laser device assembly according to any one of [B01] to [B09], in which the mode synchronous semiconductor laser device has a repetition frequency of 1 GHz or less.

[B11] The semiconductor laser device assembly according to any one of [B01] to [B10], further including:
a light spectrum shaper for shaping the light spectrum of the laser light exited from the dispersion compensation optical system to the outside of the system, in which the shaped laser light is incident on the dispersion compensation optical system.

[B12] The semiconductor laser device assembly according to [B11], in which
the light spectrum shaper is composed of a bandpass filter formed of a dielectric multilayer film, and
the laser light exited from the dispersion compensation optical system to the outside of the system passes the bandpass filter a plurality of times.

[B13] The semiconductor laser device assembly according to [B12], in which
the bandpass filter is composed of a dielectric multilayer oscillator where a single half-wave oscillator is built in.

[B14] The semiconductor laser device assembly according to [B12], in which the bandpass filter is composed of a plurality of oscillators.

[B15] The semiconductor laser device assembly according to [B12], in which the bandpass filter is composed of an integral multiple half-wave oscillator.

[C01]<<Semiconductor optical amplifier having first configuration>>
The semiconductor laser device assembly according to any one of [B01] to [B15],
in the semiconductor optical amplifier,
a first compound semiconductor layer has a laminated structure including a first clad layer and a first light guide layer from a base side,
the laminated structure has a ridge stripe structure including a second compound semiconductor layer, a third compound semiconductor layer and a part of the first light guide layer in a thickness direction, it satisfies $6 \times 10^{-7}$ m$<t_1$, $0$ (m)$<t_1' \leq 0.51 \cdot t_1$, where $t_1$ represents a thickness of the first light guide layer and $t_1'$ represents a thickness of a part of the first light guide layer configuring the ridge stripe structure.

[C02] The semiconductor laser device assembly according to [C01], in which $t_1 \leq 3 \times 10^{-6}$ m is satisfied.

[C03] The semiconductor laser device assembly according to [C01] or [C02], in which
the semiconductor optical amplifier outputs a single mode light beam.

[C04] The semiconductor laser device assembly according to any one of [C01] to [C03], in which $0.2 \leq LB_Y/LB_X \leq 1.2$ is satisfied, where $LB_X$ represents a size of the light beam outputted from the light exit end face of the laminated structure in a width direction of the ridge stripe structure, and $LB_y$ represents the size in a thickness direction of the ridge stripe structure.

[C05] The semiconductor laser device assembly according to any one of [C01] to [C04], in which
a distance $Y_{CC}$ from a center point of the active layer in the laminated structure to a center point of the light beam outputted from the laminated structure along the thickness direction of the ridge stripe structure on the light exit end dace of the laminated structure satisfies $t_1' \le Y_{CC} \le t_1$.

[C06] The semiconductor laser device assembly according to any one of [C01] to [C05], in which
the first light guide layer has a high refractive index layer made of a compound semiconductor material having a refractive index higher than that of the compound semiconductor material of the first light guide layer.

[C07] The semiconductor laser device assembly according to [C06], in which $0.01 \le n_{HR} - n_{G-1} \le 0.1$ is satisfied, where $n_{G-1}$ represents a refractive index of the compound semiconductor material of the first light guide layer, and $n_{HR}$ represents a refractive index of a compound semiconductor material of the high refractive index layer.

[C08] The semiconductor laser device assembly according to any one of [C01] to [C07], in which
the second compound semiconductor layer has a laminated structure of a second light guide layer and a second clad layer from a base side, and
the first light guide layer is thicker than the second light guide layer.

[D01]<<Semiconductor optical amplifier having second configuration>>
The semiconductor laser device assembly according to any one of [B01] to [B15],
in the semiconductor optical amplifier,
the laminated structure has a ridge stripe structure composed at least a part of the second compound semiconductor layer in a thickness direction,
the first compound semiconductor layer has a thickness of exceeding 0.6 μm, and
the first compound semiconductor layer has a high refractive index layer made of a compound semiconductor material having a refractive index higher than that of the compound semiconductor material of the first light guide layer.

[D02] The semiconductor laser device assembly according to [D01], in which
the first compound semiconductor layer has a laminated structure of a first clad layer and a first light guide layer from a base side,
the first compound semiconductor layer has a thickness of exceeding 0.6 μm, and
the high refractive index layer is formed within the first light guide layer.

[D03] The semiconductor laser device assembly according to [D02], in which
a distance from a boundary between the active layer and the first light guide layer to a boundary between the part of the first light guide layer positioned at an active layer side and the high refractive index layer is 0.25 μm or more.

[D04] The semiconductor laser device assembly according to [D02] or [D03], in which
$0 < n_{HR} - n_{G-1} \le 0.3$ is satisfied,
where $n_{G-1}$ represents a refractive index of the compound semiconductor material of the first light guide layer, and $n_{HR}$ represents a refractive index of a compound semiconductor material of the high refractive index layer.

[D05] The semiconductor laser device assembly according to any one of [D01] to [D04], in which
the semiconductor optical amplifier outputs a single mode light beam.

[D06] The semiconductor laser device assembly according to any one of [D01] to [D05], in which
the first light guide layer is thicker than the second light guide layer.

[E01]<<Semiconductor laser device assembly>>
A semiconductor laser device assembly, including
a semiconductor laser device; and
a dispersion compensation optical system, where a laser light exited from the semiconductor laser device is incident and exits to control a group velocity dispersion value of the laser light exited from the semiconductor laser device per wavelength.

[E02] The semiconductor laser device assembly according to [E01], wherein
the dispersion compensation optical system provides, in the laser light exited from the semiconductor laser device, a first laser light having a shortest wavelength with a negative group velocity dispersion value and provides a second laser light having a wavelength longer than the shortest wavelength and with a first group velocity dispersion value greater than the negative group velocity dispersion value for the first laser light having the shortest wavelength.

[E03] The semiconductor laser device assembly according to [E02], wherein
the dispersion compensation optical system provides the second laser light having the longer wavelength with a constant group velocity dispersion value greater than the negative group velocity dispersion value for the first laser light having the shortest wavelength not depending on the wavelength.

[E04] The semiconductor laser device assembly according to [E[E03], wherein
the constant group velocity dispersion value is 0 (picosecond).

[E05] The semiconductor laser device assembly according to [E03], wherein
the constant group velocity dispersion value is a positive value.

[E06] The semiconductor laser device assembly according to [E02], wherein
the dispersion compensation optical system provides the second laser light having the longer wavelength with the first group velocity dispersion value greater than the negative group velocity dispersion value for the first laser light having the shortest wavelength depending on the wavelength.

[E07] The semiconductor laser device assembly according to [E06], wherein
the first group velocity dispersion value increases in value based on an increase in the longer wavelength of the second laser light.

[E08] The semiconductor laser device assembly according to [E01] thru [E07], wherein
the dispersion compensation optical system provides, in the laser light exited from the semiconductor laser device, a first laser light having a shortest wavelength with a negative group velocity dispersion value, and
the shortest wavelength of the first laser light decreases in value shorter than a predetermined wavelength due to an increase in an absolute value of the negative group velocity dispersion value.

[E09] The semiconductor laser device assembly according to [E08], wherein
the dispersion compensation optical system provides a second laser light having a wavelength longer than the predetermined wavelength and with a first group velocity dispersion value greater than the group velocity dispersion value for a laser light having the predetermined wavelength.

[E10] The semiconductor laser device assembly according to [E01] thru [E09], wherein
the laser light emitted from the semiconductor laser device is incident on the dispersion compensation optical system, a part of the laser light incident on the dispersion compensation optical system is emitted from the dispersion compensation optical system and returns to the semiconductor laser device, and a remaining part of the laser light incident on the dispersion compensation optical system is outputted to outside of the system.

[E11] The semiconductor laser device assembly according to [E10], further comprising:
a pulse compressor that provides a laser light outputted to outside of the system with a positive group velocity dispersion value.

[E12] The semiconductor laser device assembly according to [E11], wherein
the semiconductor laser device includes a mode synchronous semiconductor laser device having a saturable absorption area.

[E13] The semiconductor laser device assembly according to [E12], wherein
the mode synchronous semiconductor laser device includes a laminated structure where
a first compound semiconductor layer having a first conductive type including a GaN based compound semiconductor,
a third compound semiconductor layer including a GaN based compound semiconductor, and
a second compound semiconductor layer having a second conductive type being different from the first conductive type including a GaN based compound semiconductor are laminated in order.

[F01]<<Semiconductor laser device assembly>>
A semiconductor laser device assembly, including
a semiconductor laser device; and
a dispersion compensation optical system, where a laser light exited from the semiconductor laser device is incident and exits to control a group velocity dispersion value of the laser light exited from the semiconductor laser device per wavelength, wherein
the dispersion compensation optical system includes a diffraction grating, a light collector, and a spatial phase modulator,
the laser light emitted from the semiconductor laser device and then to the diffraction grating,
a $0^{th}$ order light from the diffraction grating being outputted to outside of the system, and
a diffraction light from the diffraction grating being incident on the spatial phase modulator via the light collector, then emitted from the spatial phase modulator and returned to the semiconductor laser device via the light collector and the diffraction grating.

[F02] The semiconductor laser device assembly according to [F01], wherein
the spatial phase modulator includes a reflective liquid crystal display apparatus.

[F03] The semiconductor laser device assembly according to [F02], wherein
the spatial phase modulator includes a deformable mirror.

[F04] The semiconductor laser device assembly according to [F03], wherein
the spatial phase modulator includes a plurality of reflecting mirrors.

[F05] The semiconductor laser device assembly according to [F04], wherein
the semiconductor laser device includes a mode synchronous semiconductor laser device having a saturable absorption area.

[F06] The semiconductor laser device assembly according to [F05], wherein
the mode synchronous semiconductor laser device includes a laminated structure where
a first compound semiconductor layer having a first conductive type including a GaN based compound semiconductor,
a third compound semiconductor layer including a GaN based compound semiconductor, and
a second compound semiconductor layer having a second conductive type being different from the first conductive type including a GaN based compound semiconductor are laminated in order.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor laser device assembly, comprising:
a semiconductor laser device; and
a dispersion compensation optical system positioned to receive a laser light output from the semiconductor laser device,
wherein the dispersion compensation optical system includes a diffraction grating, a light collector, and a spatial phase modulator,
wherein the laser light emitted from the semiconductor laser device and then to the diffraction grating,
wherein a $0^{th}$ order light from the diffraction grating being outputted to outside of the system,
wherein a diffraction light from the diffraction grating being incident on the spatial phase modulator via the light collector, then emitted from the spatial phase modulator and returned to the semiconductor laser device via the light collector and the diffraction grating,
wherein the spatial phase modulator is configured to modify a group velocity dispersion value of incident laser light thereon as a function of the incident laser light wavelength,
wherein
the dispersion compensation optical system provides, in the laser light output from the semiconductor laser device:
a first laser light having a shortest wavelength with a negative group velocity dispersion value, and
a second laser light having a range of wavelengths longer than the shortest wavelength, and for said longer range of wavelengths the second laser light has a constant first group velocity dispersion value that is greater than the negative group velocity dispersion value for the first laser light.

2. The semiconductor laser device assembly according to claim 1, wherein
the spatial phase modulator includes a reflective liquid crystal display apparatus.

3. The semiconductor laser device assembly according to claim 1, wherein the spatial phase modulator includes a deformable mirror.

4. The semiconductor laser device assembly according to claim 1, wherein the spatial phase modulator includes a plurality of reflecting mirrors.

5. The semiconductor laser device assembly according to claim 1, wherein the semiconductor laser device includes a mode synchronous semiconductor laser device having a saturable absorption area.

6. The semiconductor laser device assembly according to claim 5, wherein the mode synchronous semiconductor laser device includes a laminated structure where a first compound semiconductor layer having a first conductive type including a GaN based compound semiconductor, a third compound semiconductor layer including a GaN based compound semiconductor, and a second compound semiconductor layer having a second conductive type being different from the first conductive type including a GaN based compound semiconductor are laminated in order.

* * * * *